(12) United States Patent
Kim et al.

(10) Patent No.: US 12,069,428 B2
(45) Date of Patent: Aug. 20, 2024

(54) VIBRATION APPARATUS AND APPARATUS INCLUDING THE SAME

(71) Applicant: LG Display Co., Ltd., Seoul (KR)

(72) Inventors: Minji Kim, Paju-si (KR); YoungWook Ha, Paju-si (KR); Chiwan Kim, Paju-si (KR); GyungBo Ha, Paju-si (KR); MinHo Sohn, Paju-si (KR); MinKyu Choi, Paju-si (KR); Jeonggoo Kang, Paju-si (KR); YuSeon Kho, Paju-si (KR); YeongRak Choi, Paju-si (KR); Seungo Jeon, Paju-si (KR); Kwangho Kim, Paju-si (KR); JunSeok Oh, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 151 days.

(21) Appl. No.: 17/851,822

(22) Filed: Jun. 28, 2022

(65) Prior Publication Data
US 2023/0019257 A1    Jan. 19, 2023

(30) Foreign Application Priority Data
Jun. 30, 2021   (KR) .................. 10-2021-0086155

(51) Int. Cl.
*H04R 17/00*   (2006.01)
*H04R 1/24*    (2006.01)
(Continued)

(52) U.S. Cl.
CPC .............. *H04R 17/00* (2013.01); *H04R 1/24* (2013.01); *H04R 3/00* (2013.01); *H04R 31/006* (2013.01); *H04R 1/028* (2013.01); *H04R 2499/15* (2013.01)

(58) Field of Classification Search
CPC . H04R 17/00; H04R 1/24; H04R 3/00; H04R 31/006; H04R 1/028; H04R 2499/15; H04R 7/04
See application file for complete search history.

(56) References Cited

U.S. PATENT DOCUMENTS

| 6,650,759 | B1 | 11/2003 | Takeshi et al. |
| 2011/0051985 | A1 | 3/2011 | Hwang et al. |

(Continued)

FOREIGN PATENT DOCUMENTS

| CN | 110575946 A | 12/2019 |
| CN | 111381724 A | 7/2020 |

(Continued)

OTHER PUBLICATIONS

Office Action for Japanese Application No. 2022-101491 dated Jul. 11, 2023, 5 pages.

(Continued)

*Primary Examiner* — Mark Fischer
(74) *Attorney, Agent, or Firm* — Morgan, Lewis & Bockius LLP

(57) ABSTRACT

A vibration apparatus may include a vibration plate, a vibration generator at the vibration plate, and a connection member between the vibration plate and the vibration generator. The vibration generator may include a vibration structure. The connection member may include a first connection member between the vibration plate and the vibration structure and overlapping the vibration structure. The connection member may also include a second connection member surrounding the first connection member. A modulus of the first connection member may be greater than a modulus of the second connection member.

39 Claims, 39 Drawing Sheets

(51) Int. Cl.
  *H04R 3/00* (2006.01)
  *H04R 31/00* (2006.01)
  *H04R 1/02* (2006.01)

(56) References Cited

U.S. PATENT DOCUMENTS

| | | | |
|---|---|---|---|
| 2017/0257707 A1* | 9/2017 | Shimoda | H04R 7/04 |
| 2019/0350555 A1 | 11/2019 | Wakabayashi | |
| 2020/0077169 A1 | 3/2020 | Noh et al. | |
| 2020/0192545 A1 | 6/2020 | Oh et al. | |
| 2020/0204924 A1 | 6/2020 | Kim et al. | |
| 2020/0209973 A1 | 7/2020 | Kim et al. | |
| 2020/0314553 A1 | 10/2020 | Kim et al. | |
| 2021/0160622 A1 | 5/2021 | Lee et al. | |

FOREIGN PATENT DOCUMENTS

| | | |
|---|---|---|
| JP | S5597799 A | 7/1980 |
| JP | S62-167498 U | 10/1987 |
| JP | H07-099348 A | 4/1995 |
| JP | 3555509 B2 | 8/2004 |
| JP | 2016-100861 A | 5/2016 |
| JP | 2020-167360 A | 10/2020 |
| TW | 202019192 A | 5/2020 |

OTHER PUBLICATIONS

Extended European Search Report of Application No. 22180900.7 dated Mar. 17, 2023, 15 pages.
European Search Report of Application No. 22180900.7 dated Nov. 18, 2022, 12 pages.
Office Action dated Jan. 10, 2024 for Taiwanese Patent Application No. 111123735.
Office Action issued in corresponding Japanese Patent Application No. 2022-101491, dated Jun. 26, 2024.

* cited by examiner

VIBRATION APPARATUS AND APPARATUS INCLUDING THE SAME

CROSS-REFERENCE TO RELATED APPLICATION

This application claims the benefit of and priority to Korean Patent Application No. 10-2021-0086155 filed on Jun. 30, 2021, the entirety of which is hereby incorporated by reference for all purposes as if fully set forth herein.

BACKGROUND

Technical Field

The present disclosure relates to an apparatus and particularly to, for example, without limitation, a vibration apparatus and an apparatus including the same.

Discussion of the Related Art

Vibration apparatuses may vibrate, based on a type such as a coil type including a magnet and a coil or a piezoelectric type using a piezoelectric device, to output a sound.

Piezoelectric-type vibration apparatuses may be easily damaged by an external impact due to a fragile characteristic of a piezoelectric device, causing a problem where the reliability of sound reproduction is low. In addition, because a piezoelectric constant of a piezoelectric device is low, the piezoelectric-type vibration apparatuses have a drawback in that a sound pressure level of a piezoelectric-type vibration apparatus is lower than that of a coil-type vibration apparatus in a low-pitched sound band. The piezoelectric-type vibration apparatuses have an additional drawback in that a sound pressure level flatness, which is defined as a difference between the highest sound pressure level and the lowest sound pressure level, is high in a reproduction frequency band.

The description provided in the background section should not be assumed to be prior art merely because it is mentioned in or associated with the background section. The background section may include information that describes one or more aspects of the subject technology.

SUMMARY

The inventors have recognized the problems described above, performed various experiments for implementing a vibration apparatus having flexibility, and performed various other experiments for implementing a vibration apparatus which has flexibility and an enhanced sound characteristic and/or sound pressure level characteristic. The inventors have thus invented a new vibration apparatus having flexibility and have invented a vibration apparatus which has flexibility and an enhanced sound characteristic and/or sound pressure level characteristic.

One or more aspects of the present disclosure are directed to providing a vibration apparatus having flexibility and an apparatus including the same.

One or more aspects of the present disclosure are directed to providing a vibration apparatus having flexibility and an enhanced sound characteristic and/or sound pressure level characteristic and an apparatus including the same.

Additional features and aspects of the disclosure are set forth in part in the description that follows and in part will become apparent from the description or may be learned by practice of the inventive concepts provided herein. Other features and aspects of the inventive concepts may be realized and attained by the structures pointed out in the present disclosure, or derivable therefrom, and the claims hereof as well as the appended drawings.

To achieve these and other aspects of the present disclosure, as embodied and broadly described herein, in one or more aspects, a vibration apparatus may include a vibration plate, a vibration generator at the vibration plate, and a connection member between the vibration plate and the vibration generator. The vibration generator may include a vibration structure. The connection member may include a first connection member disposed between the vibration plate and the vibration structure and overlapping the vibration structure. The connection member may further include a second connection member surrounding the first connection member. A modulus of the first connection member may be greater than a modulus of the second connection member.

In one or more aspects of the present disclosure, a vibration apparatus may include a vibration plate, a vibration generator at the vibration plate, and a connection member between the vibration plate and the vibration generator. The connection member may include a metal material.

In one or more aspects of the present disclosure, a vibration apparatus may include a vibration plate, a vibration generator configured to vibrate the vibration plate, and a connection member between the vibration plate and the vibration generator. The vibration generator may include a vibration structure, a first electrode portion at a first surface of the vibration structure, and a second electrode portion at a second surface opposite to the first surface of the vibration structure. Each of the first electrode portion and the second electrode portion may include silver and a glass frit.

In one or more aspects of the present disclosure, an apparatus may include a vibration member and one or more vibration generating apparatuses connected to the vibration member. The one or more vibration generating apparatuses may include the vibration apparatus described above.

A vibration apparatus according to one or more example embodiments of the present disclosure may vibrate a vibration plate to generate a sound and may output a sound having an enhanced sound pressure level characteristic in a forward direction of the vibration plate.

In an apparatus according to one or more example embodiments of the present disclosure, a middle-pitched sound band, a low-pitched sound band, and/or a middle-low-pitched sound band characteristic(s) of a sound generated based on a displacement of a vibration plate based on an increase in an amplitude displacement of the vibration plate may be enhanced.

In a vibration apparatus according to one or more example embodiments of the present disclosure, a middle-pitched sound band, a low-pitched sound band, and/or a middle-low-pitched sound band characteristic(s) of a sound generated based on a displacement of the vibration plate may be enhanced.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing general description and the following detailed description of the present disclosure are exemplary and explanatory, and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects and embodiments of the disclosure and together with the description serve to explain principles of the disclosure.

Figure 1:
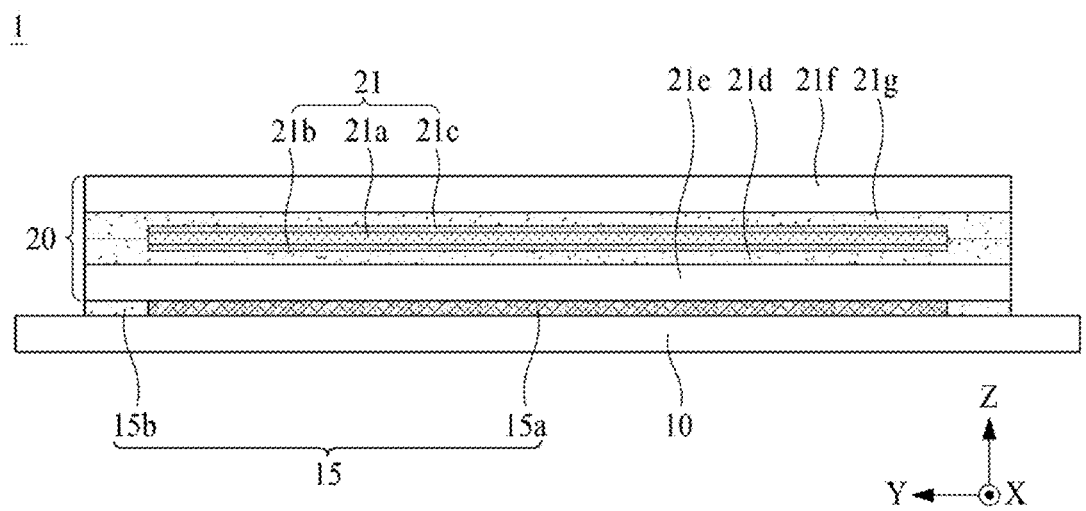
FIG. 1 illustrates a vibration apparatus according to an example embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations may unnecessarily obscure aspects of the present disclosure, the detailed description thereof may be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals refer to like elements throughout unless stated otherwise. Names of the respective elements used in the following explanations are selected only for convenience of writing the specification and may be thus different from those used in actual products.

Advantages and features of the present disclosure, and implementation methods thereof, will be clarified through following embodiments described with reference to the accompanying drawings. The present disclosure may, however, be embodied in different forms and should not be construed as limited to the embodiments set forth herein. Rather, these embodiments are provided so that this disclosure is thorough and complete, and fully conveys the scope of the present disclosure to those skilled in the art. Furthermore, the present disclosure is only defined by claims and their equivalents.

The shapes, sizes, areas, ratios, angles, numbers, and the like disclosed in the drawings for describing embodiments of the present disclosure are merely examples, and thus, the present disclosure is not limited to the illustrated details. Like reference numerals refer to like elements throughout. In the following description, when the detailed description of the relevant known function or configuration is determined to unnecessarily obscure aspects of the present disclosure, the detailed description may be omitted. When the term "comprise," "have," "include," contain," "constitute," "make up of," "formed of," or the like is used, one or more other elements may be added unless the term, such as "only" is used. The terms of a singular form may include plural forms unless the context clearly indicates otherwise. Any implementation described herein as an "example" is not necessarily to be construed as preferred or advantageous over other implementations.

In construing an element, the element is construed as including an error or tolerance range even where no explicit description of such an error or tolerance range is provided.

Where positional relationships are described, for example, where the positional relationship between two parts is described using "on," "over," "under," "above," "below," "beneath," "near," "close to," or "adjacent to," "beside," "next to," or the like, one or more other parts may be located between the two parts unless a more limiting term, such as "immediate(ly)," "direct(ly)," or "close(ly)" is used. For example, when a structure is described as being positioned "on," "over," "under," "above," "below," "beneath," "near," "close to," or "adjacent to," "beside," or "next to" another structure, this description should be construed as including a case in which the structures contact each other as well as a case in which one or more additional structures are disposed or interposed therebetween. Furthermore, the terms "front," "rear," "left," "right," "top," "bottom, "downward," "upward," "upper," "lower," and the like refer to an arbitrary frame of reference.

In describing a temporal relationship, for example, when the temporal order is described as "after," "subsequent," "next," "before," "prior to," or the like, a case that is not continuous may be included unless a more limiting term, such as "just," "immediate(ly)," or "direct(ly)" is used.

It will be understood that, although the term "first," "second," or the like may be used herein to describe various elements, these elements should not be limited by these terms. These terms are only used to distinguish one element from another. For example, a first element could be a second element, and, similarly, a second element could be a first element, without departing from the scope of the present disclosure.

In describing elements of the present disclosure, the terms "first," "second," "A," "B," "(a)," "(b)," or the like may be used. These terms are intended to identify the corresponding elements from the other elements, and the basis, order, or number of the corresponding elements should not be limited by these terms.

For the expression that an element or layer is "connected," "coupled," or "adhered" to another element or layer, the element or layer can not only be directly connected, coupled or adhered to another element or layer, but also be indirectly connected, coupled or adhered to another element or layer with one or more intervening elements or layers disposed or interposed between the elements or layers, unless otherwise specified.

For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers disposed or interposed between the elements or layers, unless otherwise specified.

The term "at least one" should be understood as including any and all combinations of one or more of the associated listed items. For example, the meaning of "at least one of a first item, a second item, and a third item" denotes the combination of items proposed from two or more of the first item, the second item, and the third item as well as only one of the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C.

Features of various embodiments of the present disclosure may be partially or wholly coupled to or combined with each other and may be variously inter-operated, linked or driven together. The embodiments of the present disclosure may be carried out independently from each other or may be carried out together in a co-dependent or related relationship.

The term "display device" used herein is used as a concept covering not only a display panel in the narrow sense, such as a liquid crystal module (LCM) or an organic light emitting diode (OLED) module that includes a display panel and a driving part for driving the display panel, but also a set electronic device or a set device, such as a notebook computer, a TV, a computer monitor, equipment display (e.g., display equipment in an automotive display or other type of vehicle display) or a mobile electronic device (e.g., a smart phone or an electronic pad, etc.) that is a complete product or a final product including the LCM, the OLED module, or the like.

That is, the term "display device" used herein is used in the sense of including not only a display device itself, such as an LCM or an OLED module in the narrow sense, but also includes a so-called "set device" which is an application product or final consumer device having a display device implemented therein.

In addition, according to some example embodiments of the present disclosure, the LCM and OLED modules comprised of a display panel and a driving part thereof may be referred to as "display apparatus," and the electronic device of the final product including the LCM and OLED modules may be differently referred to as "set apparatus" or "set device." For example, the display apparatus may include a liquid crystal display (LCD) panel or an organic light emitting diode (OLED) display panel and a source printed circuit board (PCB) as a controller for driving the same. The set device may further include a set PCB that is a controller set to be electrically connected to the source PCB and to control the overall operations of the set device or the set apparatus.

The display panel used for various embodiments of the present disclosure may be all types of display panels, for example, a liquid crystal display panel, an organic light emitting display panel, an electroluminescent display panel, etc., but is not limited to these types. For example, the display panel of the present disclosure may be any panel capable of generating sound in accordance with a vibration by a sound generating device. Furthermore, the display panel used for example embodiments of the present disclosure is not limited in its shape or size.

In one or more examples, a liquid crystal display panel may include a plurality of gate lines, a plurality of data lines, and a plurality of pixels provided in respective intersections of the gate and data lines. In addition, the liquid crystal display panel may include an array substrate including a thin film transistor corresponding to a switching device for controlling a light transmittance for each pixel, an upper substrate including a color filter and/or black matrix, and a liquid crystal layer formed between the array substrate and the upper substrate.

In one or more examples, an organic light emitting display panel may include a plurality of gate lines, a plurality of data lines, and a plurality of pixels provided in respective intersections of the gate and data lines. In addition, the organic light emitting display panel may include an array substrate including a thin film transistor corresponding to a device for selectively applying a voltage to each pixel, an organic light emitting device layer on the array substrate, and an encapsulation substrate disposed on the array substrate so as to cover the organic light emitting device layer. The encapsulation substrate protects the thin film transistor and the organic light emitting device layer from an external shock, and prevents moisture or oxygen from being permeated into the organic light emitting device layer. In addition, the organic light emitting device layer provided on the array substrate may be changed to an inorganic light emitting layer, for example, a nano-sized material layer or a quantum dot material layer.

The display panel may further include a backing such as a metal plate attached to a rear surface of the display panel. One or more other structures comprising different material may be included.

The display panel including the sound generating device according to one or more example embodiments of the present disclosure may be implemented at a user interface module in a vehicle, such as the central control panel area in an automobile. For example, such a display panel may be configured between two front seat occupants such that sounds due to vibrations of the display panel propagate towards the interior of the vehicle. As such, the audio experience within a vehicle may be improved when compared to having speakers only at the interior sides in the vehicle.

Features of various embodiments of the present disclosure may be partially or overall coupled to or combined with each other, and may be variously inter-operated, linked or driven together as those skilled in the art can readily understand. The embodiments of the present disclosure may be carried out independently from each other, or may be carried out together in co-dependent or related relationship. In one or more aspects, the components of each apparatus according to various embodiments of the present disclosure are operatively coupled and configured.

Hereinafter, an apparatus, a vibration apparatus and a vehicle including the same according to example embodiments of the present disclosure are described in detail with reference to the accompanying drawings. In adding reference numerals to elements of each of the drawings, although the same elements may be illustrated in other drawings, like reference numerals may refer to like elements. In addition, for convenience of description, a scale, size and thickness of each of the elements illustrated in the accompanying drawings may differ from an actual scale, size and thickness, and thus, embodiments of the present disclosure are not limited to a scale, size and thickness illustrated in the drawings.

Figure 2:
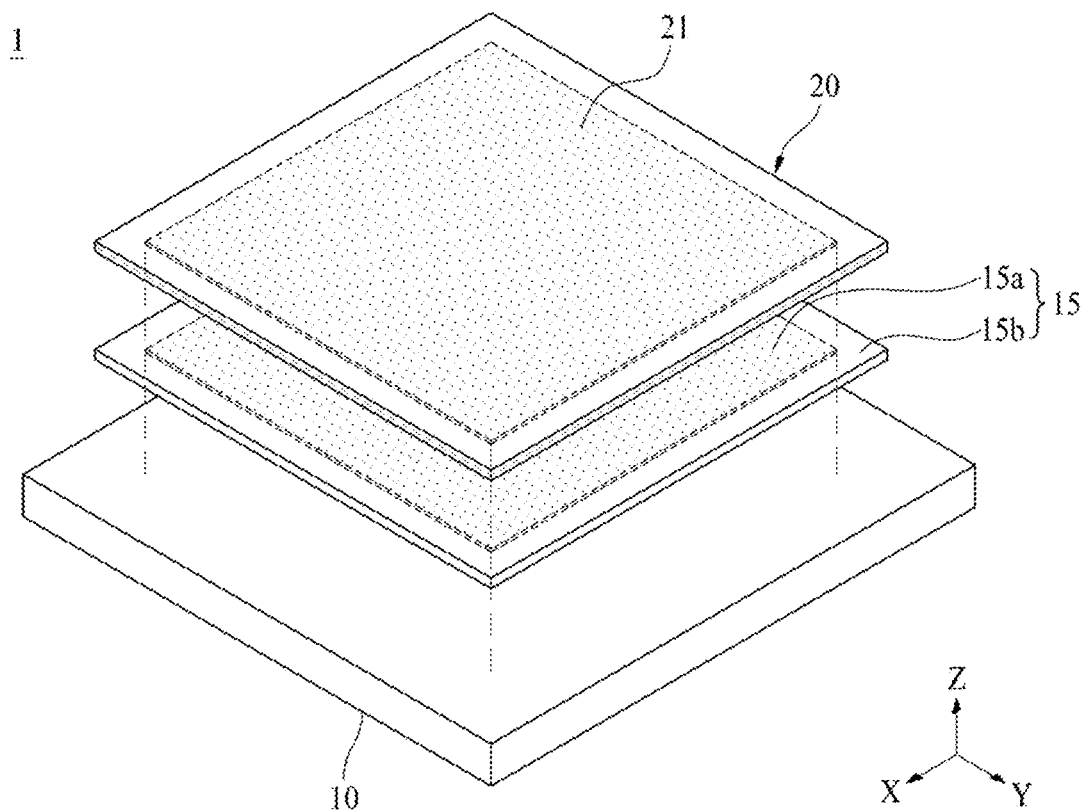
FIG. 2 is a perspective view of a vibration apparatus according to an example embodiment of the present disclosure.

FIG. 1 illustrates a vibration apparatus 1 according to an example embodiment of the present disclosure, and FIG. 2 is a perspective view of a vibration apparatus according to an example embodiment of the present disclosure.

Referring to FIGS. 1 and 2, the vibration apparatus 1 according to an example embodiment of the present disclosure may include a vibration plate 10, a vibration generator 20 (which is disposed on the vibration plate 10 and includes a vibration structure 21), and a connection member 15 between the vibration plate 10 and the vibration generator 20. The connection member 15 may include (a) a first connection member 15a which is disposed between the vibration plate 10 and the vibration structure 21 to overlap the vibration structure 21 and (b) a second connection member 15b which is disposed to surround the first connection member 15a. The first connection member 15a may have a modulus which is greater than that of the second connection member 15b.

The vibration generator 20 may contract or expand in a driving direction (or a displacement direction) based on a vibration driving signal applied thereto to generate a displacement amount (or a bending force) or an amplitude displacement. Therefore, the vibration generator 20 may increase (or maximize) a displacement amount (or a bending force) or an amplitude displacement of the vibration plate 10, thereby enhancing a sound characteristic and a sound pressure level characteristic of a sound generated based on a vibration of the vibration plate 10. For example, the vibration generator 20 may be referred to as a term such as a vibration structure, a vibrator, a vibration generating device, a vibration device, a vibration generator, a sounder, a sound device, a sound generating device, or a sound generator, but the terms are not limited thereto.

The vibration generator 20 according to an example embodiment of the present disclosure may include a piezoelectric material (or an electroactive material) having a piezoelectric characteristic. The vibration generator 20 may autonomously vibrate (or displace or drive) or may vibrate (or displace) a vibration member (or a vibration plate or a vibration object), based on a vibration (or a displacement or drive) of a piezoelectric material based on an electrical signal (or a voice signal) applied to the piezoelectric material. For example, the vibration generator 20 may alternately repeat contraction and expansion based on a piezoelectric effect (or a piezoelectric characteristic) to vibrate (or displace or drive). For example, the vibration generator 20 may alternately repeat contraction and expansion based on an inverse piezoelectric effect to vibrate (or displace) in a vertical direction (or a thickness direction) Z. The vibration generator 20 according to an example embodiment of the present disclosure may be a piezoelectric-type vibration device. For example, the vibration generator 20 according to an example embodiment of the present disclosure may be referred to as a term such as a piezoelectric-type vibration structure, a piezoelectric-type vibrator, a piezoelectric-type vibration generating device, a piezoelectric-type vibration generator, a piezoelectric-type sounder, a piezoelectric-type sound device, a piezoelectric-type sound generating device, a piezoelectric-type sound generator, a piezoelectric-type actuator, a piezoelectric-type exciter, or a piezoelectric-type transducer, but the terms are not limited thereto.

The vibration generator 20 according to an example embodiment of the present disclosure may be configured to have flexibility. For example, the vibration generator 20 may be configured to be bent in a non-planar shape including a curved surface. Therefore, the vibration generator 20 according to an example embodiment of the present disclosure may be referred to as a term such as a flexible vibration structure, a flexible vibrator, a flexible vibration generating device, a flexible vibration generator, a flexible sounder, a flexible sound device, a flexible sound generating device, a flexible sound generator, a flexible actuator, a flexible exciter, or a flexible transducer, but the terms are not limited thereto.

The vibration plate 10 may include a plate structure having a constant thickness. For example, the vibration plate 10 may be referred to as a term such as a vibration member, a vibration object, a sound output member, a vibration panel, or a sound output panel, but the embodiments of the present disclosure are not limited thereto.

The vibration plate 10 may include a non-metallic material (or a non-metallic composite material) or a metal material having a material characteristic suitable for outputting a sound based on a vibration. The metal material of the vibration plate 10 according to an example embodiment may include one or more materials of stainless steel, aluminum (Al), an aluminum (Al) alloy, magnesium (Mg), a magnesium (Mg) alloy, and a magnesium-lithium (Mg—Li) alloy, but embodiments of the present disclosure are not limited thereto. The non-metallic material (or a non-metallic composite material) of the vibration plate 10 may include one or more of a glass, a plastic, a fiber, a leather, wood, a cloth, and a paper, but embodiments of the present disclosure are not limited thereto.

The vibration structure 21 may include a piezoelectric material (or a piezoelectric device) having a piezoelectric characteristic (or a piezoelectric effect). For example, the piezoelectric material may have a characteristic in that when pressure or twisting is applied to a crystalline structure by an external force, a potential difference occurs due to dielectric polarization caused by a relative position change of a positive (+) ion and a negative (−) ion, and a vibration is generated by an electric field based on a voltage applied thereto.

The vibration structure 21 according to an example embodiment of the present disclosure may include a vibration portion 21a including a piezoelectric material, a first electrode portion 21b disposed at a first surface of the vibration portion 21a, and a second electrode portion 21c disposed at a second surface, which is opposite to or different from the first surface, of the vibration portion 21a.

The vibration portion 21a may include a piezoelectric material. The vibration portion 21a may be referred to as a term as a vibration layer, a piezoelectric layer, a piezoelectric material layer, an electroactive material, a piezoelectric vibration part, a piezoelectric material portion, an electroactive portion, an inorganic material layer, an inorganic material portion, or the like, but embodiments of the present disclosure are not limited thereto.

The vibration portion 21a may include a transparent piezoelectric material, a semitransparent piezoelectric material, or an opaque piezoelectric material, and thus the vibration portion 21a may be transparent, semitransparent, or opaque.

The vibration portion 21a may be formed of a ceramic-based material for generating a relatively high vibration or may be formed of piezoelectric ceramic having a perovskite crystalline structure. The perovskite crystalline structure may have a piezoelectric effect and an inverse piezoelectric effect and may be a plate-shaped structure having orientation. The perovskite crystalline structure may be represented by a chemical formula "$ABO_3$." Here, A may include a divalent metal element, and B may include a tetravalent metal element. For example, in the chemical formula "$ABO_3$," A and B may be cations, and O may be anions. For example, the chemical formula "$ABO_3$" may include one of $PbTiO_3$, $PbZrO_3$, $BaTiO_3$, and $SrTiO_3$, but embodiments of the present disclosure are not limited thereto.

The vibration portion 21a according to an example embodiment of the present disclosure may include one or more of lead (Pb), zirconium (Zr), titanium (Ti), zinc (Zn), nickel (Ni), and niobium (Nb), but embodiments of the present disclosure are not limited thereto.

As another example, the vibration portion 21a may include a lead zirconate titanate (PZT)-based material including lead (Pb), zirconium (Zr), and titanium (Ti) or may include a lead zirconate nickel niobate (PZNN)-based material including lead (Pb), zinc (Zn), nickel (Ni), and niobium (Nb), but embodiments of the present disclosure are not limited thereto. In addition, the vibration portion 21a may include at least one of $CaTiO_3$, $BaTiO_3$, and $SrTiO_3$ without lead (Pb), but embodiments of the present disclosure are not limited thereto.

As another example, the vibration portion 21a may have a piezoelectric deformation modulus $d_{33}$ of 1,000 pC/N or more based on a thickness direction Z thereof. The vibration portion 21a may have a high piezoelectric deformation modulus $d_{33}$ and thus may be applied to a large-size display panel, thereby providing the vibration device 1 having a sufficient vibration characteristic or a sufficient piezoelectric characteristic. For example, the vibration portion 21a may include a PZT-based material ($PbZrTiO_3$) as a main component and may include, for example, a softener dopant material doped in A site (Pb) and a relaxor ferroelectric material doped into B site (ZrTi).

The softener dopant material may enhance a piezoelectric characteristic and a dielectric characteristic of the vibration portion 21a. For example, the softener dopant material may increase the piezoelectric deformation modulus $d_{33}$ of the vibration portion 21a. If the softener dopant material includes a monovalent element, a piezoelectric characteristic and a dielectric characteristic may be reduced. For example, if the softener dopant material includes kalium (K) and rubidium (Rb), a piezoelectric characteristic and a dielectric characteristic may be reduced. Therefore, through various experiments, the inventors have discovered that the softener dopant material could include a divalent element and a triad element to enhance a piezoelectric characteristic and a dielectric characteristic. The softener dopant material according to an example embodiment of the present disclosure may include a divalent element and a triad element. A morphotropic phase boundary (MPB) may be formed by adding the softener dopant material to the PZT-based material (PbZrTiO$_3$). Thus, a piezoelectric characteristic and a dielectric characteristic may be enhanced. For example, the softener dopant material may include strontium (Sr), barium (Ba), lanthanum (La), neodymium (Nd), calcium (Ca), yttrium (Y), erbium (Er), or ytterbium (Yb). For example, an ion (Sr$^{2+}$, Ba$^{2+}$, La$^{2+}$, Nd$^{3+}$, Ca$^{2+}$, Y$^{3+}$, Er$^{2+}$, or Yb$^{3+}$) of the softener dopant material doped into the PZT-based material (PbZrTiO$_3$) may substitute a portion of lead (Pb) in the PZT-based material (PbZrTiO$_3$), and a substitution amount thereof may be about 2 mol % to about 20 mol %. For example, if the substitution amount is less than 2 mol % or more than 20 mol %, the perovskite crystalline structure may be broken. Thus, an electromechanical coupling coefficient kP and the piezoelectric deformation modulus $d_{33}$ may be reduced. If the softener dopant material is substituted, a morphotropic phase boundary MPB may be formed, and a high piezoelectric characteristic and a high dielectric characteristic may be realized in the MPB, thereby implementing a vibration device having a high piezoelectric characteristic and a high dielectric characteristic.

According to an example embodiment of the present disclosure, a relaxor ferroelectric material doped into the PZT-based material (PbZrTiO$_3$) may enhance an electric deformation characteristic of the vibration portion 21a. The relaxor ferroelectric material according to an example embodiment of the present disclosure may include a lead magnesium niobate (PMN)-based material or a lead nickel niobate (PNN)-based material, but embodiments of the present disclosure are not limited thereto. The PMN-based material may include lead (Pb), magnesium (Mg), and niobium (Nb), and may be, for example, Pb(Mg, Nb)O$_3$. For example, the relaxor ferroelectric material doped into the PZT-based material (PbZrTiO$_3$) may substitute a portion of each of zirconium (Zr) and titanium (Ti) in the PZT-based material (PbZrTiO$_3$), and a substitution amount thereof may be about 5 mol % to about 25 mol %. For example, if the substitution amount is less than 5 mol % or more than 25 mol %, the perovskite crystalline structure may be broken. Thus, the electromechanical coupling coefficient kP and the piezoelectric deformation modulus $d_{33}$ may be reduced.

According to an example embodiment of the present disclosure, the vibration portion 21a may further include a donor material doped into B site (ZrTi) of the PZT-based material (PbZrTiO$_3$), in order to further enhance a piezoelectric coefficient. For example, a donor material doped into the B site (ZrTi) may include quadrivalent to hexad elements. For example, the donor material doped into B site (ZrTi) may include tellurium (Te), germanium (Ge), uranium (U), bismuth (Bi), niobium (Nb), tantalum (Ta), antimony (Sb), or tungsten (W).

The vibration portion 21a may be represented by the following Formula 1:

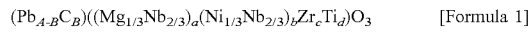

[Formula 1]

In Formula 1, C may be one of calcium (Ca), strontium (Sr), and barium (Ba). In addition, a+b+c+d=1, 0.02≤B≤0.20, 0.80≤A−B≤0.98, 0.05≤a≤0.25, 0.05≤b≤0.25, 0.10≤c≤0.50, and 0.10≤d≤0.50.

The vibration portion 21a according to an example embodiment of the present disclosure may have the piezoelectric deformation modulus $d_{33}$ of 1,000 pC/N or more based on the thickness direction Z thereof, thereby implementing a vibration device with an enhanced vibration characteristic. For example, a vibration device with an enhanced vibration characteristic may be implemented in a large-area apparatus.

The vibration portion 21a according to an example embodiment of the present disclosure may be configured to have a circular shape, an oval shape or a polygonal shape, but embodiments of the present disclosure are not limited thereto.

The first electrode portion 21b may be disposed on the first surface (or an upper surface) of the vibration portion 21a. For example, the first electrode portion 21b may be electrically connected to a first surface of the vibration structure 21. For example, the first electrode portion 21b may have a common electrode (or a single electrode or a single-body electrode) shape where the first electrode portion 21b is disposed on the entire first surface of the vibration structure 21. For example, the first electrode portion 21b may have the same shape as that of the vibration portion 21a, but embodiments of the present disclosure are not limited thereto. The first electrode portion 21b according to an example embodiment may include a transparent conductive material, a semitransparent conductive material, or an opaque conductive material. For example, the transparent conductive material or the semitransparent conductive material may include indium tin oxide (ITO) or indium zinc oxide (IZO), but embodiments of the present disclosure are not limited thereto. The opaque conductive material may include aluminum (Al), copper (Cu), gold (Au), molybdenum (Mo), magnesium (Mg), or an alloy thereof, but embodiments of the present disclosure are not limited thereto.

The second electrode portion 21c may be disposed on the second surface (or a rear surface), which is opposite to or different from the first surface, of the vibration portion 21a. For example, the second electrode portion 21c may have a single-body electrode (or a common electrode) shape where the second electrode portion 21c is disposed at an entire second surface of the vibration portion 21a. For example, the second electrode portion 21c may have the same shape as that of the vibration portion 21a, but embodiments of the present disclosure are not limited thereto. The second electrode portion 21c according to an example embodiment may include a transparent conductive material, a semitransparent conductive material, or an opaque conductive material. For example, the second electrode portion 21c may include the same material as that of the first electrode portion 21b, but embodiments of the present disclosure are not limited thereto. As another example, the second electrode portion 21c may include a material which differs from that of the first electrode portion 21b.

The connection member 15 may be disposed between the vibration plate 10 and the vibration generator 20 and may connect or couple the vibration generator 20 to one surface of the vibration plate 10. For example, the vibration generator 20 may be connected or coupled to a front surface or a rear surface of the vibration plate 10 by the connection member 15 and may be supported or disposed at the front surface or the rear surface of the vibration plate 10.

The connection member 15 according to an example embodiment may include a material including an adhesive layer which is good in adhesive force or attaching force with respect to each of the vibration generator 20 and one surface of the vibration plate 10. For example, the connection member 15 may include a foam pad, a double-sided tape, or an adhesive, but embodiments of the present disclosure are not limited thereto. For example, the adhesive layer of the connection member 15 may include epoxy, acrylic, silicone, or urethane, but is not limited thereto. For example, the adhesive layer of the connection member 15 may include an acrylic-based material which is relatively greater in adhesive force and hardness than an urethane-based material. Accordingly, a vibration of the vibration generator 20 may be well transferred to the vibration plate 10.

In the vibration generator 20, a first protection member 21e may be disposed on the first electrode portion 21b and may protect the first electrode portion 21b. A second protection member 21f may be disposed on the second electrode portion 21c and may protect the second electrode portion 21c. For example, each of the first protection member 21e and the second protection member 21f of the vibration generator 20 may include a plastic material, a fiber material, or a wood material, but embodiments of the present disclosure are not limited thereto. For example, in the vibration generator 20, the first protection member 21e may include a material which is the same as or different from that of the second protection member 21f. One or more of the first protection member 21e and the second protection member 21f of the vibration generator 20 may be connected or coupled to one surface of the vibration plate 10 by the connection member 15. For example, the first and second protection members may be referred to as first and second cover members, respectively.

In the vibration generator 20, each of the first protection member 21e and the second protection member 21f may be a polyimide film or a polyethylene terephthalate film, but embodiments of the present disclosure are not limited thereto.

The vibration generator 20 according to an example embodiment of the present disclosure may further include a first adhesive layer 21d and a second adhesive layer 21g.

In the vibration generator 20, the first adhesive layer 21d may be disposed between the vibration structure 21 and the first protection member 21e. For example, the first adhesive layer 21d may be disposed between the first protection member 21e and the first electrode portion 21b of the vibration structure 21. The first protection member 21e may be disposed on a first surface (or the first electrode portion 21b) of the vibration structure 21 by the first adhesive layer 21d. For example, the first protection member 21e may be coupled or connected to the first surface (or the first electrode portion 21b) of the vibration structure 21 by a film laminating process by the first adhesive layer 21d.

In the vibration generator 20, the second adhesive layer 21g may be disposed between the vibration structure 21 and the second protection member 21f. For example, the second adhesive layer 21g may be disposed between the second protection member 21f and the second electrode portion 21c of the vibration structure 21. The second protection member 21f may be disposed on a second surface (or the second electrode portion 21c) of the vibration structure 21 by the second adhesive layer 21g. For example, the second protection member 21f may be coupled or connected to the second surface (or the second electrode portion 21c) of the vibration structure 21 by a film laminating process by the second adhesive layer 21g.

In the vibration generator 20, the first and second adhesive layers 21d and 21g may include an electrically insulating material. For example, the electrical insulation material may be a material which has adhesive properties and is capable of compression and decompression. For example, one or more of the first and second adhesive layers 21d and 21g may include an epoxy resin, an acrylic resin, a silicone resin, or a urethane resin, but embodiments of the present disclosure are not limited thereto. For example, the adhesive layer may be referred to as an adhesive member, a connection member, or a connection layer, but the terms are not limited thereto.

In the vibration generator 20, the first and second adhesive layers 21d and 21g may be connected or coupled to each other between the first protection member 21e and the second protection member 21f. For example, in the vibration generator 20, the first and second adhesive layers 21d and 21g may be connected or coupled to each other at an edge portion (or a periphery portion) between the first protection member 21e and the second protection member 21f. Accordingly, in the vibration generator 20, the vibration structure 21 may be surrounded by the first and second adhesive layers 21d and 21g. For example, the first and second adhesive layers 21d and 21g may fully surround all of the vibration structure 21 of the vibration generator 20.

The adhesive layer of the connection member 15 may further include an additive such as a tackifier, a wax component, or an antioxidant. The additive may prevent the connection member 15 from being detached (or striped) from the vibration plate 10 by a vibration of the vibration generator 20. For example, the tackifier may be rosin derivatives, and the wax component may be a paraffin wax, or the like. For example, the antioxidant may be a phenolic antioxidant such as thioester, but embodiments of the present disclosure are not limited thereto.

According to another example embodiment of the present disclosure, the connection member 15 may further include a hollow portion provided between the vibration plate 10 and the vibration generator 20. The hollow portion of the connection member 15 may provide an air gap between the vibration plate 10 and the vibration generator 20. The air gap may allow a sound wave (or a sound pressure level) based on a vibration of the vibration generator 20 to concentrate on the vibration plate 10 without being dispersed by the connection member 15, and thus, the loss of a vibration by the connection member 15 may be minimized, thereby increasing a sound pressure level characteristic of a sound generated based on a vibration of the vibration plate 10.

The connection member 15 may overlap the vibration structure 21 and include the first connection member 15a, which is disposed between the vibration plate 10 and the vibration structure 21, and the second connection member 15b, which is disposed to surround the first connection member 15a.

The first connection member 15a may perform a function of transferring a vibration generated in the vibration structure 21, and thus, may include a connection member having a high modulus for enhancing the performance of the vibration apparatus. For example, the first connection member 15a may include an epoxy adhesive, a hot melt adhesive, or a silicone adhesive, and the second connection member 15b may include an acrylic-based adhesive.

The first connection member 15a according to an example embodiment of the present disclosure may have a modulus which is greater than that of the second connection member 15b. For example, when the first connection member 15a is an epoxy adhesive or a silicone adhesive, a numerical range of a modulus may be 0.1 GPa (Giga Pascal) to 1 GPa, and when the second connection member 15b is an acrylic adhesive, a range of a modulus may be 0.01 MPa (Mega Pascal) to 0.1 MPa, but embodiments of the present disclosure are not limited thereto.

Figure 3A:
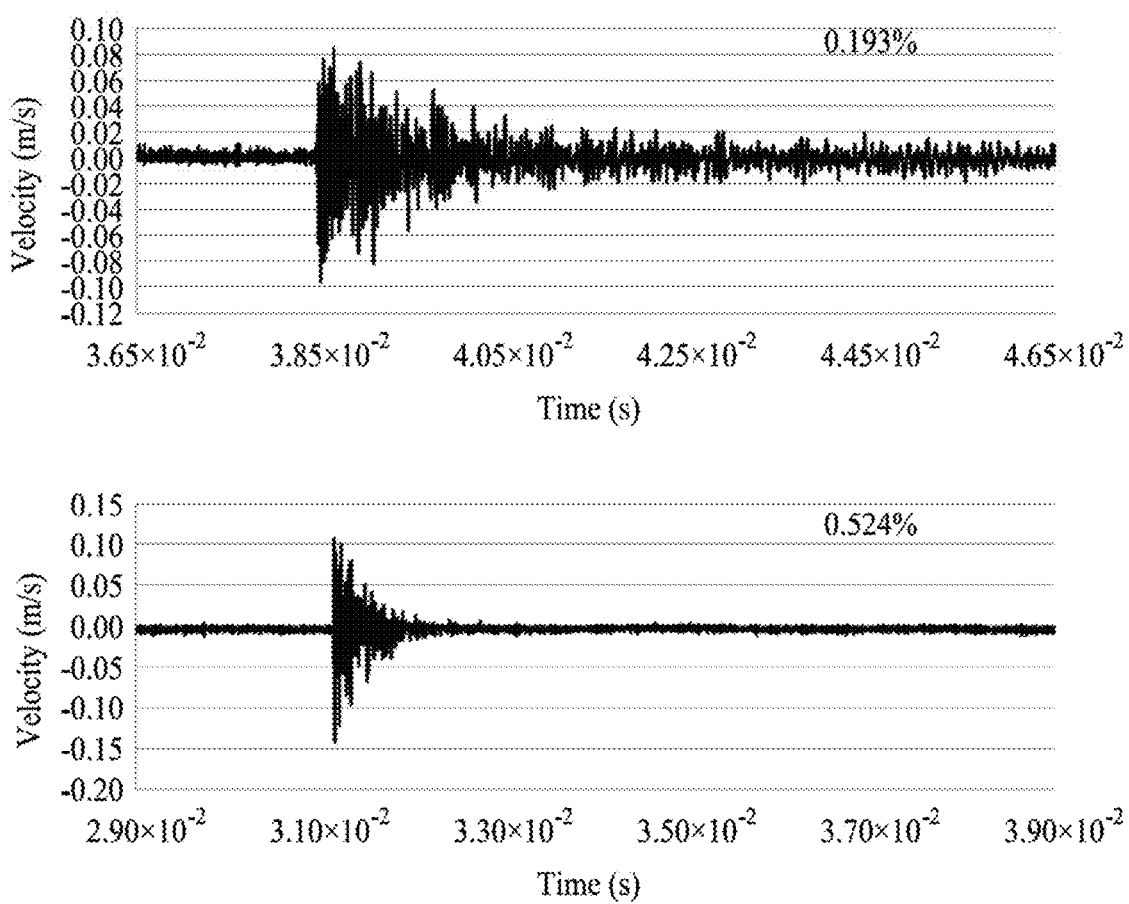
FIG. 3A illustrates an example of a damping characteristic of a first connection member.
Figure 3B:
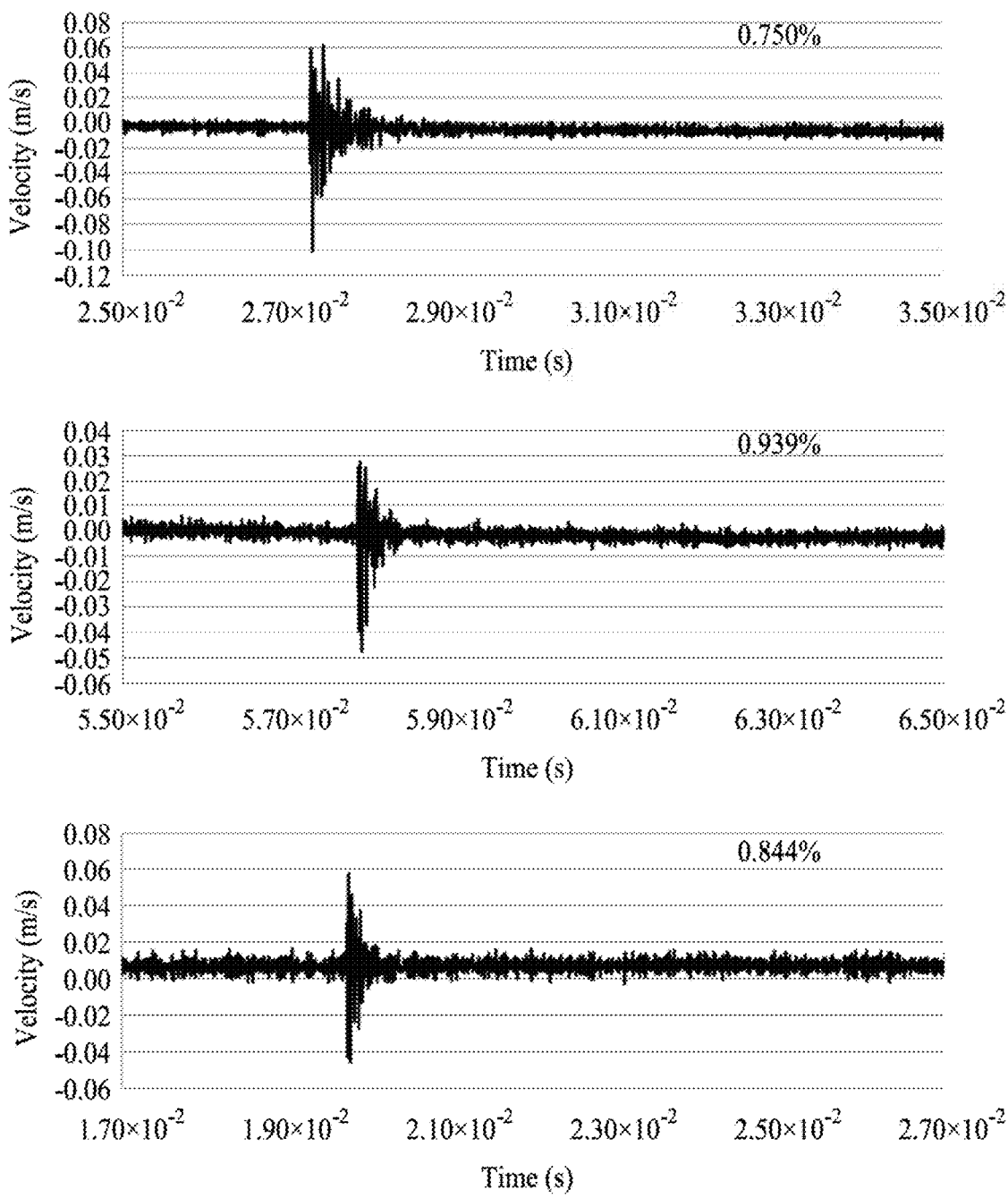
FIG. 3B illustrates an example of a damping characteristic of a second connection member.
Figure 3C:
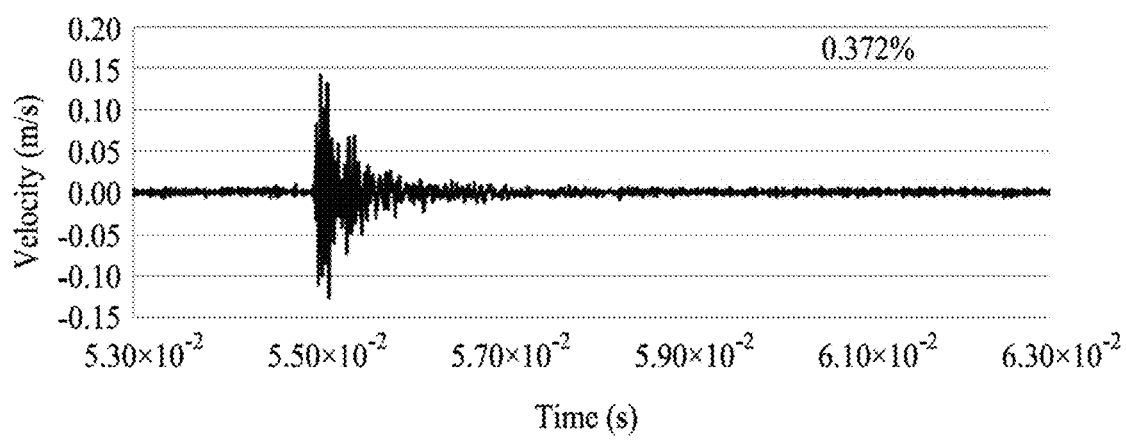
FIG. 3C illustrates an example of a damping characteristic after the second connection member is stacked.

FIG. 3A illustrates an example of a damping characteristic of a first connection member, FIG. 3B illustrates an example of a damping characteristic of a second connection member 15b, and FIG. 3C illustrates an example of a damping characteristic after the second connection member 15b is stacked. In the damping characteristics of FIGS. 3A to 3C, a vibration plate where two pieces of glass of 0.5 t (or 0.5 mm) that are stacked is used, a vibration structure of about 20 mm is provided, and the first connection member 15a or the second connection member 15b provided as a sample is disposed between adjacent vibration structures. A damping characteristic has been measured by calculating a damping ratio of a measurement frequency of 66 kHz, an interval of 80 ms of a 1 cycle sine wave signal has been adjusted, and a damping characteristic has been measured at a position which is spaced apart from the vibration structure and the first connection member/second connection member (15a, 15b) by 0.5 cm. Table 1 shows an example of a damping ratio measurement result of FIGS. 3A and 3C. A high damping ratio denotes that a vibration or a signal generated in the vibration structure is quickly removed and a reverberation is removed.

TABLE 1

| Material | Sample | Damping ratio (%) |
|---|---|---|
| Silicone Adhesive | A | 0.193 |
|  | B | 0.524 |
| Acrylic Adhesive | C | 0.750 |
|  | D | 0.939 |
|  | E | 0.744 |
|  | F | 0.372-0.398 |

Referring to FIGS. 3A to 3C and Table 1, it may be seen that damping ratio measurement values of silicone-based adhesives of a sample A and a sample B are 0.193% and 0.524%, and a deviation between the sample A and the sample B represents a low value, and it may be seen that damping ratio measurement values of acrylic-based adhesives of a sample C to a sample E represent a high numerical value of a maximum value 0.939% and a lowest value 0.744%. A sample F on which the same sample is stacked has been measured and a damping ratio of 0.372% to 0.398% has been measured.

Referring to FIGS. 3A to 3C and a result of Table 1 in conjunction with FIG. 1, in an example where the first connection member includes a material having a high modulus, a vibration generated by the vibration structure 21 may be effectively transferred to a vibration plate in a region overlapping the vibration structure 21, and in an example where the second connection member 15b includes a material having a low modulus, a residual vibration caused by a vibration generated by the vibration structure 21 may be quickly prevented.

Figure 4:
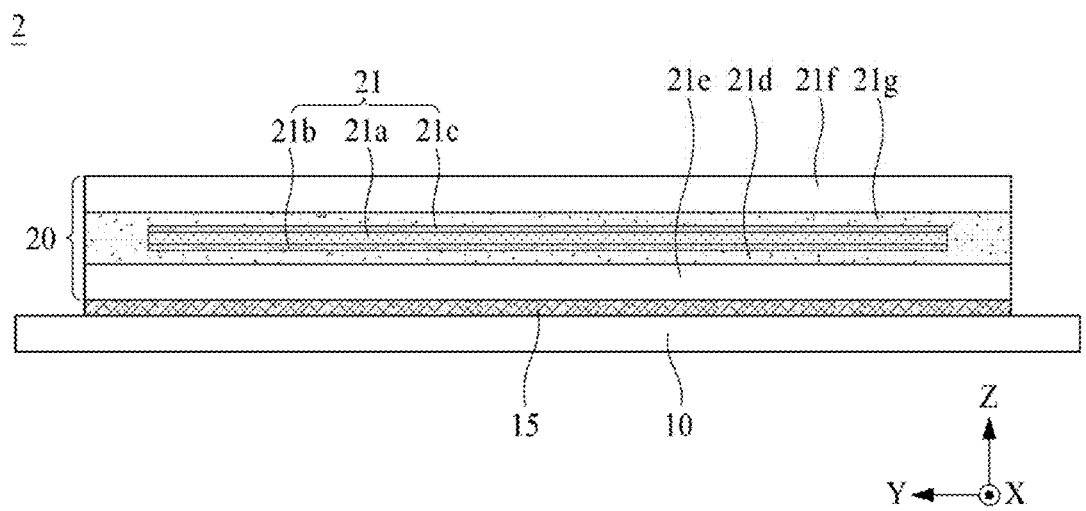
FIG. 4 illustrates a vibration apparatus according to another example embodiment of the present disclosure.

FIG. 4 illustrates a vibration apparatus 2 according to another example embodiment of the present disclosure.

Referring to FIG. 4, the vibration apparatus 2 according to another example embodiment of the present disclosure may include a vibration plate 10, a vibration generator 20 disposed at the vibration plate 10, and a connection member 15 between the vibration plate 10 and the vibration generator 20. The connection member 15 may include a metal material.

Except that a single connection member 15 is applied, the vibration apparatus 2 may be substantially the same as the vibration apparatus 1 described above with reference to FIGS. 1 to 3, and thus, like reference numerals refer to like elements and their repeated descriptions may be omitted for brevity.

Referring to FIG. 4, a connection member according to an example embodiment of the present disclosure may include a metal material and an adhesive layer. For example, the metal material may include a metal particle such as an aluminum (Al), a nickel (Ni), a copper (Cu), or a silver (Ag) particle, and/or may include a carbon nanoparticle, a carbon nanotube, or a carbon nanofiber having conductivity. The adhesive layer may include epoxy, acrylic, silicone, or urethane, but embodiments of the present disclosure are not limited thereto.

The connection member of the vibration apparatus 2 according to another example embodiment of the present disclosure may include a metal material having a high modulus and may be enhanced in modulus, thereby increasing a vibration transfer force for transferring a vibration generated by the vibration generator to the vibration plate. In addition, the connection member of the vibration apparatus 2 according to another example embodiment of the present disclosure may include metal having a high melting point and may have a light-temperature characteristic where a variation of a modulus caused by a variation of a temperature is small. Furthermore, the connection member of the vibration apparatus 2 according to another example embodiment of the present disclosure may include a metal material and may increase in density and interface adhesive force, and thus, attachment uniformity may be enhanced and an air bubble may be minimized.

Figure 5:
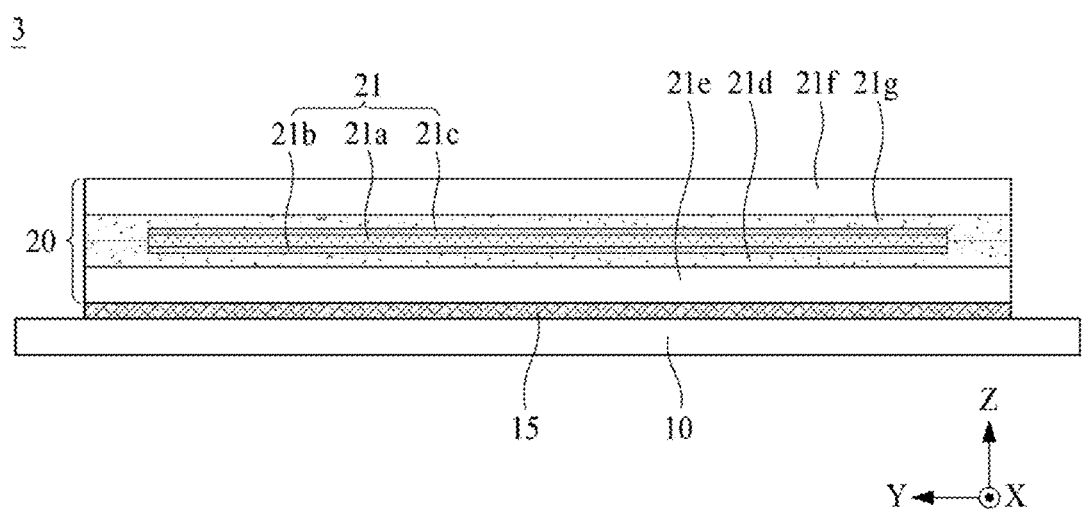
FIG. 5 illustrates a vibration apparatus according to another example embodiment of the present disclosure.

FIG. 5 illustrates a vibration apparatus according to another example embodiment of the present disclosure.

The vibration apparatus 3 according to another example embodiment of the present disclosure may include a vibration plate 10, a vibration generator 20 which vibrates the vibration plate 10, and a connection member 15 between the vibration plate 10 and the vibration generator 20. The vibration generator 20 may include a vibration structure 21, a first electrode portion 21b on a first surface of the vibration structure 21, and a second electrode portion 21c on a second surface, which is opposite to the first surface, of the vibration structure 21.

The first electrode portion 21b and the second electrode portion 21c applied to the vibration apparatus 3 may be good in interface characteristic of an electrode portion, and thus, should have an excellent adhesive force, a good surface coverage, and good electrical conductivity based on low resistivity, and the reliability of the vibration apparatus should be secured. Therefore, the inventors have performed various experiments on an electrode portion applicable to the vibration apparatus 3 among aluminum (Al), copper (Cu), gold (Au), and silver (Ag). Through the various experiments, the first electrode portion 21b and the second electrode portion 21c have been configured with a silver (Ag) electrode. However, the silver (Ag) electrode may have a problem where a degradation in the vibration generator 20 occurs in a high-temperature and high-humidity environment and an adhesive force to the vibration generator 20 is reduced. For example, in a case where the first electrode portion 21b and the second electrode portion 21c are configured with the silver (Ag) electrode capable of low temperature firing, the inventors have recognized a problem where a contact characteristic with an interface of the vibration generator 20 (for example, an inorganic portion) is low, an adhesive force of the silver (Ag) electrode is weak, a surface area of the silver (Ag) is reduced, and the reliability of the vibration generator 20 is reduced due to low electrical conductivity. Accordingly, the inventors have performed various experiments for improving an adhesive force and reliability of an electrode portion. Through the various experiments, the inventors have developed an electrode portion which may enhance the reliability of the vibration generator 20 in a high-temperature and high-humidity environment and may enhance an adhesive force and reliability in high temperature firing.

Each of the first electrode portion 21b and the second electrode portion 21c may include silver (Ag) and a glass frit. For example, when each of the first electrode portion 21b and the second electrode portion 21c is configured with silver (Ag) electrode capable of high temperature firing, and the amount of the glass frit is less than the amount of silver (Ag), the inventors have recognized a problem where a surface coverage and an adhesive force of the silver (Ag) electrode are weak, the silver (Ag) content increases, the cost increases, and reliability is reduced when the first and second electrode portions 21b and 21c have been driven for a long time. For example, when each of the first electrode portion 21b and the second electrode portion 21c is configured with a silver (Ag) electrode capable of high temperature firing, and the amount of the glass frit is greater than the amount of silver (Ag), the inventors have recognized a problem where a conductivity and a piezoelectric characteristic are reduced due to the higher content of the glass frit even though a surface coverage and an adhesive force of silver (Ag) are good. Therefore, the inventors have performed various experiments on the content of the glass frit and the content of silver (Ag) (e.g., changing the amount of the glass frit and the amount of silver (Ag)) to improve the reliability and the adhesive force of the vibration generator. This will be described in more detail below.

Except for configurations of a single connection member 15 and electrode portions 21b and 21c, the vibration apparatus 3 of FIG. 5 may be substantially the same as the vibration apparatus 1 described above with reference to FIGS. 1 to 3, and thus, like reference numerals refer to like elements and their repeated descriptions may be omitted for brevity. Detailed configurations and features of the electrode portions 21b and 21c will be described below with reference to FIGS. 6A to 12B.

For example, the first electrode portion 21b and the second electrode portion 21c may be prepared by a process where the first electrode portion 21b and the second electrode portion 21c are formed or coated on respective surfaces of the vibration portion 21a using a composition including silver (Ag), a glass frit, a binder, a solvent, and resin, and are fired. Firing may be performed at a high temperature. All of the solvent and the binder may be volatilized in a process of firing the first electrode portion 21b and the second electrode portion 21c. Therefore, when the first electrode portion 21b and the second electrode portion 21c are prepared using a composition including silver (Ag), a glass frit, a binder, a solvent, and resin, the binder, the solvent, and the resin may be volatilized, and thus, the first electrode portion 21b and the second electrode portion 21c may be expressed as the following Equation 1.

A weight of silver (Ag) or a glass frit in electrode portion=(a weight of silver (Ag) or a glass frit in composition)/(a total sum of silver (Ag) or a glass frit in composition)     [Equation 1]

For example, silver (Ag) may use a fine particle having a size of 1 μm (micrometer) or less and a glass frit may use a particle having a size of 1 μm to 3 μm, but embodiments of the present disclosure are not limited thereto. When a particle of silver (Ag) or a glass frit is excessively large, formation of an electrode portion may be non-uniform in a firing process, and a firing time may increase.

For example, a glass frit may be a lead (Pb)-based glass frit or a bismuth (Bi)-based glass frit, but embodiments of the present disclosure are not limited thereto. A glass transition temperature (Tg) of the glass frit may be 330° C. to 380° C.

Figure 6A:
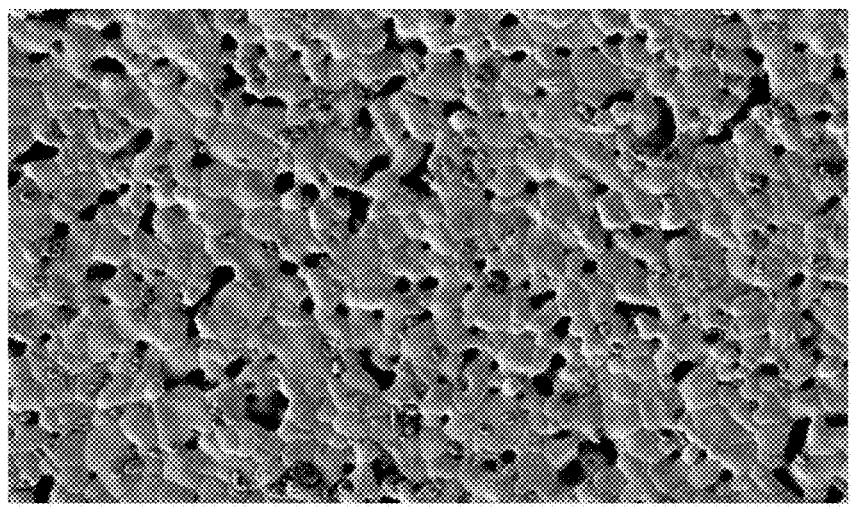
FIGS. 6A to 10F illustrate scanning electron microscope photographs of a surface of an electrode portion according to one or more example embodiments of the present disclosure and illustrate examples of scanning electron microscope photographs of a cross-sectional surface of a boundary between the electrode portion and a vibration structure.
Figure 6B:
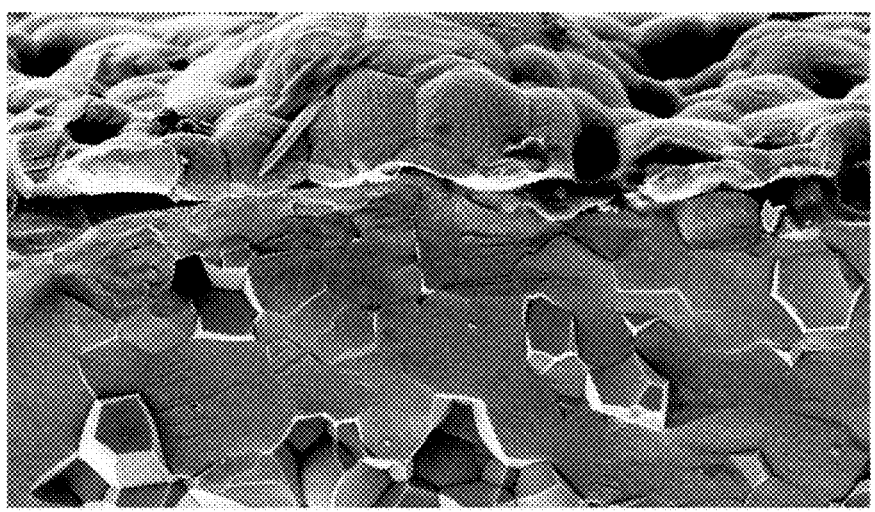

According to an example embodiment of the present disclosure, a silver (Ag) particle may be included by 63 wt % to 67 wt % with respect to an electrode composition for forming the first electrode portion 21b and the second electrode portion 21c, and a glass frit may be included by 3 wt % to 4 wt % in the electrode composition. The glass frit may be a lead (Pb)-based glass frit. The electrode composition prepared in this manner may be coated or formed on one surface of a vibration structure having a thickness of about 7 μm to about 8 μm, and then, may be fired at a temperature of 650° C. Subsequently, as in a structure of the vibration apparatus of FIG. 5, the adhesive layers 21d and 21g and the protection members 21e and 21f may be bonded or attached to the respective electrode portions through a film laminating process. FIG. 6A is an example of a scanning electron microscope photograph of a surface of an electrode portion prepared according to an example embodiment described above. FIG. 6B is an example of a scanning electron microscope photograph of a cross-sectional surface of a boundary between an electrode portion and a vibration structure. Referring to FIGS. 6A and 6B, it may be seen that a surface coverage of the electrode portion is excellent without a void, an interface between the electrode portion and the vibration structure represents good adhesiveness where the electrode portion is bonded or attached to the vibration structure without a void, based on a high adhesive characteristic, and a film uniformity of the electrode portion is good. In the electrode portion of an example embodiment prepared under a condition of FIGS. 6A and 6B, a silver (Ag) may occupy about 95.7 wt %, and a glass frit may occupy about 4.3 wt %.

In addition, a sound pressure level characteristic has been measured in a vibration apparatus prepared under the condition of FIGS. 6A and 6B, and in this case, a measurement value has been adjusted to a reference sound pressure level value. Furthermore, the inventors have performed a reliability test where a sound pressure level value is measured, and then, the vibration apparatus prepared under the condition of FIGS. 6A and 6B is exposed at a high temperature and high humidity, and after the reliability test, the inventors have analyzed an interface characteristic of an electrode which is prepared based on whether the reference sound pressure level value is changed or not. In this case, a sound pressure level of a vibration apparatus has been measured by Audio Precision company's APX525 which is commercial equipment. Using this equipment, the inventors set an input voltage to 5 Vrms, applied a signal amplified by an amplifier (AMP) to the vibration apparatus under a condition where a sine sweep is within a range of 150 Hz to 8 kHz, measured an average sound pressure level by a microphone (MIC) at a position being spaced apart from the vibration plate 10, which is a vibration object, by 30 cm, and recorded a sound pressure level measured by Precision company's APX525. The measured sound pressure level has been corrected to ⅓ octave smoothing. The sine sweep may be a method which performs a sweep for a short time, and a measurement method is not limited to the method.

Figure 6C:
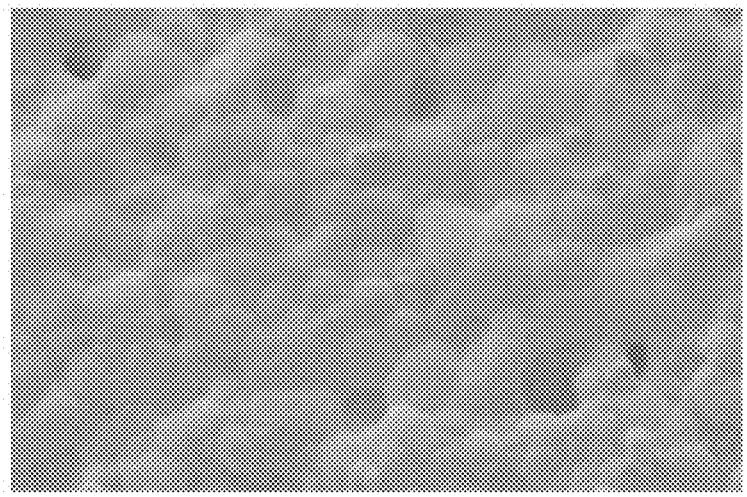
Figure 6D:
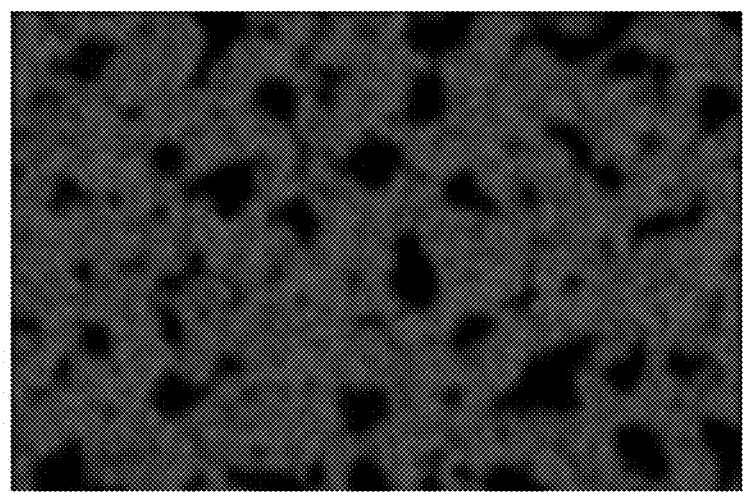
Figure 6E:
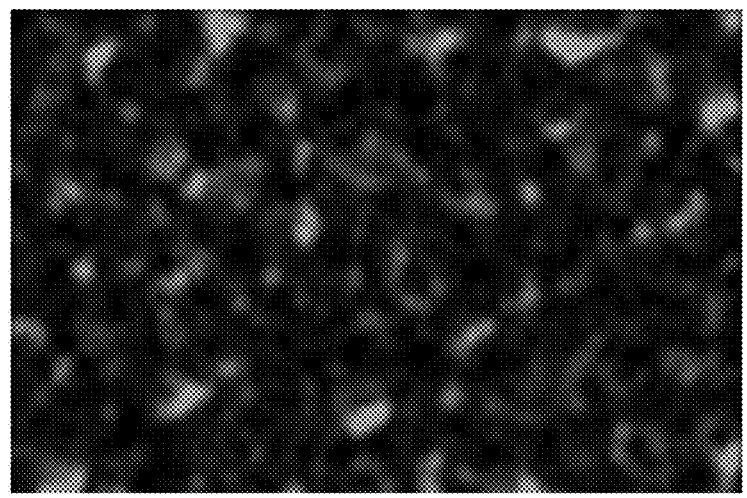
Figure 6F:
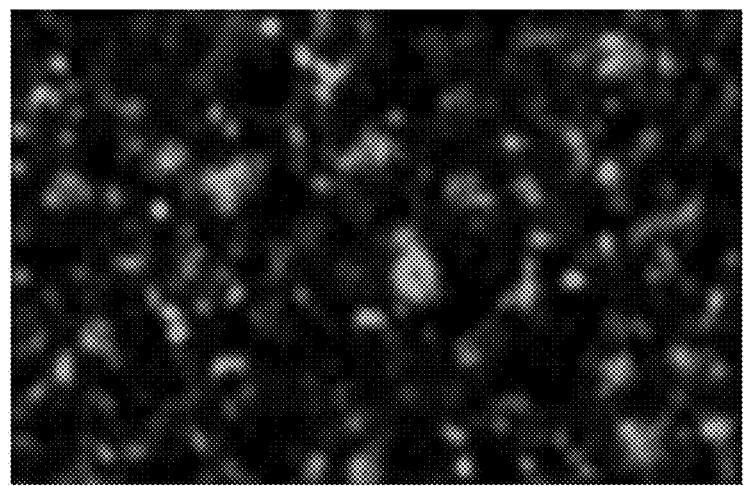

FIG. 6C is an example of a scanning electron microscope photograph obtained by photographing a surface of an electrode portion, prepared in FIG. 6A, at 3,000 magnification, FIG. 6D is an example of a photograph mapped to a silver (Ag) element by an energy dispersive X-ray spectroscopy EDS analysis apparatus, FIG. 6E is an example of a photograph mapped to a lead (Pb) element by the EDS analysis apparatus, and FIG. 6F is an example of a photograph mapped to a zinc (Zn) element by the EDS analysis apparatus.

Referring to FIGS. 6C to 6F, it has been analyzed that silver (Ag) occupies an area of about 83% in an electrode portion, based on an image analysis result of a photograph mapped to a silver (Ag) element and a scanning electron microscope photograph. In addition, a surface resistance of the prepared electrode portion has been measured to less than 0.01 Ω/sq, and a thickness of the electrode portion has been measured to about 3.4 μm as a result obtained by measuring an average thickness through a fracture surface analysis. Each of a lead (Pb) element and a zinc (Zn) element may be a material representing a component of a glass frit and a piezoelectric element included in a vibration portion. The lead (Pb) element and the zinc (Zn) element may be mapped in a region where an element is not formed, in the vibration portion. In addition, the glass frit may move toward the vibration portion and the electrode portion interface in a firing process, and only a portion thereof may be observed at a surface. Accordingly, the lead (Pb) element and the zinc (Zn) element may occupy an area of about 17% except an area occupied by the silver (Ag) element.

Figure 7A:
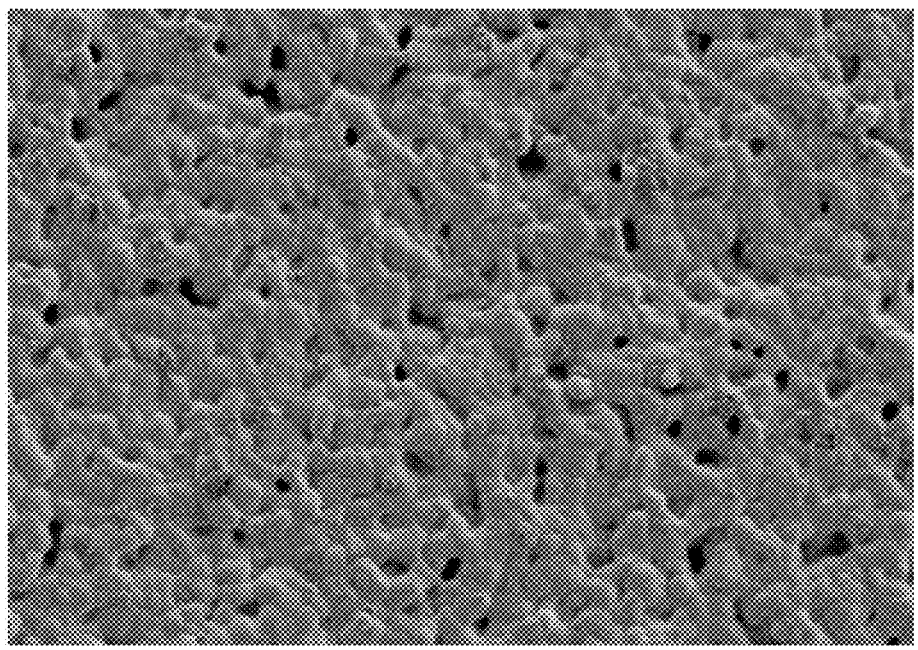
Figure 7B:
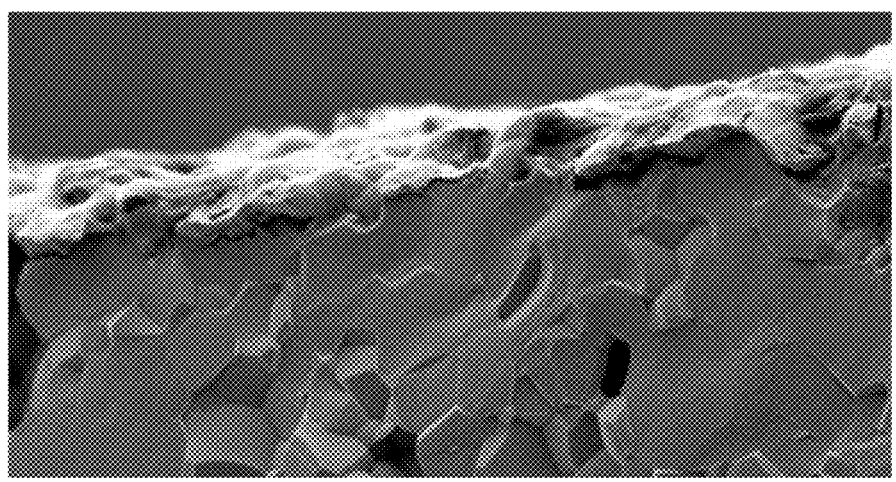
Figure 8A:
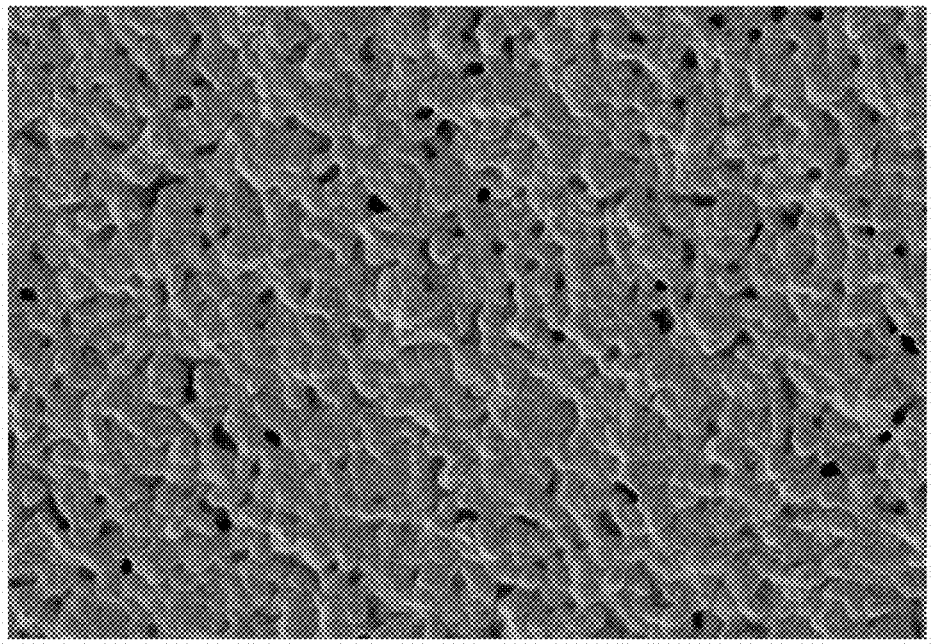
Figure 8B:
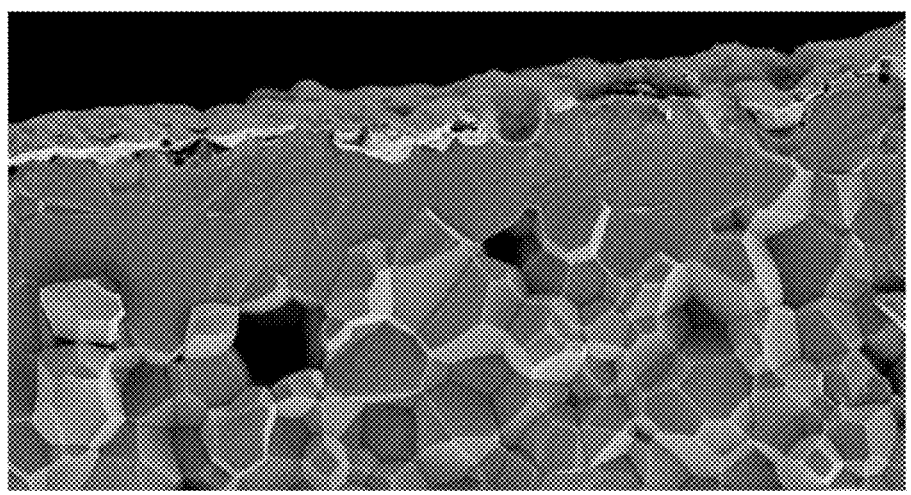
Figure 9A:
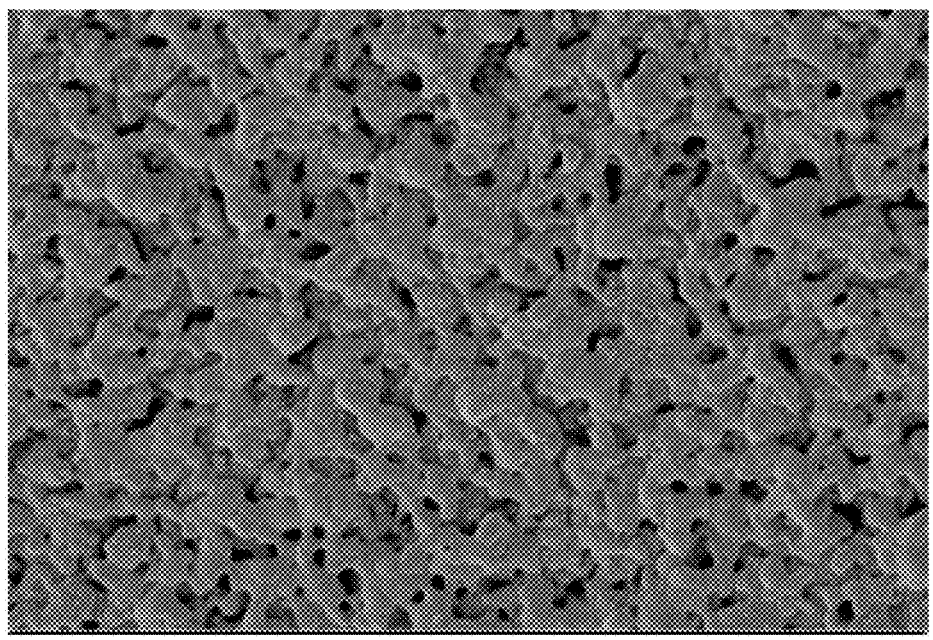
Figure 9B:
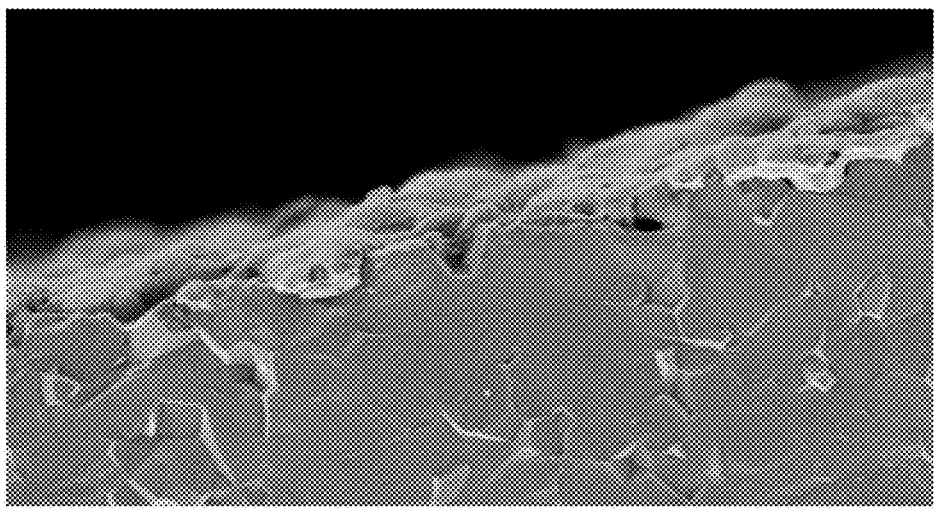

According to another example embodiment of the present disclosure, a silver (Ag) particle may be included by about 50 wt % in an electrode composition for forming the first electrode portion 21b and the second electrode portion 21c, and a glass frit may be included by 5 wt % to 12 wt % in the electrode composition. The electrode composition prepared in this manner may be coated or formed on one surface of a vibration structure by a thickness of about 7 μm to about 8 μm, and then, may be fired at a temperature of 650° C. The glass frit may be a lead (Pb)-based glass frit. The electrode composition prepared in this manner may be fired at a temperature of 650° C. Subsequently, as in a structure of the vibration apparatus of FIG. 5, the adhesive layers 21d and 21g and the protection members 21e and 21f may be bonded or attached to an electrode portion through a film laminating process. FIG. 7A is an example of a scanning electron microscope photograph of a surface of an electrode prepared according to an example embodiment where a silver (Ag) particle is included by about 50 wt % and a glass frit is included by about 12 wt %. FIG. 7B is an example of a scanning electron microscope photograph of a cross-sectional surface of a boundary between an electrode portion and a vibration structure. FIG. 8A is an example of a scanning electron microscope photograph of a surface of an electrode prepared according to an example embodiment where a silver (Ag) particle is included by about 50 wt % and a glass frit is included by about 8 wt %. FIG. 8B is an example of a scanning electron microscope photograph of a cross-sectional surface of a boundary between an electrode portion and a vibration structure. FIG. 9A is an example of a scanning electron microscope photograph of a surface of an electrode prepared according to an example embodiment where a silver (Ag) particle is included by about 50 wt % and a glass frit is included by about 5 wt %. FIG. 9B is an example of a scanning electron microscope photograph of a cross-sectional surface of a boundary between an electrode portion and a vibration structure. Referring to FIGS. 7A to 9B, it may be seen that a surface coverage of the electrode portion is excellent without a void, an interface between the electrode portion and the vibration structure represents good adhesiveness where the electrode portion is bonded to the vibration structure without a void, based on a high adhesive characteristic, and a film uniformity of the electrode portion is good. In a vibration apparatus prepared according to an example embodiment of FIGS. 7A to 9B, an initial sound pressure level measurement value has been measured by about 100% compared to a sound pressure level measurement value of FIGS. 6A to 6F, and after a reliability test at a high temperature and high humidity, a sound pressure level has been measured at a level before the reliability test. In the electrode portion of an example embodiment prepared under a condition of FIGS. 7A to 9B, silver (Ag) may occupy about 80.7 wt % to about 90.9 wt %, and a glass frit may occupy about 9.9 wt % to about 19.4 wt %.

Figure 7C:
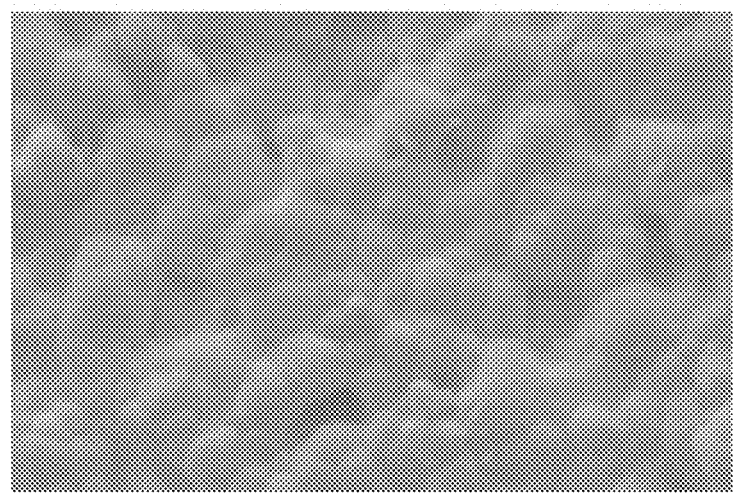
Figure 7D:
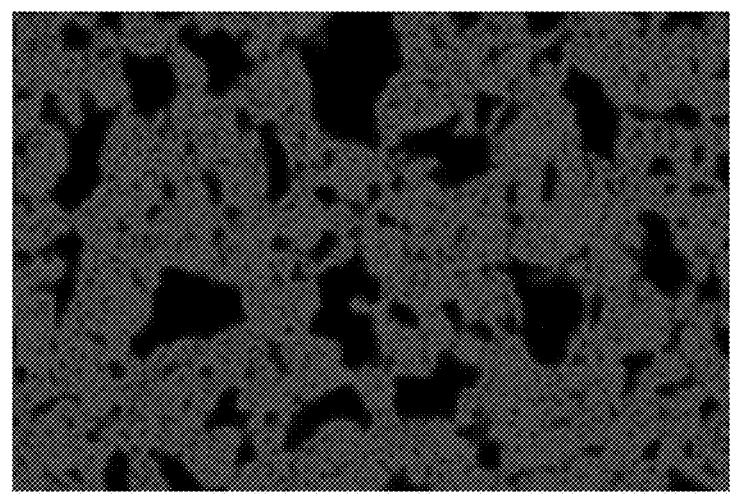
Figure 7E:
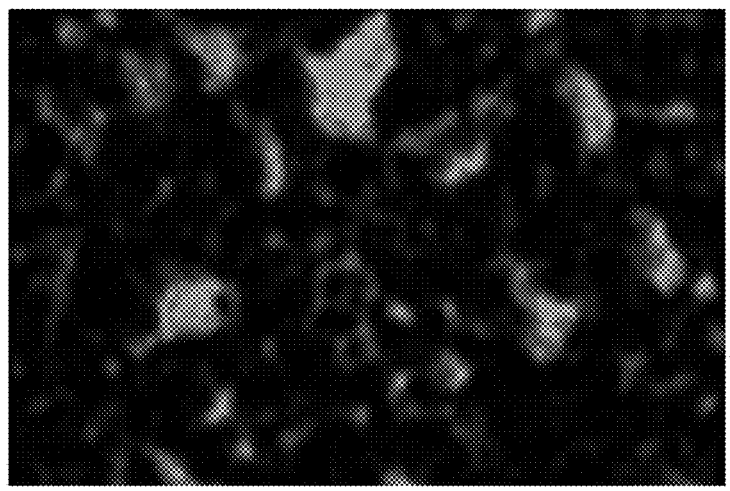
Figure 7F:
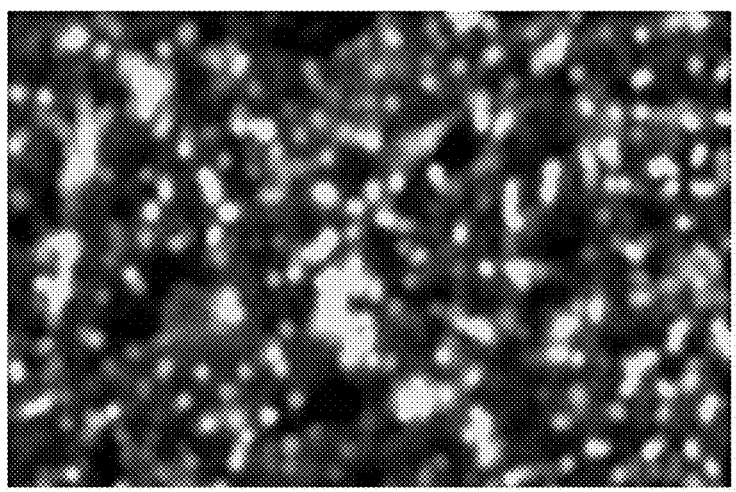

FIG. 7C is an example of a scanning electron microscope photograph obtained by photographing a surface of an electrode portion, prepared in FIG. 7A, at 3,000 magnification, FIG. 7D is an example of a photograph mapped to a silver (Ag) element by the EDS analysis apparatus, FIG. 7E is an example of a photograph mapped to a lead (Pb) element by the EDS analysis apparatus, and FIG. 7F is an example of a photograph mapped to a zinc (Zn) element by the EDS analysis apparatus.

Referring to FIGS. 7C to 7F, it has been analyzed that silver (Ag) occupies an area of about 75% in an electrode portion, based on an image analysis result of a photograph mapped to a silver (Ag) element and a scanning electron microscope photograph. In addition, a surface resistance of the prepared electrode portion has been measured to less than 0.015 Ω/sq (ohm/square), and a thickness of the electrode portion has been measured to about 2.1 μm as a result obtained by measuring an average thickness through a fracture surface analysis. Each of a lead (Pb) element and a zinc (Zn) element may be a material representing a component of a glass frit and a piezoelectric element included in a vibration portion. The lead (Pb) element and the zinc (Zn) element may be mapped in a region where an element is not formed, in the vibration portion. In addition, the glass frit may move toward the vibration portion and an electrode portion interface in a firing process, and only a portion thereof may be observed in a surface. Accordingly, the lead (Pb) element and the zinc (Zn) element may occupy an area of about 25% except an area occupied by the silver (Ag) element.

Figure 10A:
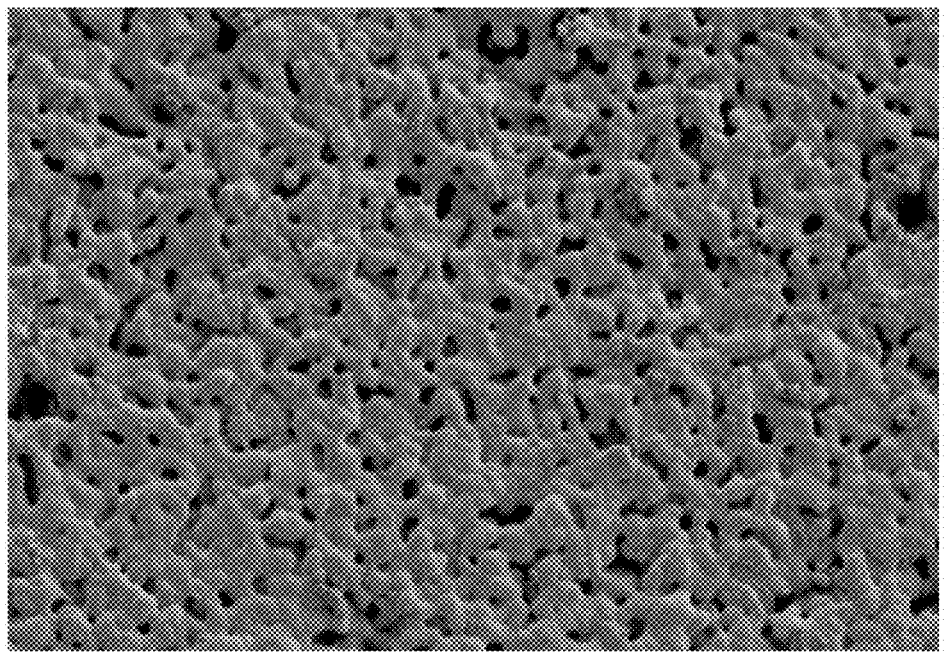
Figure 10B:
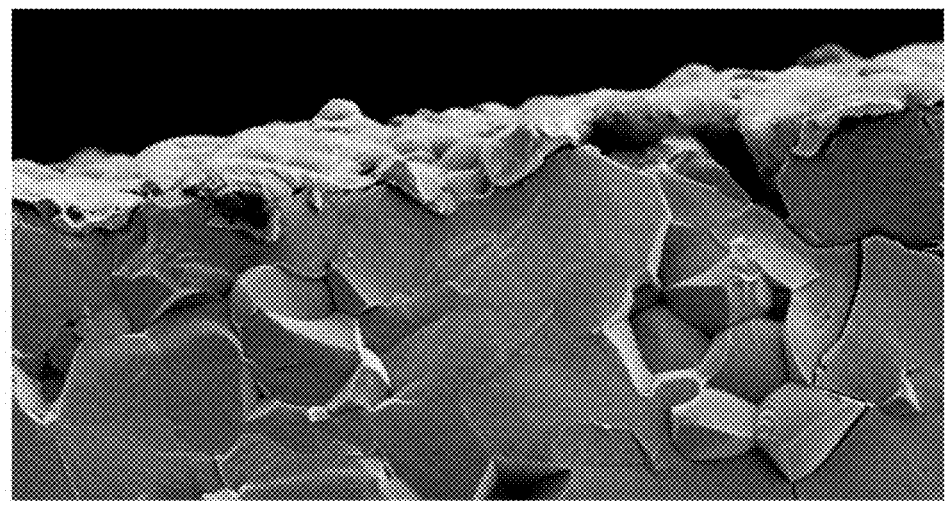

According to another example embodiment of the present disclosure, a silver (Ag) particle may be included by about 40 wt % in an electrode composition for forming the first electrode portion 21b and the second electrode portion 21c, and a glass frit may be included by 4 wt % in the electrode composition. The glass frit may be a bismuth (Bi)-based glass frit. The electrode composition prepared in this manner may be fired at a temperature of 650° C. The electrode composition prepared in this manner may be coated or formed on one surface of a vibration structure by a thickness of about 7 μm to about 8 μm, and then, may be fired at a temperature of 650° C. Subsequently, as in a structure of the vibration apparatus of FIG. 5, the adhesive layers 21d and 21g and the protection members 21e and 21f may be bonded or attached to an electrode portion through a film laminating process. FIG. 10A is an example of a scanning electron microscope photograph of a surface of an electrode prepared according to an example embodiment described above. FIG. 10B is an example of a scanning electron microscope photograph of a cross-sectional surface of a boundary between an electrode portion and a vibration structure. Referring to FIGS. 10A and 10B, it may be seen that a surface coverage of the electrode portion is excellent without a void, an interface between the electrode portion and the vibration structure represents good adhesiveness where the electrode portion is bonded to the vibration structure without a void, based on a high adhesive characteristic, and a film uniformity of the electrode portion is good. In a vibration apparatus prepared according to an example embodiment of FIGS. 10A to 10F, an initial sound pressure level measurement value has been measured by about 100% compared to a sound pressure level measurement value of FIGS. 6A to 6F, and after a reliability test at a high temperature and high humidity, a sound pressure level has been measured at a level before the reliability test. In the electrode portion of an example embodiment prepared under a condition of FIGS. 10A to 10F, a silver (Ag) may occupy about 83.3 wt %, and a glass frit may occupy about 9.9 wt % to about 19.4 wt %.

Figure 10C:
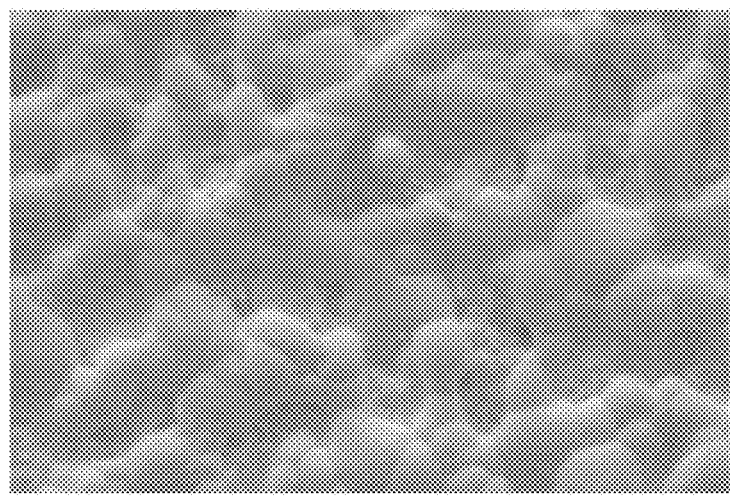
Figure 10D:
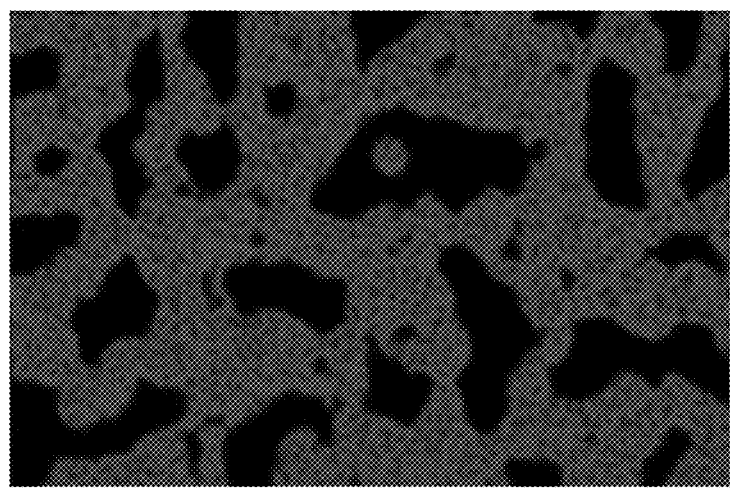
Figure 10E:
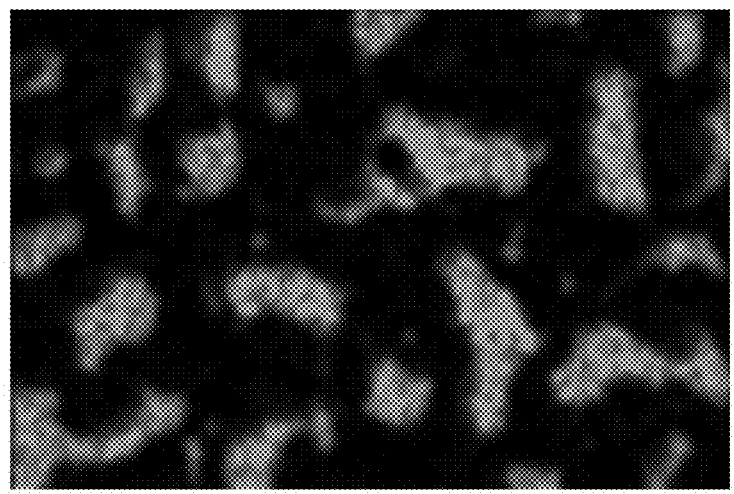
Figure 10F:
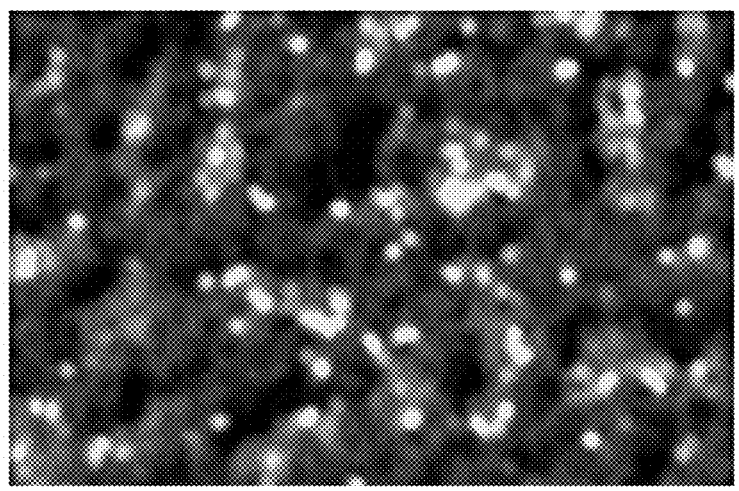

FIG. 10C is an example of a scanning electron microscope photograph obtained by photographing a surface of an electrode portion, prepared in FIG. 10A, at 3,000 magnification, FIG. 10D is an example of a photograph mapped to a silver (Ag) element by the EDS analysis apparatus, FIG. 10E is an example of a photograph mapped to a lead (Pb) element by the EDS analysis apparatus, and FIG. 10F is an example of a photograph mapped to a zinc (Zn) element by the EDS analysis apparatus.

Referring to FIGS. 10C to 10F, it has been analyzed that silver (Ag) occupies an area of about 70% in an electrode portion, based on an image analysis result of a photograph mapped to a silver (Ag) element and a scanning electron microscope photograph. In addition, a surface resistance of the prepared electrode portion has been measured to less than 0.037 Ω/sq (ohm/square), and a thickness of the electrode portion has been measured to about 1.8 μm (micrometer) as a result obtained by measuring an average thickness through a fracture surface analysis (or a fracture analysis or a breaking analysis). Each of a lead (Pb) element and a zinc (Zn) element may be a material representing a component of a glass frit and a piezoelectric element included in a vibration portion. The lead (Pb) element and the zinc (Zn) element may be mapped in a region where an element is not formed, in the vibration portion. In addition, the glass frit may move toward the vibration portion and an electrode portion interface in a firing process, and only a portion thereof may be observed in a surface. Accordingly, the lead (Pb) element and the zinc (Zn) element may occupy an area of about 30% except an area occupied by the silver (Ag) element.

Figure 11:
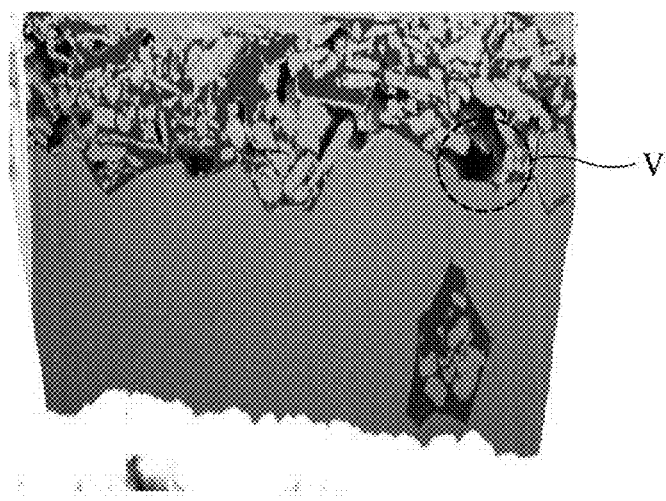
FIG. 11 is an example of an electron microscope photograph of a cross-sectional surface of a boundary between an electrode portion and a vibration structure according to an experiment example 1.

According to an experiment example 1, a first electrode portion and a second electrode portion may be prepared a silver (Ag) electrode by low temperature firing. In an electrode portion according to an experiment example, a silver (Ag) electrode paste may be formed on a vibration portion by a printing process, and then, may be prepared by a low temperature firing at 150° C. Subsequently, as in a structure of the vibration apparatus of FIG. 5, the adhesive layers 21d and 21g and the protection members 21e and 21f may be bonded or attached to an electrode portion by a film laminating process. FIG. 11 is an example of a surface scanning electron microscope photograph of a cross-sectional surface of a boundary between an electrode portion and a vibration structure prepared by the experiment example 1 described above. Referring to FIG. 11, it may be seen that a silver (Ag) particle is used as a flake type, and thus, a non-surface area is low, a void V is formed in an interface by a low adhesive force of the electrode portion and the vibration structure, and an interface adhesive force is reduced. In the vibration apparatus prepared by the experiment example 1 of FIG. 11, all of an initial sound pressure level measurement value and a sound pressure level measurement value after a reliability test at a high temperature and high humidity do not satisfy a desired sound pressure level value. Here, the desired sound pressure level value may denote a value representing a value of less than 97% out of 100%. In the electrode portion of the experiment example 1 prepared under a condition of FIG. 11, silver (Ag) may occupy about 98.0 wt %, and a glass fit may occupy about 2.0 wt %.

Figure 12A:
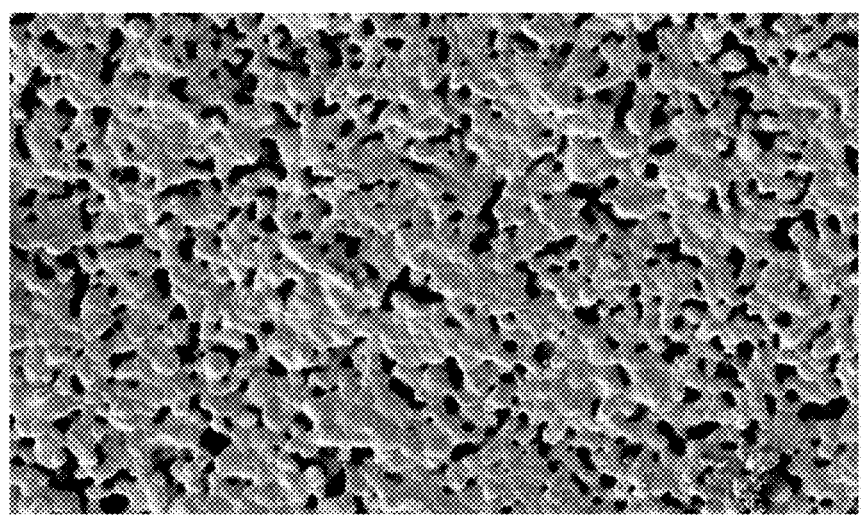
FIG. 12A illustrates an example of a scanning electron microscope photograph of a surface of an electrode portion according to an experiment example 2.
Figure 12B:
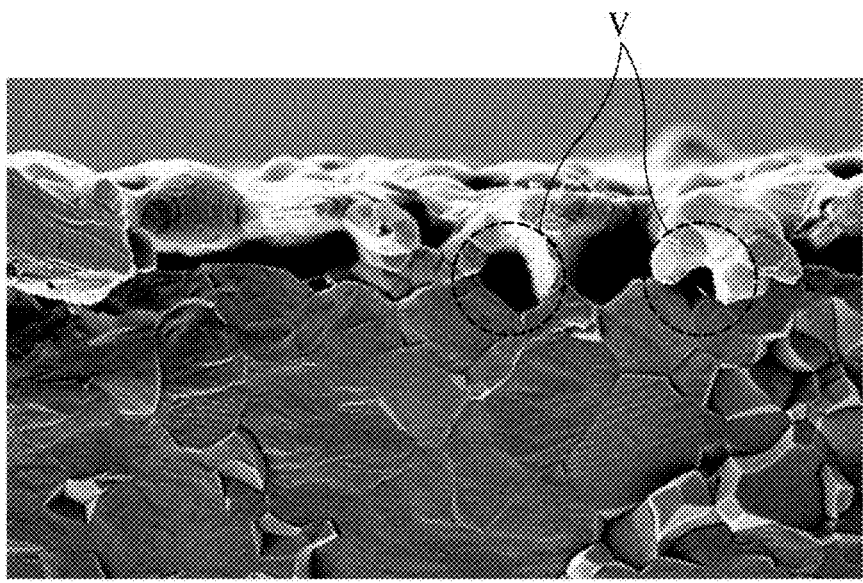
FIG. 12B illustrates an example of an electron microscope photograph of a cross-sectional surface of a boundary between the electrode portion and a vibration structure.

According to an experiment example 2, a silver (Ag) particle may be included by about 40 wt % in an electrode composition for forming the first electrode portion 21b and the second electrode portion 21c, and a glass frit may be included by about 20 wt % in the electrode composition. Alternatively, the silver (Ag) particle may be included by about 50 wt %, and the glass frit may be included by about 1 wt % to about 3 wt %. In this case, the glass frit may be a lead (Pb)-based glass frit. The electrode composition prepared in this manner may be fired at a temperature of 650° C. Subsequently, as in a structure of the vibration apparatus of FIG. 5, the adhesive layers 21d and 21g and the protection members 21e and 21f may be bonded or attached to an electrode portion through a film laminating process. FIG. 12A is an example of a scanning electron microscope photograph of a surface of an electrode prepared according to the experiment example 2 described above. FIG. 12B is an example of a scanning electron microscope photograph of a cross-sectional surface of a boundary between an electrode portion and a vibration structure. Referring to FIGS. 12A and 12B, it may be seen that several voids are formed at a surface of the electrode portion and a surface coverage of the electrode portion is low, and it may be seen that the electrode portion and the vibration structure are low in adhesive force, and thus, several voids V occur and an adhesive force characteristic between the electrode portion and the vibration structure is low. In the vibration apparatus prepared by the experiment example 2 of FIGS. 12A and 12B, all of an initial sound pressure level measurement value and a sound pressure level measurement value after a reliability test at a high temperature and high humidity do not satisfy a desired sound pressure level value. In the electrode portion of the experiment example 2 prepared under a condition of FIGS. 12A and 12B, silver (Ag) may occupy about 94.3 wt %, and a glass frit may occupy about 5.7 wt %.

Referring to FIGS. 5 to 12B, the electrode portion of the vibration apparatus according to an example embodiment of the present disclosure may include 80 to 95 wt % parts by weight of silver (Ag) and 5 to 20 wt % parts by weight of lead (Pb)-based glass frit. In addition, the electrode portion of the vibration apparatus according to an example embodiment of the present disclosure may include 80 to 90 wt % parts by weight of silver (Ag) and 10 to 20 wt % parts by weight of Pb-based glass frit. In addition, the electrode portion of the vibration apparatus according to an example embodiment of the present disclosure may include 80 to 90 wt % parts by weight of silver (Ag) and 10 to 20 wt % parts by weight of a bismuth (Bi)-based glass frit. For example, the electrode portion according to an example embodiment of the present disclosure may include at least 40 wt % parts by weight of silver (Ag) and a glass frit in a metal paste of an electrode portion, and the content of the glass frit may include at least 12 wt % parts by weight or less. Accordingly, the piezoelectric characteristic and the reliability of the electrode portion may be enhanced.

Figure 13:
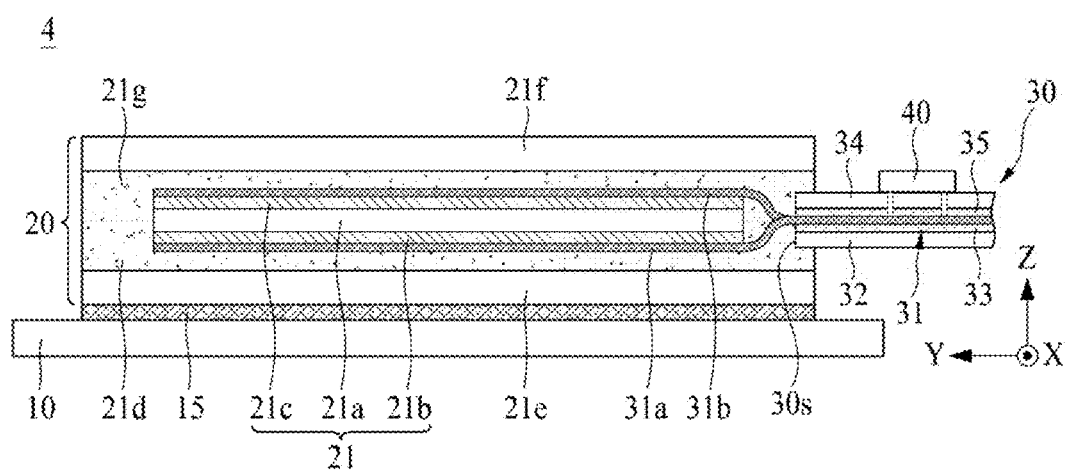
FIG. 13 illustrates a vibration apparatus according to another example embodiment of the present disclosure.
Figure 14:
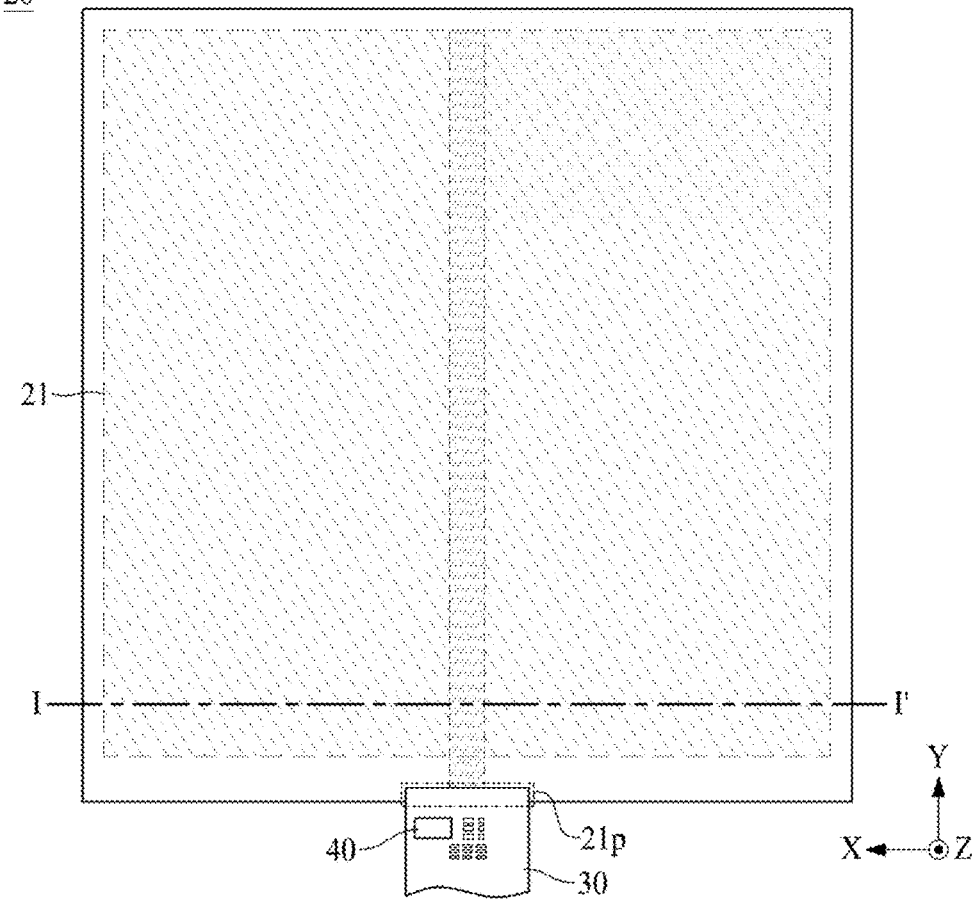
FIG. 14 is a plan view of a vibration generator according to an example embodiment of the present disclosure.
Figure 15:
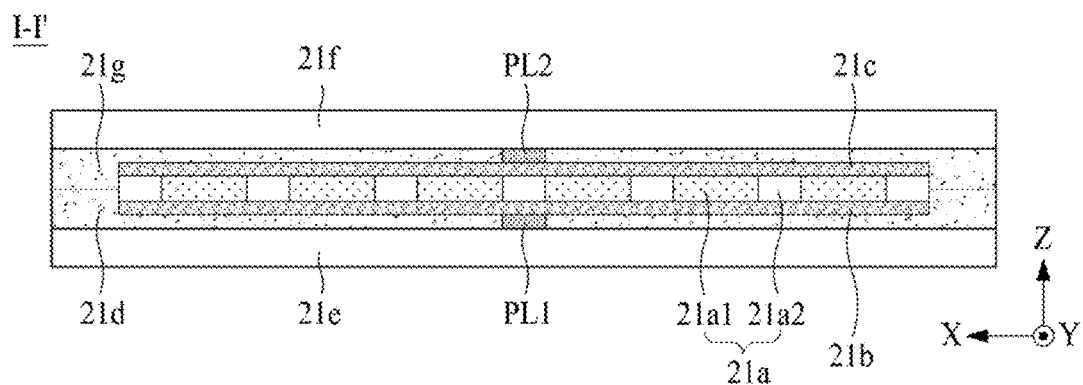
FIG. 15 is an example of a cross-sectional view taken along line I-I' illustrated in FIG. 14.

FIG. 13 illustrates a vibration apparatus 4 according to another example embodiment of the present disclosure, FIG. 14 is a plan view of a vibration generator according to an example embodiment of the present disclosure, and FIG. 15 is an example of a cross-sectional view taken along line I-I' illustrated in FIG. 14.

Referring to FIGS. 13 and 14, the vibration apparatus 4 according to another example embodiment of the present disclosure may include a vibration plate 10, a vibration generator which vibrates the vibration plate 10, and a connection member 15 between the vibration plate 10 and the vibration generator. The vibration generator may include a vibration structure, a first electrode portion 21b on a first surface of the vibration structure, and a second electrode portion 21c on a second surface, which is opposite to the first surface, of the vibration structure. The vibration generator may further include a first cover member 21e on the first electrode portion 21b, a second cover member 21f on the second electrode portion 21c, a signal cable 30 electrically connected to the vibration structure, and a signal generating circuit 40 mounted on the signal cable 30.

The signal generating circuit 40 may be mounted on the signal cable 30. For example, the signal generating circuit 40 may be mounted on an edge portion (or a periphery portion) of the signal cable 30 adjacent to a pad portion 21p of the vibration generator. The signal generating circuit 40 may be integrated (or mounted) into the signal cable 30, and thus, the signal generating circuit 40 and the signal cable 30 may be implemented as one element. For example, the signal generating circuit 40 may be referred to as a sound processing circuit, and a vibration driving circuit, but the terms are not limited thereto.

The signal cable 30 may be configured as a double-sided flexible printed circuit, but embodiments of the present disclosure are not limited thereto, and may be configured as a flexible printed circuit cable, a flexible flat cable, a single-sided flexible printed circuit, a single-sided flexible printed circuit board, a flexible multi-layer printed circuit, or a flexible multi-layer printed circuit board.

The signal cable 30 according to an example embodiment of the present disclosure may include a wiring layer 31, a lower film (or a first film) 32 which is coupled to a first surface of the wiring layer 31 by an adhesive layer 33, an upper film (or a second film) 34 which is coupled to a second surface of the wiring layer 31 by an adhesive layer 35, and a plurality of contact pads and first and second terminals which are disposed on the upper film and connected to the wiring layer 31.

The wiring layer 31 may include a base film, and a plurality of signal lines and first and second driving signal supply lines which are formed on one or more of a front surface (or an upper surface) and a bottom surface (or a lower surface) of the base film. For example, the plurality of signal lines and the first and second driving signal supply lines may include a conductive material which includes copper (Cu), aluminum (Al), silver (Ag), or an alloy material of copper (Cu) and silver (Ag), but embodiments of the present disclosure are not limited thereto. For example, the wiring layer 31 may be referred to as a line, a wire line, a wiring line, a signal line, a metal line, but the terms are not limited thereto.

Each of the plurality of contact pads may be disposed at one of a lower film and an upper film and may be selectively connected to the plurality of signal lines and the first and second driving signal supply lines through a via hole.

The first and second terminals may be electrically connected to first and second pad electrodes of the pad portion 21p provided in the vibration generator, respectively.

The signal generating circuit 40 may be mounted on the signal cable 30 and may be electrically connected to the plurality of contact pads. The signal generating circuit 40 may receive a sound data (or digital sound data), a clock, an enable signal, and various driving voltages, which are supplied from an external sound data generating circuit part through some of the plurality of contact pads. The signal generating circuit 40 may generate first and second vibration driving signals based on the sound data and may output each of the generated first and second vibration driving signals to each of the first and second terminals through a corresponding contact pad and a corresponding driving signal supply line. Accordingly, the vibration generator 20 may vibrate based on the first and second vibration driving signals supplied through the signal line, the first and second terminals, the pad portion 21p, and first and second power supply lines PL1 and PL2 of the signal cable 30 from the signal generating circuit 40 mounted on the signal cable 30.

The signal generating circuit 40 according to an example embodiment of the present disclosure may include a decoding part which receives sound data supplied from the external sound data generating circuit part, an audio amplifier circuit which generates and outputs the first and second vibration driving signals based on the sound data supplied from the decoding part, a memory circuit which stores a setting value of the audio amplifier circuit, a control circuit which controls an operation of each of the decoding part, the audio amplifier circuit, and the memory circuit, and a passive element such as a resistor.

The audio amplifier circuit may include a preamplifier circuit which generates the first and second vibration driving signals based on the sound data and a power amplifier circuit which converts a voltage and/or a current of each of the first and second vibration driving signals into a level suitable for driving of the vibration generator 20, but is not limited thereto.

Each of the decoding part, the audio amplifier circuit, the memory circuit, and the control circuit may be implemented as an integrated circuit (IC) and may be mounted on the signal cable 30.

According to another example embodiment of the present disclosure, the vibration generator 20 may include the signal generating circuit 40 mounted on the signal cable 30, and thus, a connection structure between the vibration generator 20, the signal generating circuit 40, the signal cable 30, and the sound data generating circuit part may be simplified. As the signal generating circuit 40 is disposed adjacent to the vibration generator 20, a filter circuit including an inductor and a capacitor for preventing electromagnetic interference (EMI) occurring due to a length of the signal cable 30 based on a distance between the signal generating circuit 40 and the vibration generator 20 may be omitted.

According to another example embodiment of the present disclosure, in the vibration generator 20 according to another example embodiment of the present disclosure, the signal cable 30 with the signal generating circuit 40 integrated therein or mounted thereon may be applied to the vibration generator 20 described above with reference to one or more of FIGS. 1, 4, and 5. For example, the signal cable 30 and the signal generating circuit 40 are not shown in FIGS. 1, 4, and 5, but in the vibration apparatus of FIGS. 1, 4, and 5, the signal cable 30 of the vibration generator 20 described above with reference to FIG. 13 may include the signal generating circuit 40.

Figure 16:
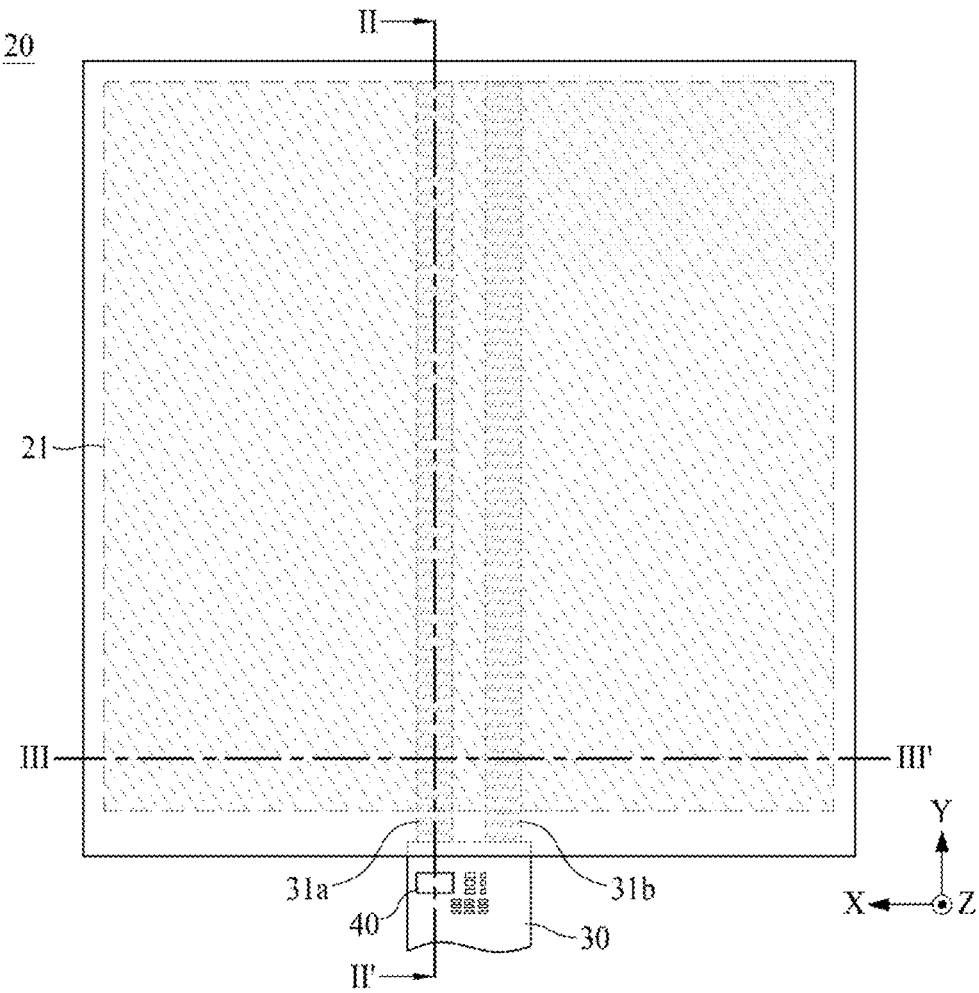
FIG. 16 illustrates a vibration generator according to another example embodiment of the present disclosure.
Figure 17:
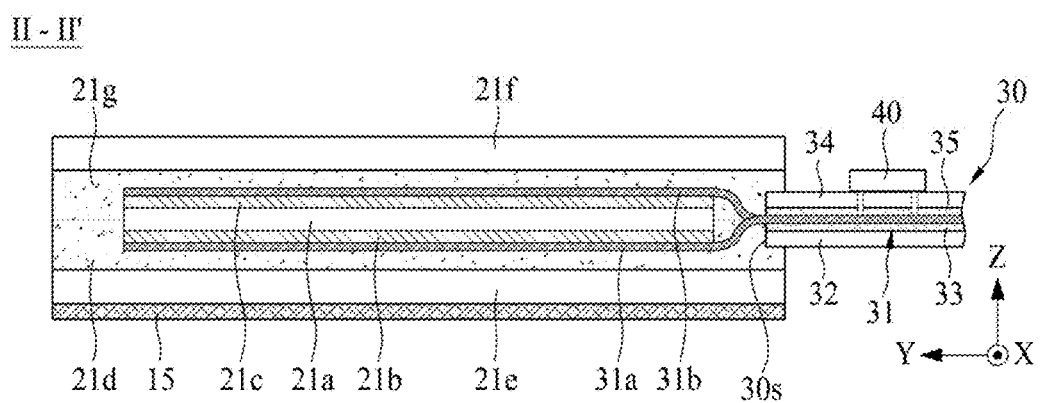
FIG. 17 is an example of a cross-sectional view taken along line II-II' illustrated in FIG. 16.
Figure 18:
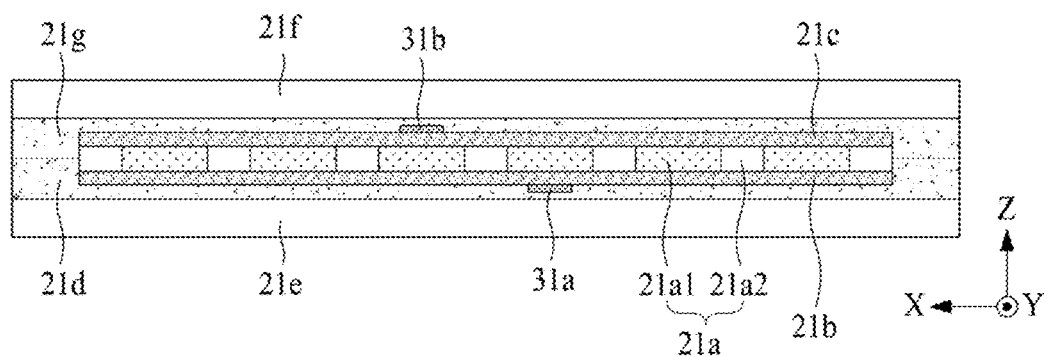
FIG. 18 is an example of a lateral view of a cross-sectional surface taken along line III-III' illustrated in FIG. 16.
Figure 19:
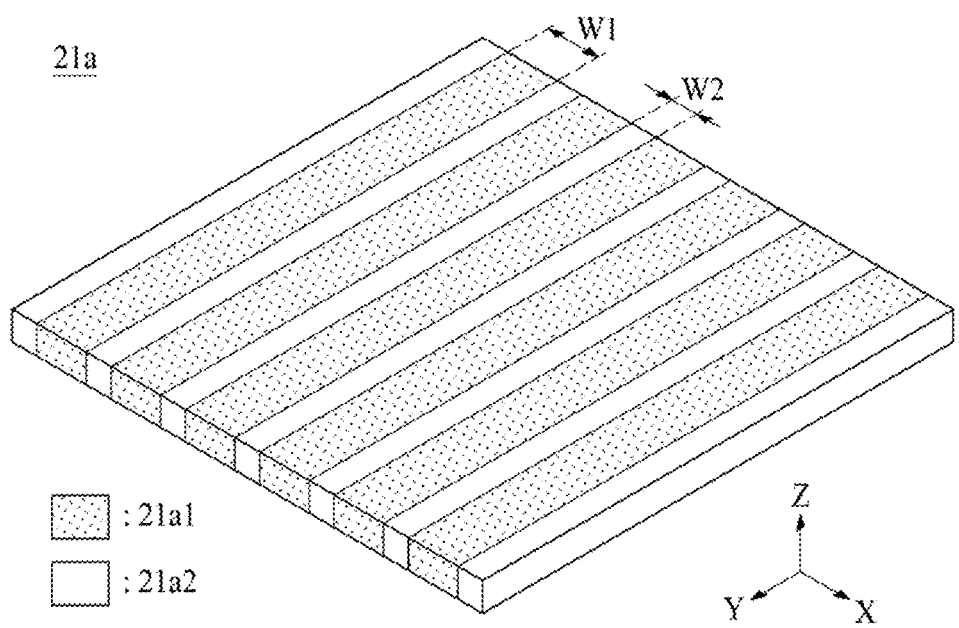
FIG. 19 is an example of a perspective view illustrating a piezoelectric vibration portion illustrated in FIG. 18.

FIG. 16 illustrates a vibration generator according to another example embodiment of the present disclosure, FIG. 17 is an example of a cross-sectional view taken along line II-II' illustrated in FIG. 16, and FIG. 18 is an example of a lateral view of a cross-sectional surface taken along line III-III' illustrated in FIG. 16. FIG. 19 is an example of a perspective view illustrating a piezoelectric vibration portion illustrated in FIG. 18. FIG. 16 illustrates an example embodiment implemented by modifying a connection structure between the electrode portion and the signal cable illustrated in FIG. 14.

Referring to FIGS. 16 to 19, the vibration generator 20 according to another example embodiment of the present disclosure may include a vibration generating portion and a signal cable 30.

A vibration structure may include a piezoelectric vibration portion 21a, a first electrode portion 21b, and a second electrode portion 21c. The vibration structure may be substantially the same as the vibration structure 21 of the vibration generator 20 described above with reference to FIG. 1, and thus, like reference numerals refer to like elements and their repeated descriptions may be omitted for brevity.

The signal cable 30 may be electrically connected to the first and second electrode portions 21b and 21c at one side of the vibration generator 20, and thus, may be integrated into the vibration structure. For example, the signal cable 30 may be electrically and directly connected to the first and second electrode portions 21b and 21c.

The signal cable 30 according to an example embodiment of the present disclosure may include first and second protrusion lines 31a and 31b. For example, the first protrusion line 31a may overlap at least a portion of the first electrode portion 21b and may be electrically connected, or may be electrically and directly connected to the first electrode portion 21b. The second protrusion line 31b may overlap at least a portion of the second electrode portion 21c and may be electrically connected, or may be electrically and directly connected to the second electrode portion 21c. For example, each of the first and second protrusion lines 31a and 31b may be bent toward a corresponding electrode portion of the first and second electrode portions 21b and 21c, but embodiment of the present disclosure are not limited thereto. For example, each of the first and second protrusion lines 31a and 31b may be referred to as a term such as a power supply line, a conductive line, a protrusion electrode, an extension line, an extension electrode, a finger line, or a finger electrode, but the terms are not limited thereto.

The signal cable 30 according to an example embodiment of the present disclosure may include a body portion, the first and second protrusion lines 31a and 31b, and a signal generating circuit 40.

The body portion may be configured as a flexible printed circuit cable, a flexible flat cable, a single-sided flexible printed circuit, a single-sided flexible printed circuit board, a flexible multi-layer printed circuit, or a flexible multi-layer printed circuit board, but embodiments of the present disclosure are not limited thereto.

The body portion according to an example embodiment of the present disclosure may include a wiring layer 31, a lower film (or a first film) 32 which is coupled or connected to a first surface of the wiring layer 31 by a first adhesive layer 33, an upper film (or a second film) 34 which is coupled or connected to a second surface of the wiring layer 31 by a second adhesive layer 35, and a plurality of contact pads which are disposed on the upper film 34 and are connected to the wiring layer 31.

The wiring layer 31 may include a base film, and moreover, may include a plurality of signal lines and first and second driving signal supply lines, or the like, which are formed on one or more of a front surface and a bottom surface of the base film. For example, the plurality of signal lines and the first and second driving signal supply lines may include a conductive material which includes copper (Cu), aluminum (Al), silver (Ag), or an alloy material of copper (Cu) and silver (Ag), but embodiments of the present disclosure are not limited thereto.

Each of the plurality of contact pads may be disposed at one of a lower film and an upper film and may be selectively connected to the plurality of signal lines and the first and second driving signal supply lines through a via hole.

The first and second protrusion lines 31a and 31b may be electrically connected to the first and second driving signal supply lines disposed in the wiring layer 31, or may pass through one lateral surface 30s of the body portion from the first and second driving signal supply lines and may extend or protrude to the outside. Each of the first and second protrusion lines 31a and 31b may protrude to have a certain length from the one lateral surface 30s of the body portion. For example, each of the first and second protrusion lines 31a and 31b may extend or protrude in a second direction Y from the one lateral surface 30s of the body portion to have a length overlapping at least a portion of each of the first and second electrode portions 21b and 21c.

The first protrusion line 31a may be bent to the first electrode portion 21b from the one lateral surface 30s of the body portion (or one side of the vibration generator 20) and may be electrically connected to at least a portion of the first electrode portion 21b. For example, the first protrusion line 31a may be electrically and directly connected to and contact at least a portion of the first electrode portion 21b. For example, the first protrusion line 31a may be electrically connected to the first electrode portion 21b by a conductive member such as a conductive ball or a conductive double-sided tape, or the like.

The second protrusion line 31b may be bent to the second electrode portion 21c from one lateral surface 30s of the body portion (or one side (or one portion) of the vibration generator 20) and may be electrically connected to at least a portion of the second electrode portion 21c. For example, the second protrusion line 31b may be electrically and directly connected to, or contact, at least a portion of the second electrode portion 21c. For example, the second protrusion line 31b may be electrically connected to the second electrode portion 21c by a conductive member such as a conductive ball or a conductive double-sided tape, or the like.

The signal generating circuit 40 may be mounted on the signal cable 30 and may be electrically connected to the plurality of contact pads. The signal generating circuit 40 may receive sound data (or digital sound data), a clock, an enable signal, and various driving voltages, which are supplied from the external sound data generating circuit part through some of the plurality of contact pads. The signal generating circuit 40 may generate first and second vibration driving signals based on the sound data and may output each of the generated first and second vibration driving signals to each of the first and second terminals through a corresponding contact pad and a corresponding driving signal supply line. Accordingly, the vibration generator 20 may vibrate based on the first and second vibration driving signals supplied through the signal line, the first and second power supply lines, and the first and second protrusion lines 31a and 31b of the signal cable 30 from the signal generating circuit 40 mounted on the signal cable 30.

The signal generating circuit 40 according to an example embodiment of the present disclosure may include a decoding part, an audio amplifier circuit, a memory circuit, a control circuit, and a passive element such as a resistor. The elements of the signal generating circuit 40 may be substantially the same as the elements of the signal generating circuit 40 described above, and thus, like reference numerals refer to like elements and their repeated descriptions may be omitted for brevity.

The signal cable 30 according to an example embodiment of the present disclosure may directly supply a vibration driving signal to each of the first and second electrode portions 21b and 21c through each of the first and second protrusion lines 31a and 31b, and thus, voltage drop based on a surface resistance characteristic of each of the first and second electrode portions 11b and 11c may decrease, an electrical characteristic of each of the first and second electrode portions 21b and 21c may be complemented, and the degree of selection freedom of a conductive material used in the first and second electrode portions 21b and 21c may increase.

The vibration generator 20 according to another example embodiment of the present disclosure may further include a first cover member 21e and a second cover member 21f.

The first cover member 21e may be disposed on a first surface of the vibration generator 20. For example, the first cover member 21e may be configured to cover the first protrusion line 31a of the signal cable 30 and the first electrode portion 21b. Accordingly, the first cover member 21e may protect the first protrusion line 31a of the signal cable 30 and the first electrode portion 21b and may electrically connect the first protrusion line 31a of the signal cable 30 to the first electrode portion 21b, or may maintain an electrical connection state between the first protrusion line 31a of the signal cable 30 and the first electrode portion 21b.

The second cover member 21f may be disposed on a second surface of the vibration generator 20. For example, the second cover member 21f may be configured to cover the second protrusion line 31b of the signal cable 30 and the second electrode portion 21c. Accordingly, the second cover member 21f may protect the second protrusion line 31b of the signal cable 30 and the second electrode portion 21c, and may electrically connect the second protrusion line 31b of the signal cable 30 to the second electrode portion 21c or may maintain an electrical connection state between the second protrusion line 31b of the signal cable 30 and the second electrode portion 21c.

Each of the first and second cover members 21e and 21f according to an example embodiment of the present disclosure may include one or more materials of a plastic, a fiber, and wood, but embodiments of the present disclosure are not limited thereto. For example, the first and second cover members 21e and 21f may include the same material or different materials. For example, each of the first and second cover members 21e and 21f may be a polyimide film or a polyethylene terephthalate film, but embodiments of the present disclosure are not limited thereto.

The first cover member 21e according to an example embodiment of the present disclosure may be connected or coupled to the first protrusion line 31a of the signal cable 30 and the first electrode portion 21b by a first adhesive layer 21d. For example, the first cover member 21e may be connected or coupled to the first protrusion line 31a of the signal cable 30 and the first electrode portion 21b by a film process using the first adhesive layer 21d. Accordingly, the first protrusion line (or a first finger line) 31a of the signal cable 30 may be disposed between the first electrode portion 21b and the first cover member 21e and may be provided as one body (or an integration structure) with the vibration generator 20.

The second cover member 21f according to an example embodiment of the present disclosure may be connected or coupled to the second protrusion line 31b of the signal cable 30 and the second electrode portion 21c by a second adhesive layer 21g. For example, the second cover member 21f may be connected or coupled to the second protrusion line 31b of the signal cable 30 and the second electrode portion 21c by a film laminating process using the second adhesive layer 21g. Accordingly, the second protrusion line (or a second finger line) 31b of the signal cable 30 may be disposed between the second electrode portion 21c and the second cover member 21f and may be provided as one body (or an integration structure) with the vibration generator 20.

Each of the first and second cover members 21e and 21f according to an example embodiment of the present disclosure may not include or need a pad portion and a power supply line for receiving the vibration driving signal from the signal cable 30, and thus, may be an insulation film or a protection film for protecting the piezoelectric vibration portion 21a and the first and second electrode portions 21b and 21c. For example, each of the first and second cover members 21e and 21f may be a polyimide film or a polyethylene terephthalate film, but embodiments of the present disclosure are not limited thereto.

Each of the first and second cover members 21e and 21f according to another example embodiment of the present disclosure may be electrically insulated from the first and second electrode portions 21b and 21c by the first and second adhesive layers 21d and 21g, and thus, one or more of the first and second cover members 21e and 21f may include a metal film or a metal plate. Each of the first and second cover members 21e and 21f including a metal material may reinforce a mass of the vibration generator 20 or the piezoelectric vibration portion 21a to decrease a resonance frequency of the vibration generator 20 based on an increase in mass, thereby increasing a sound characteristic and/or a sound pressure level characteristic of a low-pitched sound band generated based on a vibration of the vibration generator 20 or the piezoelectric vibration portion 21a. For example, each of the first and second cover members 21e and 21f including a metal material may include one or more materials of stainless steel, aluminum (Al), an aluminum (Al) alloy, magnesium (Mg), a magnesium (Mg) alloy, and a magnesium-lithium (Mg—Li) alloy, but embodiments of the present disclosure are not limited thereto.

According to an example embodiment of the present disclosure, the first and second adhesive layers 21d and 21g may include an electrically insulating material capable of compression and decompression. For example, each of the first and second adhesive layers 21d and 21g may include an epoxy resin, an acrylic resin, a silicone resin, or a urethane resin, but embodiments of the present disclosure are not limited thereto.

In another example, at least a portion of the signal cable 30 may be disposed or inserted (or accommodated) between the first cover member 21e and the second cover member 21f. For example, each of the one side surface (or a portion or a one portion) 30s of the body portion of the signal cable 30 (or one edge portion of the body portion or a periphery portion of the body portion) and the first and second protrusion lines 31a and 31b may be disposed or inserted (or accommodated) between the first cover member 21e and the second cover member 21f. For example, each of the one side surface 30s of the body portion of the signal cable 30 and the first and second protrusion lines 31a and 31b may be accommodated or inserted into the vibration generator 20. Therefore, at least a portion of each of the signal cable 30 and the first and second protrusion lines 31a and 31b may not be exposed at the outside of each of the first cover member 21e and the second cover member 21f, and thus, a short circuit (or a short) of the first and second protrusion lines 31a and 31b caused by a stress such as the movement or bending of the signal cable 30 may be prevented.

As described above, in the vibration generator 20 according to another example embodiment of the present disclosure, a patterning process of forming the power supply line and the pad portion in the first and second cover members 21e and 21f and a soldering process between the pad portion and the signal cable 30 may not be needed based on an integration structure between the first and second electrode portions 21b and 21c and the signal cable 30, and thus, a structure and a manufacturing process may be simplified. In addition, in the vibration generator 20 according to another example embodiment of the present disclosure, the vibration driving signal may be directly supplied to the first and second electrode portions 21b and 21c through the protrusion lines 31a and 31b protruding from the signal cable 30, and thus, an electrical characteristic of each of the first and second electrode portions 21b and 21c may be complemented. In addition, because the vibration generator 20 according to another example embodiment of the present disclosure includes the signal generating circuit 40 mounted on the signal cable 30, a connection structure between the vibration generator 20, the sound generating circuit 40, the signal cable 30, and the sound data generating circuit part may be simplified, and as the signal generating circuit 40 is disposed adjacent to the vibration generator 20, a filter circuit including an inductor and a capacitor for preventing electromagnetic interference (EMI) occurring due to a length of the signal cable 30 based on a distance between the signal generating circuit 40 and the vibration generator 20 may be omitted.

Referring to FIGS. 18 and 19, a vibration device 21 according to an example embodiment of the present disclosure may be referred to as a term such as a flexible vibration structure, a flexible vibrator, a flexible vibration generating device, a flexible vibration generator, a flexible sounder, a flexible sound device, a flexible sound generating device, a flexible sound generator, a flexible actuator, a flexible speaker, a flexible piezoelectric speaker, a film actuator, a film-type piezoelectric composite actuator, a film speaker, a film-type piezoelectric speaker, or a film-type piezoelectric composite speaker, but the terms are not limited thereto.

The vibration device 21 according to an example embodiment of the present disclosure may include a vibration generating portion which includes a piezoelectric vibration portion 21a, a first electrode portion 21b, and a second electrode portion 21c.

The piezoelectric vibration portion 21a may include a piezoelectric material (or an electroactive material) having a piezoelectric effect. For example, the piezoelectric material may have a characteristic in that when pressure or twisting is applied to a crystalline structure by an external force, a potential difference occurs due to dielectric polarization caused by a relative position change of a positive (+) ion and a negative (−) ion, and a vibration is generated by an electric field based on a voltage applied thereto. The piezoelectric vibration portion 21a may be referred to as a term such as a vibration layer, a piezoelectric layer, a piezoelectric material layer, an electroactive layer, a vibration portion, a piezoelectric material portion, an electroactive portion, a piezoelectric structure, a piezoelectric composite layer, a piezoelectric composite, or a piezoelectric ceramic composite, but the terms are not limited thereto. The piezoelectric vibration portion 21a may include a transparent conductive material, a semitransparent conductive material, or an opaque conductive material and the piezoelectric vibration portion 21a may be transparent, semitransparent, or opaque.

The piezoelectric vibration portion 21a according to an example embodiment of the present disclosure may include a plurality of first portions 21a1 and a plurality of second portions 21a2. For example, the plurality of first portions 21a1 and the plurality of second portions 21a2 may be alternately and repeatedly arranged in a first direction X (or a second direction Y). For example, the first direction X may be a widthwise direction of the piezoelectric vibration portion 21a and the second direction Y may be a lengthwise direction of the piezoelectric vibration portion 21a, but embodiments of the present disclosure are not limited thereto. In another example embodiment of the present disclosure, the first direction X may be a lengthwise direction of the piezoelectric vibration portion 21a, and the second direction Y may be a widthwise direction of the piezoelectric vibration portion 21a.

Each of the plurality of first portions 21a1 may include a ceramic-based material for implementing a relatively high vibration, or may include a piezoelectric ceramic having a perovskite crystalline structure. The perovskite crystalline structure may have a piezoelectric effect and an inverse piezoelectric effect, and may be a plate-shaped structure having orientation. The perovskite crystalline structure may be represented by a chemical formula "$ABO_3$." In the chemical formula, "A" may include a divalent metal element, and "B" may include a tetravalent metal element. For example, in the chemical formula "$ABO_3$," "A" and "B" may be cations, and "O" may be anions. For example, the first portions 21a1 may include one or more of lead (II) titanate ($PbTiO_3$), lead zirconate ($PbZrO_3$), lead zirconate titanate ($PbZrTiO_3$), barium titanate ($BaTiO_3$), and strontium titanate ($SrTiO_3$), but embodiments of the present disclosure are not limited thereto.

The piezoelectric vibration portion 21a according to an example embodiment of the present disclosure may include a lead zirconate titanate (PZT)-based material, including lead (Pb), zirconium (Zr), and titanium (Ti), or may include a lead zirconate nickel niobate (PZNN)-based material, including lead (Pb), zirconium (Zr), nickel (Ni), and niobium (Nb), but embodiments of the present disclosure are not limited thereto. In addition, the piezoelectric vibration portion 21a may include at least one or more among calcium titanate ($CaTiO_3$), $BaTiO_3$, and $SrTiO_3$, without Pb, but embodiments of the present disclosure are not limited thereto.

Each of the plurality of first portions 21a1 according to an example embodiment of the present disclosure may be disposed between the plurality of second portions 21a2 and may have a first width W1 parallel to the first direction X (or the second direction Y) and a length parallel to the second direction Y (or the first direction X). Each of the plurality of second portions 21a2 may have a second width W2 parallel to the first direction X (or the second direction Y) and a length parallel to the second direction Y (or the first direction X). The first width W1 may be the same as or different from the second width W2. For example, the first width W1 may be greater than the second width W2. For example, the first portion 21a1 and the second portion 21a2 may include a line shape or a stripe shape having the same size or different sizes. Accordingly, the piezoelectric vibration portion 21a may have a 2-2 composite structure having a piezoelectric characteristic of a 2-2 type vibration mode and may have a resonance frequency of 20 kHz or less, but embodiments of the present disclosure are not limited thereto. For example, the resonance frequency of the piezoelectric vibration portion 21a may vary based on at least one or more of a shape, a length, or a thickness.

In the piezoelectric vibration portion 21a, the plurality of first portions 21a1 and the plurality of second portions 21a2 may be disposed (or arranged) in parallel on the same plane (or the same layer). Each of the plurality of second portions 21a2 may be configured to fill a gap between two adjacent first portions 21a1 and may be connected or adhered to an adjacent first portion 21a1. Accordingly, the piezoelectric vibration portion 21a may extend up to a desired size or length based on a lateral connection (or coupling) between the first portion 21a1 and the second portion 21a2.

In the piezoelectric vibration portion 21a, the width W2 of each of the plurality of second portions 21a2 may decrease progressively in a direction from a center portion of the piezoelectric vibration portion 21a or the vibration device 21 to both edge portions (or both ends or both periphery portions) thereof.

According to an example embodiment of the present disclosure, when the piezoelectric vibration portion 21a or the vibration device 21 vibrates in a vertical direction Z (or a thickness direction), a second portion 21a2 having a largest width W2 among the plurality of second portions 21a2 may be disposed at a portion on which a relatively largest stress concentrates. When the piezoelectric vibration portion 21a or the vibration device 21 vibrates in the vertical direction Z, a second portion 21a2 having a smallest width W2 among the plurality of second portions 21a2 may be disposed at a portion where a relatively smallest stress occurs. For example, the second portion 21a2 having the largest width W2 among the plurality of second portions 21a2 may be disposed at a center portion of the piezoelectric vibration portion 21a, and the second portion 21a2 having the smallest width W2 among the plurality of second portions 21a2 may be disposed at both edge portions (or both periphery portions) of the piezoelectric vibration portion 21a. Accordingly, when the piezoelectric vibration portion 21a or the vibration device 21 vibrates in the vertical direction Z, an overlap of a resonance frequency or interference of a sound wave occurring at a portion on which a largest stress concentrates may be minimized, and thus, a dip of a sound pressure level occurring in a low-pitched sound band may be reduced, and the flatness of a sound characteristic may be improved in the low-pitched sound band.

In the piezoelectric vibration portion 21a, the plurality of first portions 21a1 may have different sizes (or widths). For example, a size (or a width) of each of the plurality of first portions 21a1 may decrease or increase progressively in a direction from the center portion of the piezoelectric vibration portion 21a or the vibration device 21 to both edge portions (or both ends or both periphery portions) thereof. In this case, a sound pressure level characteristic of a sound of the piezoelectric vibration portion 21a may be enhanced by various natural vibration frequencies based on vibrations of the plurality of first portions 21a1 having different sizes, and a reproduction band of a sound may extend.

Each of the plurality of second portions 21a2 may be disposed between the plurality of first portions 21a1. Therefore, in the piezoelectric vibration portion 21a or the vibration device 21, vibration energy based on a link in a unit lattice of the first portion 21a1 may be increased by the second portion 21a2, and thus, a vibration characteristic may increase and a piezoelectric characteristic and flexibility may be secured. For example, the second portion 21a2 may include one of an epoxy-based polymer, an acrylic-based polymer, and a silicone-based polymer, but embodiments of the present disclosure are not limited thereto.

Each of the plurality of second portions 21a2 according to an example embodiment of the present disclosure may be configured with an organic material portion. For example, the organic material portion may be disposed between two adjacent inorganic material portions, and thus, may absorb an impact applied to the inorganic material portion (or the first portion) and may release a stress concentrating on the inorganic material portion, thereby enhancing the durability of the piezoelectric vibration portion 21a or the vibration device 21 and realizing the flexibility of the piezoelectric vibration portion 21a or the vibration device 21.

The second portion 21a2 according to an example embodiment of the present disclosure may have a modulus and a viscoelasticity that are lower than those of the first portion 21a1, and thus, the second portion 21a2 may enhance the reliability of the first portion 21a1 vulnerable to an impact due to a fragile characteristic of the first portion 21a1. For example, the second portion 21a2 may include a material having a loss coefficient of about 0.01 to about 1 and a modulus of about 0.1 GPa (Giga Pascal) to about 10 GPa (Giga Pascal).

The organic material portion included in the second portion 21a2 may include an organic material, an organic polymer, an organic piezoelectric material, or an organic non-piezoelectric material having a flexible characteristic compared to the inorganic material portion which is the first portion 21a1. For example, the second portion 21a2 may be referred to as an adhesive portion, a stretch portion, a bending portion, a damping portion, a flexible portion, or a ductile portion, or the like, but embodiments of the present disclosure are not limited thereto.

The plurality of first portions 21a1 and the plurality of second portions 21a2 may be disposed on (or connected to) the same plane, and thus, the piezoelectric vibration portion 21a according to an example embodiment of the present embodiment may be formed of a single thin film. For example, the piezoelectric vibration portion 21a may have a structure where the plurality of first portions 21a1 are connected to one side thereof. For example, the piezoelectric vibration portion 21a may have a structure where the plurality of first portions 21a1 are connected in all of the piezoelectric vibration portion 21a. For example, the piezoelectric vibration portion 21a may be vibrated in a vertical direction by the first portion 21a1 having a vibration characteristic, and may be bent in a curved shape by the second portion 21a2 having flexibility. In addition, in the piezoelectric vibration portion 21a according to an example embodiment of the present embodiment, a size of the first portion 21a1 and a size of the second portion 21a2 may be adjusted based on a piezoelectric characteristic and flexibility needed for the piezoelectric vibration portion 21a or the vibration device 21. For example, in the piezoelectric vibration portion 21a requiring a piezoelectric characteristic rather than flexibility, a size of the first portion 21a1 may be adjusted to be greater than that of the second portion 21a2. As another example, in the piezoelectric vibration portion 21a requiring flexibility rather than a piezoelectric characteristic, a size of the second portion 21a2 may be adjusted to be greater than that of the first portion 21a1. Accordingly, a size of the piezoelectric vibration portion 21a may be adjusted based on a desired characteristic, and the piezoelectric vibration portion 21a may be easily designed.

The first electrode portion 21b may be disposed at a first surface (or an upper surface) of the piezoelectric vibration portion 21a. The first electrode portion 21b may be disposed at or coupled to a first surface of each of the plurality of first portions 21a1 and a first surface of each of the plurality of second portions 21a2 in common, and may be electrically connected to a first surface of each of the plurality of first portions 21a1. For example, the first electrode portion 21b may have a common electrode (or a single electrode or a single-body electrode) shape where the first electrode portion 21b is disposed on the entire first surface of the piezoelectric vibration portion 21a. For example, the first electrode portion 21b may have substantially the same shape as that of the piezoelectric vibration portion 21a, but embodiments of the present disclosure are not limited thereto.

The first electrode portion 21b according to an example embodiment of the present disclosure may include a transparent conductive material, a semitransparent conductive material, or an opaque conductive material. For example, the transparent conductive material or the semitransparent conductive material may include ITO (indium tin oxide) or IZO (indium zinc oxide), but embodiments of the present disclosure are not limited thereto. The opaque conductive material may include aluminum (Al), copper (Cu), gold (Au), silver (Ag), molybdenum (Mo), magnesium (Mg), or an alloy thereof, but embodiments of the present disclosure are not limited thereto.

The second electrode portion 21c may be disposed on the second surface (or a rear surface), which is opposite to or different from the first surface, of the piezoelectric vibration portion 21a. The second electrode portion 21c may be disposed at or coupled to a second surface of each of the plurality of first portions 21a1 and a second surface of each of the plurality of second portions 21a2 in common and may be electrically connected to a second surface of each of the plurality of first portions 21a1. For example, the second electrode portion 21c may have a common electrode (or a single electrode or a single-body electrode) shape where the second electrode portion 21c is disposed on the entire second surface of the piezoelectric vibration portion 21a. For example, the second electrode portion 21c may have substantially the same shape as that of the piezoelectric vibration portion 21a, but embodiments of the present disclosure are not limited thereto. The second electrode portion 21c according to an example embodiment of the present disclosure may include a transparent conductive material, a semitransparent conductive material, or an opaque conductive material. For example, the second electrode portion 21c may include the same material as that of the first electrode portion 21b, but embodiments of the present disclosure are not limited thereto. In another example embodiment of the present disclosure, the second electrode portion 21c may include a material which differs from that of the first electrode portion 21b.

The piezoelectric vibration portion 21a may be polarized (or poling) by a certain voltage applied to the first electrode portion 21b and the second electrode portion 21c in a certain temperature atmosphere, or in a temperature atmosphere that may be changed from a high temperature to a room temperature, but embodiments of the present disclosure are not limited thereto. For example, the piezoelectric vibration portion 21a may alternately and repeatedly contract and expand based on an inverse piezoelectric effect based on a sound signal (or a voice signal) applied from the outside to the first electrode portion 21b and the second electrode portion 21c, and thus, may vibrate. For example, the piezoelectric vibration portion 21a may vibrate based on a vertical-direction vibration and a plane-direction (or a planar direction) vibration by the first electrode portion 21b and the second electrode portion 21c. A displacement of a vibration member (or a vibration plate or a vibration object) may increase based on the plane-direction contraction and expansion of the piezoelectric vibration portion 21a, and thus, a vibration may be further enhanced.

The vibration device 21 according to an example embodiment of the present disclosure may further include a first cover member 21e and a second cover member 21f.

The first cover member 21e may be disposed at a first surface of the vibration device 21. For example, the first cover member 21e may be configured to cover the first electrode portion 21b. Accordingly, the first cover member 21e may protect the first electrode portion 21b.

The second cover member 21f may be disposed at a second surface of the vibration device 21. For example, the second cover member 21f may be configured to cover the second electrode portion 21c. Accordingly, the second cover member 21f may protect the second electrode portion 21c.

Each of the first and second cover members 21e and 21f according to an example embodiment of the present disclosure may include one or more materials of a plastic, a fiber, and wood, but embodiments of the present disclosure are not limited thereto. For example, the first and second cover members 21e and 21f may include the same material or different materials. For example, each of the first and second cover members 21e and 21f may be a polyimide film or a polyethylene terephthalate film, but embodiments of the present disclosure are not limited thereto.

The first cover member 21e according to an example embodiment of the present disclosure may be connected or coupled to the first electrode portion 21b by a first adhesive layer 21d. For example, the first cover member 21e may be connected or coupled to the first electrode portion 21b by a film laminating process by the first adhesive layer 21d.

The second cover member 21f according to an example embodiment of the present disclosure may be connected or coupled to the second electrode portion 21c by a second adhesive layer 21g. For example, the second cover member 21f may be connected or coupled to the second electrode portion 21c by a film laminating process by the second adhesive layer 21g.

The first adhesive layer 21d may be disposed between the first electrode portion 21b and the first cover member 21e. The second adhesive layer 21g may be disposed between the second electrode portion 21c and the second cover member 21f. For example, the first adhesive layer 21d and the second adhesive layer 21g may be configured between the first cover member 21e and the second cover member 21f to fully (or completely) surround the piezoelectric vibration portion 21a, the first electrode portion 21b, and the second electrode portion 21c. For example, the piezoelectric vibration portion 21a, the first electrode portion 21b, and the second electrode portion 21c may be buried or embedded between the first adhesive layer 21d and the second adhesive layer 21g.

Each of the first and second adhesive layers 21d and 21g according to an example embodiment of the present disclosure may include an electrically insulating material capable of compression and decompression. For example, each of the first and second adhesive layers 21d and 21g may include an epoxy resin, an acrylic resin, a silicone resin, or a urethane resin, but embodiments of the present disclosure are not limited thereto.

One of the first cover member 21e and the second cover member 21f may be attached on or coupled to a vibration member (or a vibration plate or a vibration object) by a connection member.

According to an example embodiment of the present disclosure, one of the first cover member 21e and the second cover member 21f may be attached on or coupled to a vibration member (or a vibration plate or a vibration object) by a connection member. For example, one of the first cover member 21e and the second cover member 21f may be attached on or coupled to a vibration member (or a vibration plate or a vibration object) by the connection member 15 as described or illustrated above with reference to, for example, FIGS. 1, 2, 4, 5, and 13.

Referring back to FIGS. 13, 14, and 15, the vibration device 21 according to an example embodiment of the present disclosure may include a piezoelectric vibration portion 21a, a first electrode portion 21b, and a second electrode portion 21c. The vibration device 21 may further include a first power supply line PL1 disposed in the first cover member 21e, a second power supply line PL2 disposed in the second cover member 21f, and a pad portion 21p electrically connected to the first power supply line PL1 and the second power supply line PL2.

The first power supply line PL1 may be disposed between the first electrode portion 21b and the first cover member 21e and may be electrically connected to the first electrode portion 21b. The first power supply line PL1 may extend long in the second direction Y and may be electrically connected to a center portion of the first electrode portion 21b. In an example embodiment of the present disclosure, the first power supply line PL1 may be electrically connected to the first electrode portion 21b by an anisotropic conductive film. In another example embodiment of the present disclosure, the first power supply line PL1 may be electrically connected to the first electrode portion 21b by a conductive material (or a particle) included in the first adhesive layer 21d.

The second power supply line PL2 may be disposed between the second electrode portion 21c and the second cover member 21f and may be electrically connected to the second electrode portion 21c. The second power supply line PL2 may extend long in the second direction Y and may be electrically connected to a center portion of the second electrode portion 21c. In an example embodiment of the present disclosure, the second power supply line PL2 may be electrically connected to the second electrode portion 21c by an anisotropic conductive film. In another example embodiment of the present disclosure, the second power supply line PL2 may be electrically connected to the second electrode portion 21c by a conductive material (or a particle) included in the second adhesive layer 21g.

The pad portion 21p may be provided at one edge portion (or one periphery portion) of one of the first cover member 21e and the second cover member 21f so as to be electrically connected to one side (or one end or one portion) of each of the first power supply line PL1 and the second power supply line PL2.

The pad portion 21p according to an example embodiment of the present disclosure may include a first pad electrode which is electrically connected to one end (or one portion) of the first power supply line PL1 and a second pad electrode which is electrically connected to one end (or one portion) of the second power supply line PL2.

The first pad electrode may be disposed at one edge portion (or one periphery portion) of one of the first cover member 21e and the second cover member 21f and may be electrically connected to the one end (or the one portion) of the first power supply line PL1. For example, the first pad electrode may pass through one of the first cover member 21e and the second cover member 21f and may be electrically connected to the one end (or the one portion) of the first power supply line PL1.

The second pad electrode may be disposed in parallel with the first pad electrode and may be electrically connected to one end (or one portion) of the second power supply line PL2. For example, the second pad electrode may pass through one of the first cover member 21e and the second cover member 21f and may be electrically connected to the one end (or the one portion) of the second power supply line PL2.

According to an example embodiment of the present disclosure, each of the first power supply line PL1, the second power supply line PL2, and the pad portion 21p may be configured to be a transparent, a semitransparent, or an opaque.

The pad portion 21p according to an example embodiment of the present disclosure may be electrically connected to the signal cable 30.

The signal cable 30 may be electrically connected to the pad portion 21p disposed in the vibration device 21 and may supply the vibration device 21 with a vibration driving signal (or a sound signal) provided from a sound processing circuit. The signal cable 30 according to an example embodiment of the present disclosure may include a first terminal electrically connected to a first pad electrode of the pad portion 21p and a second terminal electrically connected to a second pad electrode of the pad portion 21p. For example, the signal cable 30 may be configured as a double-sided flexible printed circuit, but embodiments of the present disclosure are not limited thereto, and may be configured as a flexible printed circuit cable, a flexible flat cable, a single-sided flexible printed circuit, a single-sided flexible printed circuit board, a flexible multi-layer printed circuit, or a flexible multi-layer printed circuit board.

The sound processing circuit may generate an alternating current (AC) vibration driving signal including a first vibration driving signal and a second vibration driving signal based on sound data provided from the external sound data generating circuit part. The first vibration driving signal may be one of a positive (+) vibration driving signal and a negative (−) vibration driving signal, and the second vibration driving signal may be one of the positive (+) vibration driving signal and the negative (−) vibration driving signal. For example, the first vibration driving signal may be supplied to the first electrode portion 21b through the first terminal of the signal cable 30, the first pad electrode of the pad portion 21p, and the first power supply line PL1. The second vibration driving signal may be supplied to the second electrode portion 21c through the second terminal of the signal cable 30, the second pad electrode of the pad portion 21p, and the second power supply line PL2.

According to an example embodiment of the present disclosure, the signal cable 30 may be configured to be a transparent, a semitransparent, or an opaque.

As described above, the vibration device 21 according to an example embodiment of the present disclosure may be implemented in a thin film shape because the first portion 21a1 having a piezoelectric characteristic and the second portion 21a2 having flexibility are alternately and repeatedly connected to each other, and thus, may be bent in a shape corresponding to a shape of a vibration member or a vibration object. For example, when the vibration device 21 is connected or coupled to a vibration member including various curved portions by a connection member, the vibration device 21 may be bent in a curved shape along a shape of a curved portion of the vibration member, and despite being bent in a curved shape, reliability may not be reduced like a damage or a breakdown. In addition, the vibration device 21 according to an example embodiment of the present disclosure may have a modulus which is greater than the connection member 15, and thus, may easily vibrate the vibration member including the various curved portions. Accordingly, the reliability of sound reproduction may be enhanced, and a sound characteristic and/or a sound pressure level characteristic in a low-pitched sound band generated based on a vibration of the vibration member may be enhanced.

FIGS. 20A to 20D are examples of perspective views illustrating a piezoelectric vibration portion according to another example embodiment of the present disclosure, in a vibration device according to an example embodiment of the present disclosure.

Figure 20A:
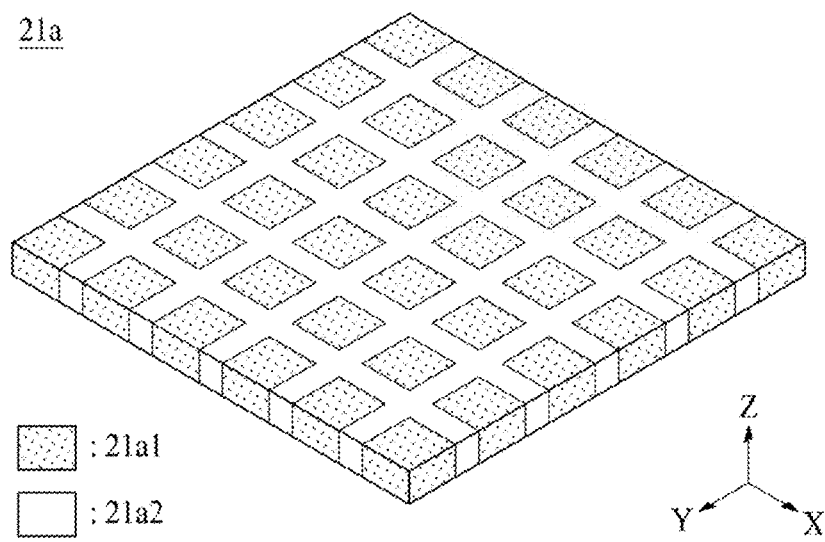
FIGS. 20A to 20D are examples of perspective views illustrating a piezoelectric vibration portion of a vibration device according to another example embodiment of the present disclosure.

Referring to FIG. 20A, a piezoelectric vibration portion 21a according to another example embodiment of the present disclosure may include a plurality of first portions 21a1 which are spaced apart from one another in a first direction X and a second direction Y and a second portion 21a2 disposed between the plurality of first portions 21a1.

The plurality of first portions 21a1 may be disposed apart from one another in each of the first direction X and the second direction Y. For example, the plurality of first portions 21a1 may have a hexahedral shape having the same size and may be arranged in a lattice shape. Each of the plurality of first portions 21a1 may include substantially the same piezoelectric material as that of the first portion 21a1 described above with reference to FIG. 19, and thus, like reference numerals refer to like elements and their repeated descriptions may be omitted for brevity.

The second portion 21a2 may be disposed between the plurality of first portions 21a1 in each of the first direction X and the second direction Y. The second portion 21a2 may be configured to fill a gap between two adjacent first portions 21a1 or to surround each of the plurality of first portions 21a1, and thus, may be connected to or attached on an adjacent first portion 21a1. According to an example embodiment of the present disclosure, a width of a second portion 21a2 disposed between two first portions 21a1 adjacent to each other in the first direction X may be the same as or different from that of the first portion 21a1, and a width of a second portion 21a2 disposed between two first portions 21a1 adjacent to each other in the second direction Y may be the same as or different from that of the first portion 21a1. The second portion 21a2 may include substantially the same organic material as that of the second portion 21a2 described above with reference to FIG. 19, and thus, like reference numerals refer to like elements and their repeated descriptions may be omitted for brevity.

As described above, the piezoelectric vibration portion 21a according to another example embodiment of the present disclosure may include a 1-3 composite structure having a piezoelectric characteristic of a 1-3 type vibration mode, and thus, may have a resonance frequency of 30 MHz or less, but embodiments of the present disclosure are not limited thereto. For example, the resonance frequency of the piezoelectric vibration portion 21a may vary based on at least one or more of a shape, a length, or a thickness.

Figure 20B:
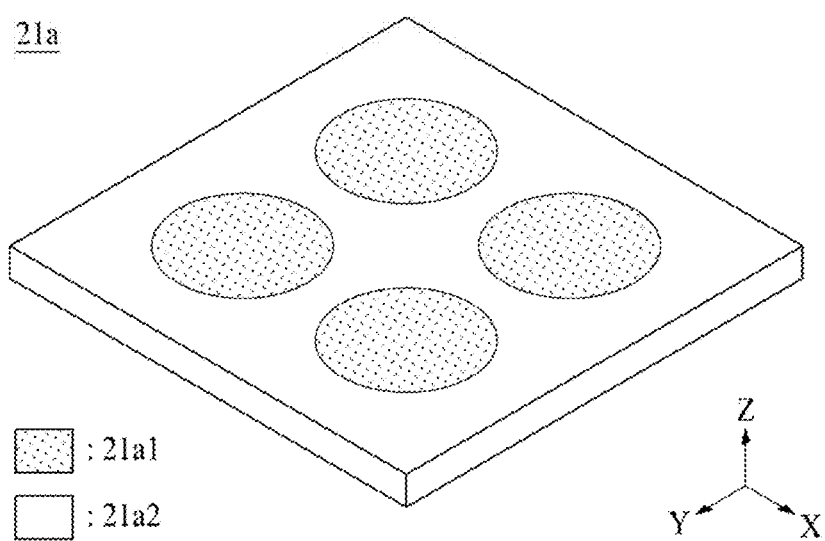

Referring to FIG. 20B, a piezoelectric vibration portion 21a according to another example embodiment of the present disclosure may include a plurality of first portions 21a1 which are apart from one another in a first direction X and a second direction Y and a second portion 21a2 disposed between the plurality of first portions 21a1.

Each of the plurality of first portions 21a1 may have a planar structure having a circular shape. For example, each of the plurality of first portions 21a1 may have a circular plate shape, but embodiments of the present disclosure are not limited thereto. For example, each of the plurality of first portions 21a1 may have a dot shape including an oval shape, a polygonal shape, a donut shape, or the like. Each of the plurality of first portions 21a1 may include substantially the same piezoelectric material as that of the first portion 21a1 described above with reference to FIG. 19, and thus, like reference numerals refer to like elements and their repeated descriptions may be omitted for brevity.

The second portion 21a2 may be disposed between the plurality of first portions 21a1 in each of the first direction X and the second direction Y. The second portion 21a2 may be configured to surround each of the plurality of first portions 21al, and thus, may be connected to or attached on a lateral surface of each of the plurality of first portions 21a1. The plurality of first portions 21a1 and the second portion 21a2 may be disposed (or arranged) in parallel on the same plane (or the same layer). The second portion 21a2 may include substantially the same organic material as that of the second portion 21a2 described above with reference to FIG. 19, and thus, like reference numerals refer to like elements and their repeated descriptions may be omitted for brevity.

Figure 20C:
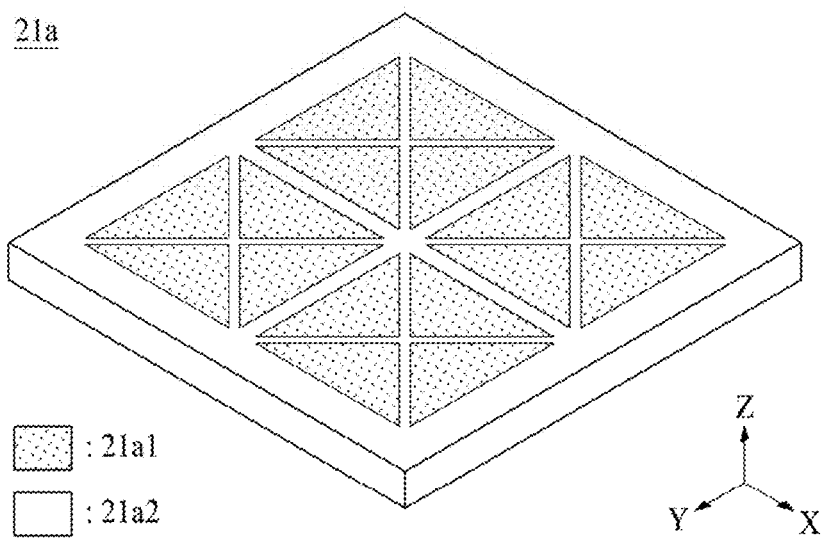

Referring to FIG. 20C, in a vibration device 21 according to another example embodiment of the present disclosure, a piezoelectric vibration portion 21a may include a plurality of first portions 21a1 which are spaced apart from one another in a first direction X and a second direction Y and a second portion 21a2 disposed between the plurality of first portions 21a1.

Each of the plurality of first portions 21a1 may have a planar structure having a triangular shape. For example, each of the plurality of first portions 21a1 may have a triangular plate shape, but embodiments of the present disclosure are not limited thereto. Each of the plurality of first portions 21a1 may include substantially the same piezoelectric material as that of the first portion 21a1 described above with reference to FIG. 19, and thus, like reference numerals refer to like elements and their repeated descriptions may be omitted for brevity.

According to an example embodiment of the present disclosure, four adjacent first portions 21a1 of the plurality of first portions 21a1 may be disposed adjacent to one another to form a quadrilateral shape (or a square shape). A vertex of each of four adjacent first portions 21a1 forming a quadrilateral shape may be disposed adjacent to a middle portion (or a center portion) of a quadrilateral shape.

The second portion 21a2 may be disposed between the plurality of first portions 21a1 in each of the first direction X and the second direction Y. The second portion 21a2 may be configured to surround each of the plurality of first portions 21al, and thus, may be connected to or attached on a lateral surface of each of the plurality of first portions 21a1. The plurality of first portions 21a1 and the second portion 21a2 may be disposed (or arranged) in parallel on the same plane (or the same layer). The second portion 21a2 may include substantially the same organic material as that of the second portion 21a2 described above with reference to FIG. 19, and thus, like reference numerals refer to like elements and their repeated descriptions may be omitted for brevity.

Figure 20D:
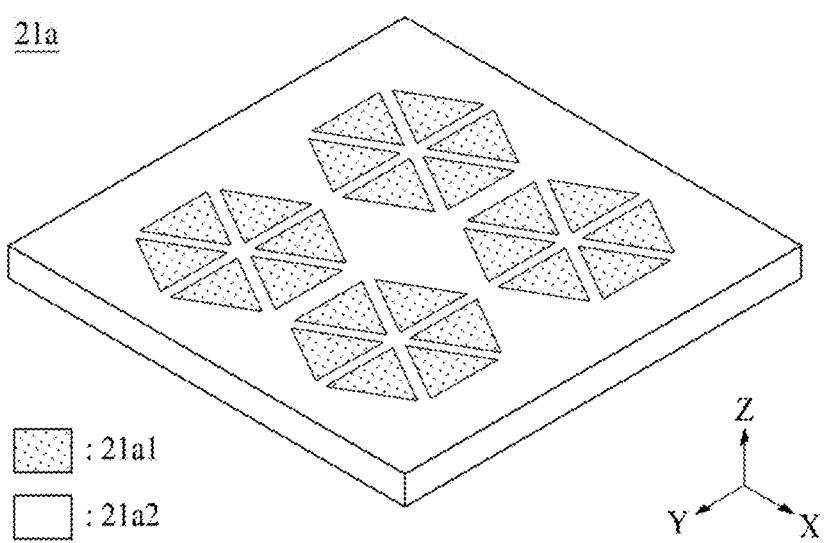

Referring to FIG. 20D, in a vibration device 21 according to another example embodiment of the present disclosure, a piezoelectric vibration portion 21a may include a plurality of first portions 21a1 which are apart from one another in a first direction X and a second direction Y and a second portion 21a2 disposed between the plurality of first portions 21a1.

According to an example embodiment of the present disclosure, six adjacent first portions 21a1 of the plurality of first portions 21a1 may be disposed adjacent to one another to form a hexagonal shape (or a regular hexagonal shape). A vertex of each of six adjacent first portions 21a1 forming a hexagonal shape may be disposed adjacent to a middle portion (or a center portion) of a hexagonal shape.

The second portion 21a2 may be disposed between the plurality of first portions 21a1 in each of the first direction X and the second direction Y. The second portion 21a2 may be configured to surround each of the plurality of first portions 21a1, and thus, may be connected to or attached on a lateral surface of each of the plurality of first portions 21a1. The plurality of first portions 21a1 and the second portion 21a2 may be disposed (or arranged) in parallel on the same plane (or the same layer). The second portion 21a2 may include substantially the same organic material as that of the second portion 21a2 described above with reference to FIG. 19, and thus, like reference numerals refer to like elements and their repeated descriptions may be omitted for brevity.

Figure 21:
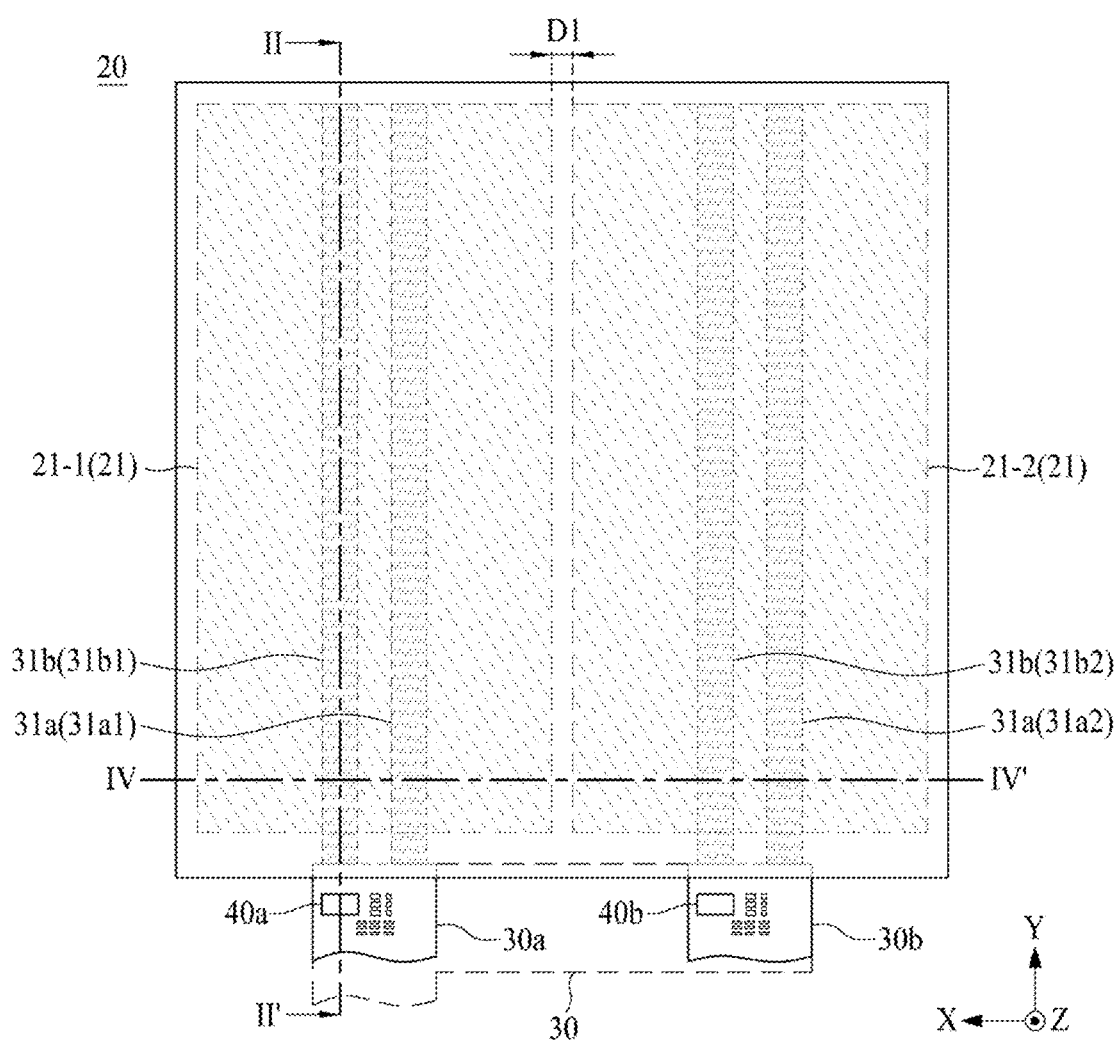
FIG. 21 illustrates a vibration device according to another example embodiment of the present disclosure.
Figure 22:
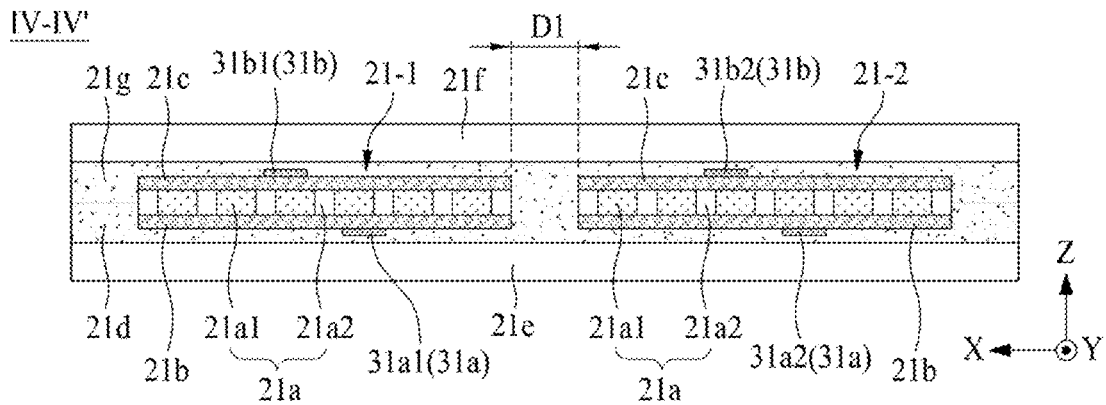
FIG. 22 is an example of a cross-sectional view taken along line IV-IV' illustrated in FIG. 21.

FIG. 21 illustrates a vibration generator 20 according to another example embodiment of the present disclosure, and FIG. 22 is an example of a cross-sectional view taken along line IV-IV' illustrated in FIG. 21. An example of a cross-sectional surface taken along line II-II' illustrated in FIG. 21 is illustrated in FIG. 17. FIGS. 21 and 22 illustrate an example embodiment implemented by modifying a connection structure between the electrode portion and the signal cable illustrated in FIG. 17. In the following description, therefore, the elements except an electrode portion, a signal cable, and relevant elements are referred to by like reference numerals, and their repeated descriptions may be omitted for brevity or will be briefly given.

Referring to FIGS. 21 and 22, the vibration generator 20 according to another example embodiment of the present disclosure may include first and second vibration generating portions 21-1 and 21-2, a first signal cable 30a, and a second signal cable 30b.

The first and second vibration generating portions 21-1 and 21-2 may be disposed apart from and electrically disconnected (or isolated) from each other in a first direction X. Each of the first and second vibration generating portions 21-1 and 21-2 may include a piezoelectric vibration portion 21a, a first electrode portion 21b, and a second electrode portion 21c.

The first and second vibration generating portions 21-1 and 21-2 may be disposed apart from and electrically disconnected (or isolated) from each other in a first direction X. Each of the first and second vibration generating portions 21-1 and 21-2 may alternately repeat contraction and expansion based on a piezoelectric effect to vibrate. For example, the first and second vibration generating portions 21-1 and 21-2 may be arranged or tiled at a certain interval D1 in the first direction X. Accordingly, the vibration device 21 where the first and second vibration generating portions 21-1 and 21-2 are tiled may be a vibration array, a vibration array portion, a vibration module array portion, a vibration array structure, a tiling vibration array, a tiling array module, or a tiling vibration film.

Each of the first and second vibration generating portions 21-1 and 21-2 according to an example embodiment of the present disclosure may have a quadrilateral shape. For example, each of the first and second vibration generating portions 21-1 and 21-2 may have a quadrilateral shape having a width of 5 cm or more. For example, each of the first and second vibration generating portions 21-1 and 21-2 may have a square shape having a size of 5 cm×5 cm or more, but embodiments of the present disclosure are not limited thereto.

Each of the first and second vibration generating portions 21-1 and 21-2 may be disposed or tiled on the same plane, and thus, the vibration device 21 may be implemented to have a large area through tiling of the first and second vibration generating portions 21-1 and 21-2 having a relatively small size.

The first and second vibration generating portions 21-1 and 21-2 may be arranged or tiled at a certain interval, and thus, may be implemented as one vibration apparatus (or a single vibration apparatus) driven as one complete single body without being independently driven. According to an example embodiment of the present disclosure, with respect to the first direction X, a first separation distance D1 between the first and second vibration generating portions 21-1 and 21-2 may be 0.1 mm or more and less than 3 cm, but embodiments of the present disclosure are not limited thereto.

According to an example embodiment of the present disclosure, the first and second vibration generating portions 21-1 and 21-2 may be arranged or tiled to have a separation distance (or interval) D1 of 0.1 mm or more and less than 3 cm and thus may be driven as one vibration apparatus, and a sound pressure level characteristic of a sound and a reproduction band of a sound generated based on a single-body vibration of each of the first and second vibration generating portions 21-1 and 21-2 may increase. For example, the first and second vibration generating portions 21-1 and 21-2 may be arranged at an interval D1 of 0.1 mm or more and less than 5 mm, in order to increase a reproduction band of a sound generated based on a single-body vibration of each of the first and second vibration generating portions 21-1 and 21-2 and increase a sound pressure level characteristic of a sound of a low-pitched sound band (for example, at 500 Hz or less).

According to an example embodiment of the present disclosure, in a case where the first and second vibration generating portions 21-1 and 21-2 are arranged at an interval D1 of less than 0.1 mm or without the interval D1, the reliability of the first and second vibration generating portions 21-1 and 21-2 or the vibration device 21 may be reduced due to damage or the occurrence of a crack caused by a physical contact between the first and second vibration generating portions 21-1 and 21-2 when the first and second vibration generating portions 21-1 and 21-2 are vibrating.

According to an example embodiment of the present disclosure, when the first and second vibration generating portions 21-1 and 21-2 are arranged at an interval D1 of 3 cm or more, the first and second vibration generating portions 21-1 and 21-2 may not be driven as one vibration apparatus due to an independent vibration of each of the first and second vibration generating portions 21-1 and 21-2. Accordingly, a sound pressure level characteristic of a sound and a reproduction band of a sound generated based on a vibration of each of the first and second vibration generating portions 21-1 and 21-2 may decrease. For example, when the first and second vibration generating portions 21-1 and 21-2 are arranged at an interval D1 of 3 cm or more, each of a sound characteristic and a sound pressure level characteristic in the low-pitched sound band (for example, at 500 Hz or less) may be reduced.

According to an example embodiment of the present disclosure, when the first and second vibration generating portions 21-1 and 21-2 are arranged at an interval D1 of 5 mm, each of the first and second vibration generating portions 21-1 and 21-2 may not be driven as one vibration apparatus, and due to this, each of a sound characteristic and a sound pressure level characteristic in the low-pitched sound band (for example, at 200 Hz or less) may be reduced.

According to another example embodiment of the present disclosure, when the first and second vibration generating portions 21-1 and 21-2 are arranged at an interval D1 of 1 mm, the first and second vibration generating portions 21-1 and 21-2 may be driven as one vibration apparatus, and thus, a reproduction band of a sound may increase and a sound pressure level characteristic of a sound in the low-pitched sound band (for example, at 500 Hz or less) may increase. For example, when the first and second vibration generating portions 21-1 and 21-2 are arranged at an interval D1 of 1 mm, a separation distance between the first and second vibration generating portions 21-1 and 21-2 may be optimized, and thus, the vibration device 21 may be implemented as a vibrator having a large area. Accordingly, the vibration device 21 may be driven as a large-area vibrator based on a single-body vibration of the first and second vibration generating portions 21-1 and 21-2, and thus, a sound characteristic and a sound pressure level characteristic in the low-pitched sound band and a reproduction band of a sound generated based on a large-area vibration of the vibration device 21 may increase or be enhanced.

Therefore, to implement a single-body vibration (or one vibration apparatus) of the first and second vibration generating portions 21-1 and 21-2, a separation distance D1 between the first and second vibration generating portions 21-1 and 21-2 may be adjusted to 0.1 mm or more and less than 3 cm. In addition, to increase a sound pressure level characteristic of a sound of the low-pitched sound band along with implementing a single-body vibration (or one vibration apparatus) of the first and second vibration generating portions 21-1 and 21-2, a separation distance D1 between the first and second vibration generating portions 21-1 and 21-2 may be adjusted to 0.1 mm or more and less than 5 mm.

Each of the first and second vibration generating portions 21-1 and 21-2 according to an example embodiment of the present disclosure may include a piezoelectric vibration portion 21a, a first electrode portion 21b, and a second electrode portion 21c.

The piezoelectric vibration portion 21a of each of the first and second vibration generating portions 21-1 and 21-2 may include a piezoelectric material (or an electroactive material) including a piezoelectric effect. For example, the piezoelectric vibration portion 21a of each of the first and second vibration generating portions 21-1 and 21-2 may be substantially the same as one of the vibration portions 21a described above with reference to FIG. 1, and thus, its repeated description is omitted for brevity.

According to an example embodiment of the present disclosure, each of the first and second vibration generating portions 21-1 and 21-2 may include one piezoelectric vibration portion 21a or different piezoelectric vibration portions 21a among the piezoelectric vibration portions 21a described above with reference to FIG. 1.

The first signal cable 30a may be electrically connected, or electrically and directly connected to the first and second electrode portions 21b and 21c of the first vibration generating portion 21-1, and thus, may be integrated into the first vibration generating portion 21-1. For example, the first signal cable 30a may be electrically connected to the first and second electrode portions 21b and 21c of the first vibration generating portion 21-1 without passing through the power supply line described above with reference to FIG. 14.

The second signal cable 30b may be electrically connected, or electrically and directly connected to the first and second electrode portions 21b and 21c of the second vibration generating portion 21-2 at one side of the vibration generator 20, and thus, may be integrated into the second vibration generating portion 21-2. For example, the second signal cable 30b may be electrically connected to the first and second electrode portions 21b and 21c of the second vibration generating portion 21-2 without passing through the power supply line and the pad portion described above with reference to FIG. 14.

Each of the first and second signal cables 30a and 30b according to an example embodiment of the present disclosure may include first and second protrusion lines 31a and 31b. For example, each of the first and second protrusion lines 31a and 31b may be referred to as a term such as a power supply line, a conductive line, a protrusion electrode, an extension line, an extension electrode, a finger line, or a finger electrode, but the terms are not limited thereto.

The first protrusion line 31a (or a first upper protrusion line 31a1) of the first signal cable 30a may overlap at least a portion of the first electrode portion 21b of the first vibration generating portion 21-1 and may be electrically connected, or electrically and directly connected to the first electrode portion 21b. The second protrusion line 31b (or a first lower protrusion line 31b1) of the first signal cable 30a may overlap at least a portion of the second electrode portion 21c of the first vibration generating portion 21-1 and may be electrically connected, or electrically and directly connected to the second electrode portion 21c. For example, each of the first and second protrusion lines 31a and 31b of the first signal cable 30a may be bent toward a correspond electrode portions 21b and 21c of the first vibration generating portion 21-1, but embodiments of the present disclosure are not limited thereto.

The first protrusion line 31a (or a second upper protrusion line 31a2) of the second signal cable 30b may overlap at least a portion of the first electrode portion 21b of the second vibration generating portion 21-2 and may be electrically connected, or electrically and directly connected to the first electrode portion 21b. The second protrusion line 31b (or a second lower protrusion line 31b2) of the second signal cable 30b may overlap at least a portion of the second electrode portion 21c of the second vibration generating portion 21-2 and may be electrically connected, or electrically and directly connected to the second electrode portion 21c. For example, each of the first and second protrusion lines 31a and 31b of the second signal cable 30b may be bent toward a correspond electrode portions 21b and 21c of the second vibration generating portion 21-2, but embodiments of the present disclosure are not limited thereto.

Each of the first and second signal cables 30a and 30b according to an example embodiment of the present disclosure may include a body portion, first and second protrusion lines 31a and 31b, and sound processing circuits 40a and 40b. Each of the first and second signal cables 30a and 30b may be substantially the same as the signal cable 30 described above with reference to FIGS. 13 to 17, and thus, like reference numerals refer to like elements and their repeated descriptions may be omitted for brevity or will be briefly given below.

The sound processing circuit (or a first sound processing circuit) 40a mounted on or integrated into the first signal cable 30a may generate a first vibration driving signal and a second vibration driving signal based on sound data provided from the external sound data generating circuit part and may supply the first vibration driving signal and the second vibration driving signal to the first and second electrode portions 21b and 21c of the first vibration generating portion 21-1 through the first and second protrusion lines 31a and 31b. The sound processing circuit 40a mounted in the first signal cable 30a may include a decoding part, an audio amplifier circuit, a memory circuit, a control circuit, and a passive element such as a resistor. The elements may be substantially the same as the elements of the signal generating circuit 40 described above with reference to FIG. 14 or 16, and thus, like reference numerals refer to like elements and their repeated descriptions may be omitted for brevity. For example, the signal generating circuit 40 may be referred to as a signal generating circuit, and a vibration driving circuit, but the terms are not limited thereto.

The sound processing circuit (or a second sound processing circuit) 40b mounted on or integrated into the second signal cable 30b may generate a first vibration driving signal and a second vibration driving signal based on the sound data provided from the external sound data generating circuit part and may supply the first vibration driving signal and the second vibration driving signal to the first and second electrode portions 21b and 21c of the second vibration generating portion 21-2 through the first and second protrusion lines 31a and 31b. The sound processing circuit 40b mounted in the second signal cable 30b may include a decoding part, an audio amplifier circuit, a memory circuit, a control circuit, and a passive element such as a resistor. The elements may be substantially the same as the elements of the signal generating circuit 40 described above with reference to FIG. 14 or 16, and thus, like reference numerals refer to like elements and their repeated descriptions may be omitted for brevity.

The vibration generator 20 according to another example embodiment of the present disclosure may further include a first cover member 21e and a second cover member 21f. Except that the first and second cover members 21e and 21f are configured to cover each of the first and second vibration generating portions 21-1 and 21-2 and the first and second protrusion lines 31a and 31b of each of the first and second signal cables 30a and 30b, the first and second cover members 21e and 21f may be substantially the same as each of the first and second cover members 21e and 21f described above with reference to FIGS. 13 to 18, and thus, like reference numerals refer to like elements and their repeated descriptions may be omitted for brevity or will be briefly given below.

The first cover member 21e may be disposed at a first surface of the vibration device 21. For example, the first cover member 21e may be configured to cover the first electrode portion 21b of each of the first and second vibration generating portions 21-1 and 21-2 and the first protrusion line 31a of each of the first and second signal cables 30a and 30b.

The second cover member 21f may be disposed at a second surface of the vibration device 21. For example, the second cover member 21f may be configured to cover the second electrode portion 21c of each of the first and second vibration generating portions 21-1 and 21-2 and the second protrusion line 31b of each of the first and second signal cables 30a and 30b.

The first cover member 21e according to an example embodiment of the present disclosure may be connected or coupled to the first electrode portion 21b of each of the first and second vibration generating portions 21-1 and 21-2 and the first protrusion line 31a of each of the first and second signal cables 30a and 30b by a first adhesive layer 21d. Accordingly, the first protrusion line (or a first finger line) 31a of each of the first and second signal cables 30a and 30b may be disposed between the first electrode portion 21b of each of the first and second vibration generating portions 21-1 and 21-2 and the first cover member 21e and may be provided as one body (or an integration structure) with the vibration device 21.

The second cover member 21f according to an example embodiment of the present disclosure may be connected or coupled to the second electrode portion 21c of each of the first and second vibration generating portions 21-1 and 21-2 and the second protrusion line 31b of each of the first and second signal cables 30a and 30b by a second adhesive layer 21g. Accordingly, the second protrusion line (or a second finger line) 31b of each of the first and second signal cables 30a and 30b may be disposed between the second electrode portion 21c of each of the first and second vibration generating portions 21-1 and 21-2 and the second cover member 21f and may be provided as one body (or an integration structure) with the vibration device 21.

The first adhesive layer 21d may be disposed between the first and second vibration generating portions 21-1 and 21-2 and on a first surface of each of the first and second vibration generating portions 21-1 and 21-2. The second adhesive layer 21g may be disposed between the first and second vibration generating portions 21-1 and 21-2 and on a second surface of each of the first and second vibration generating portions 21-1 and 21-2. For example, the first and second adhesive layers 21d and 21g may be provided between the first cover member 21e and the second cover member 21f to fully (or completely) surround each of the first and second vibration generating portions 21-1 and 21-2. The first and second adhesive layers 21d and 21g may be connected or coupled between the first and second vibration generating portions 21-1 and 21-2.

In another example, at least a portion of each of the first and second signal cables 30a and 30b may be disposed or inserted (or accommodated) between the first cover member 21e and the second cover member 21f, and thus, a short circuit (or a short) of the first and second protrusion lines 31a and 31b caused by the movement or bending of the signal cable 30 may be prevented.

As described above, the vibration generator 20 according to another example embodiment of the present disclosure may be driven as a large-area vibrator based on a single-body vibration. In addition, in the vibration generator 20 according to another example embodiment of the present disclosure, like the vibration generator 20 described above with reference to FIGS. 16 to 19, a structure and a manufacturing process may be simplified, an electrical characteristic of each of the electrode portions 21b and 21c may be complemented, a connection structure between the vibration generating portions 21-1 and 21-2, the sound processing circuits 40a and 40b, the signal cables 30a and 30b, and the sound data generating circuit part may be simplified, and a filter circuit including an inductor and a capacitor for preventing electromagnetic interference (EMI) may be omitted.

Figure 23:
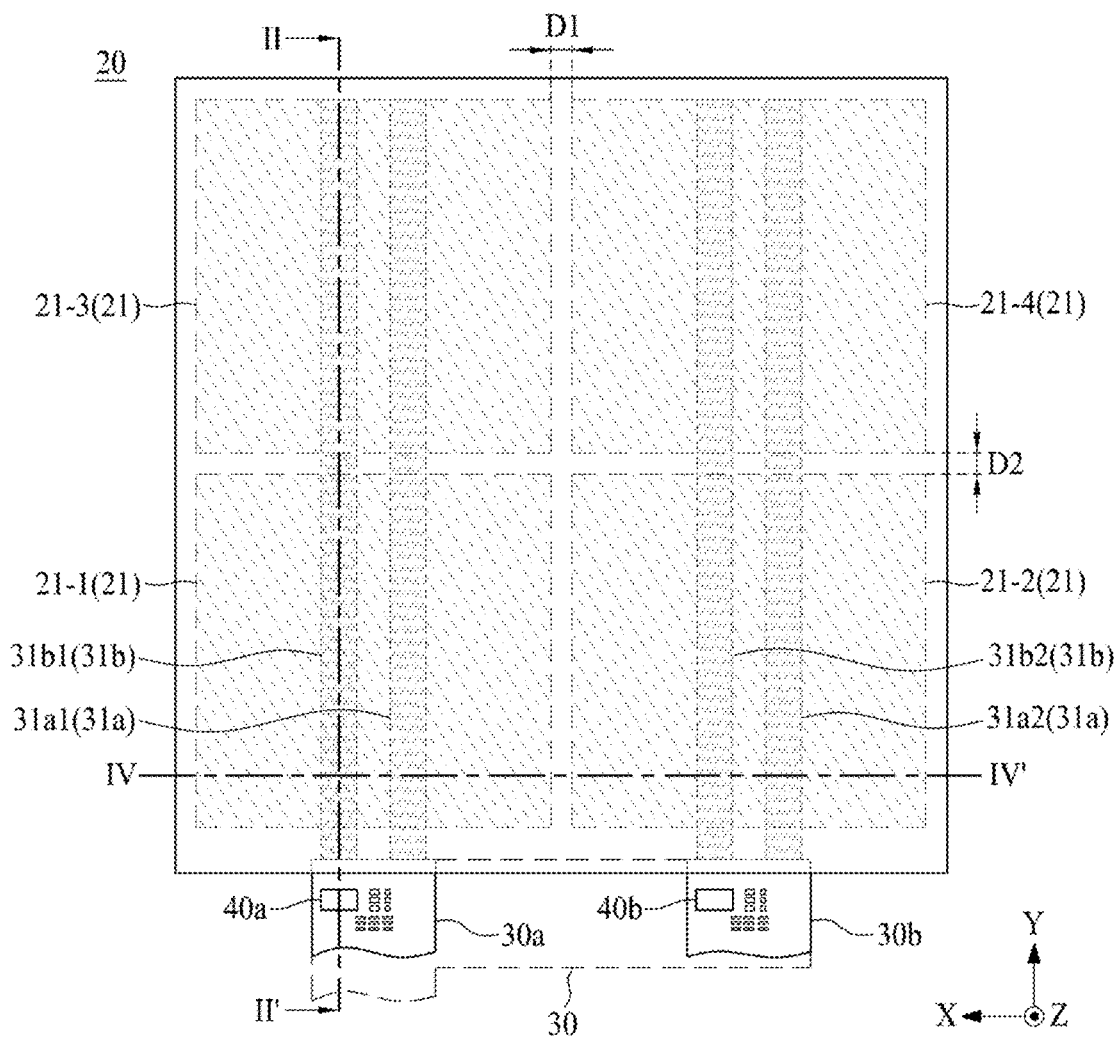
FIG. 23 illustrates a vibration device according to another example embodiment of the present disclosure.

In another example, in the vibration generator 20 according to another example embodiment of the present disclosure, the first and second signal cables 30a and 30b may be replaced or configured with one signal cable 30. One signal cable 30 according to an example embodiment of the present disclosure may be simply configured as one without modifying structures of the first and second signal cables 30a and 30b, and thus, may have a width which is greater than a sum of widths of the first and second signal cables 30a and 30b. One signal cable 30 according to another example embodiment of the present disclosure may be configured so that one edge portion (or one periphery portion) of a body portion with the first and second sound processing circuits 40a and 40b mounted thereon has a relatively width and the other portion except the one edge portion (or the periphery portion) of the body portion has the same width as that of one of the first and second signal cables 30a and 30b.

signal generating circuit 40 signal generating circuit 40 FIG. 23 illustrates a vibration generator 20 according to another example embodiment of the present disclosure. FIG. 23 illustrates an example embodiment where four vibration generating portions are provided in the vibration generator illustrated in FIGS. 16 and 21. Hereinafter, therefore, the elements except four vibration generating portions and relevant elements are referred to by like reference numerals, and their repeated descriptions may be omitted for brevity or will be briefly given. An example of a cross-sectional surface taken along line II-II' illustrated in FIG. 23 is illustrated in FIG. 17, and an example of a cross-sectional surface taken along line IV-IV' illustrated in FIG. 23 is illustrated in FIG. 22.

Referring to FIG. 23 in conjunction with FIGS. 17 and 22, the vibration device 21 according to another example embodiment of the present disclosure may include a plurality of vibration generating portions 21-1 to 21-4, a first signal cable 30a, and a second signal cable 30b.

The plurality of vibration generating portions 21-1 to 21-4 may be electrically disconnected (or isolated) and disposed apart from one another in each of a first direction X and a second direction Y. For example, the plurality of vibration generating portions 21-1 to 21-4 may be arranged or tiled in an i×j form. Each of the plurality of vibration generating portions 21-1 to 21-4 may include a piezoelectric vibration portion 21a, a first electrode portion 21b, and a second electrode portion 21c. Each of the plurality of vibration generating portions 21-1 to 21-4 may be substantially the same as each of the plurality of vibration generating portions 21-1 to 21-4 of the vibration device 21 described above with reference to FIG. 21, and thus, like reference numerals refer to like elements and their repeated descriptions may be omitted for brevity. In the following description, an example where the vibration generator 20 includes first to fourth vibration generating portions 21-1 to 21-4 will be described.

The first signal cable 30a may be electrically connected, or electrically and directly connected to the first and second electrode portions 21b and 21c of each of the first and third vibration generating portions 21-1 and 21-3 at one side of the vibration device 21, and thus, may be integrated into the first and third vibration generating portions 21-1 and 21-3. For example, the first signal cable 30a may be electrically connected to the first and second electrode portions 21b and 21c of each of the first and third vibration generating portions 21-1 and 21-3 without passing through the power supply line and the pad portion described above with reference to FIG. 21.

The second signal cable 30b may be electrically connected, or electrically and directly connected to the first and second electrode portions 21b and 21c of each of the second and fourth vibration generating portions 21-2 and 21-4 at one side of the vibration device 21, and thus, may be integrated into the second and fourth vibration generating portions 21-2 and 21-4. For example, the second signal cable 30b may be electrically connected to the first and second electrode portions 21b and 21c of each of the second and fourth vibration generating portions 21-2 and 21-4 without passing through the power supply line and the pad portion described above with reference to FIG. 21.

Each of the first and second signal cables 30a and 30b according to an example embodiment of the present disclosure may include first and second protrusion lines 31a and 31b. For example, each of the first and second protrusion lines 31a and 31b may be referred to as a term such as a protrusion electrode, an extension line, an extension electrode, a finger line, or a finger electrode, but the terms are not limited thereto.

The first protrusion line 31a (or a first upper protrusion line 31a1) of the first signal cable 30a may overlap at least a portion of the first electrode portion 21b of each of the first and third vibration generating portions 21-1 and 21-3 and may be electrically connected, or electrically and directly connected to the first electrode portion 21b. The second protrusion line 31b (or a first lower protrusion line 31b1) of the first signal cable 30a may overlap at least a portion of the second electrode portion 21c of each of the first and third vibration generating portions 21-1 and 21-3 and may be electrically connected, or electrically and directly connected to the second electrode portion 21c. For example, each of the first and second protrusion lines 31a and 31b of the first signal cable 30a may be bent toward a correspond electrode portions 21b and 21c of each of the first and third vibration generating portions 21-1 and 21-3, but embodiments of the present disclosure are not limited thereto.

The first protrusion line 31a (or a second upper protrusion line 31a2) of the second signal cable 30b may overlap at least a portion of the first electrode portion 21b of each of the second and fourth vibration generating portions 21-2 and 21-4 and may be electrically connected, or electrically and directly connected to the first electrode portion 21b. The second protrusion line 31b (or a second lower protrusion line 31b2) of the second signal cable 30b may overlap at least a portion of the second electrode portion 21c of each of the second and fourth vibration generating portions 21-2 and 21-4 and may be electrically connected, or electrically and directly connected to the second electrode portion 21c. For example, each of the first and second protrusion lines 31a and 31b of the second signal cable 30b may be bent toward a correspond electrode portions 21b and 21c of each of the second and fourth vibration generating portions 21-2 and 21-4, but embodiments of the present disclosure are not limited thereto.

Each of the first and second signal cables 30a and 30b according to an example embodiment of the present disclosure may include a body portion, first and second protrusion lines 31a and 31b, and sound processing circuits 40a and 40b. Each of the first and second signal cables 30a and 30b may be substantially the same as the signal cable 30 described above with reference to FIGS. 13 to 17, and thus, like reference numerals refer to like elements and their repeated descriptions may be omitted for brevity or will be briefly given below.

The sound processing circuit (or a first sound processing circuit) 40a mounted on or integrated into the first signal cable 30a may generate a first vibration driving signal and a second vibration driving signal based on sound data provided from the external sound data generating circuit part and may supply the first vibration driving signal and the second vibration driving signal to the first and second electrode portions 21b and 21c of each of the first and third vibration generating portions 21-1 and 21-3 through the first and second protrusion lines 31a and 31b. The sound processing circuit 40a mounted in the first signal cable 30a may include a decoding part, an audio amplifier circuit, a memory circuit, a control circuit, and a passive element such as a resistor. The elements may be substantially the same as the elements of the signal generating circuit 40 described above with reference to FIG. 14 or 16, and thus, like reference numerals refer to like elements and their repeated descriptions may be omitted for brevity.

The sound processing circuit (or a second sound processing circuit) 40b mounted on or integrated into the second signal cable 30b may generate a first vibration driving signal and a second vibration driving signal based on the sound data provided from the external sound data generating circuit part and may supply the first vibration driving signal and the second vibration driving signal to the first and second electrode portions 21b and 21c of each of the second and fourth vibration generating portions 21-2 and 21-4 through the first and second protrusion lines 31a and 31b. The sound processing circuit 40b mounted in the second signal cable 30b may include a decoding part, an audio amplifier circuit, a memory circuit, a control circuit, and a passive element such as a resistor. The elements may be substantially the same as the elements of the signal generating circuit 40 described above with reference to FIG. 14 or 16, and thus, like reference numerals refer to like elements and their repeated descriptions may be omitted for brevity.

The vibration generator 20 according to another example embodiment of the present disclosure may further include a first cover member 21e and a second cover member 21f. Except that the first and second cover members 21e and 21f are configured to cover each of the first to fourth vibration generating portions 21-1 to 21-4 and the first and second protrusion lines 31a and 31b of each of the first and second signal cables 30a and 30b, the first and second cover members 21e and 21f may be substantially the same as each of the first and second cover members 21e and 21f described above with reference to FIGS. 13 to 22, and thus, like reference numerals refer to like elements and their repeated descriptions may be omitted for brevity or will be briefly given below.

The first cover member 21e may be disposed at a first surface of the vibration device 21. For example, the first cover member 21e may be configured to the first electrode portion 21b of each of the first and second vibration generating portions 21-1 and 21-2 and the first protrusion line 31a of each of the first and second signal cables 30a and 30b.

The second cover member 21f may be disposed at a second surface of the vibration device 21. For example, the second cover member 21f may be configured to the second electrode portion 21c of each of the first to fourth vibration generating portions 21-1 to 21-4 and the second protrusion line 31b of each of the first and second signal cables 30a and 30b.

The first cover member 21e according to an example embodiment of the present disclosure may be connected or coupled to the first electrode portion 21b of each of the first to fourth vibration generating portions 21-1 to 21-4 and the first protrusion line 31a of each of the first and second signal cables 30a and 30b by a first adhesive layer 21d. Accordingly, the first protrusion line (or a first finger line) 31a of each of the first and second signal cables 30a and 30b may be disposed between the first electrode portion 21b of each of the first to fourth vibration generating portions 21-1 to 21-4 and the first cover member 21e and may be provided as one body (or an integration structure) with the vibration device 21.

The second cover member 21f according to an example embodiment of the present disclosure may be connected or coupled to the second electrode portion 21c of each of the first to fourth vibration generating portions 21-1 to 21-4 and the second protrusion line 31b of each of the first and second signal cables 30a and 30b by a second adhesive layer 21g. Accordingly, the second protrusion line (or a second finger line) 31b of each of the first and second signal cables 30a and 30b may be disposed between the second electrode portion 21c of each of the first to fourth vibration generating portions 21-1 to 21-4 and the second cover member 21f and may be provided as one body (or an integration structure) with the vibration device 21.

The first adhesive layer 21d may be disposed between the first to fourth vibration generating portions 21-1 to 21-4 and at a first surface of each of the first to fourth vibration generating portions 21-1 to 21-4. The second adhesive layer 21g may be disposed between the first to fourth vibration generating portions 21-1 to 21-4 and at a second surface of each of the first to fourth vibration generating portions 21-1 to 21-4. For example, the first and second adhesive layers 21d and 21g may be provided between the first cover member 21e and the second cover member 21f to fully surround each of the first to fourth vibration generating portions 21-1 to 21-4. The first and second adhesive layers 21d and 21g may be connected or coupled between the first to fourth vibration generating portions 21-1 to 21-4.

At least a portion of each of the first and second signal cables 30a and 30b may be disposed or inserted (or accommodated) between the first cover member 21e and the second cover member 21f, and thus, a short circuit (or a short) of the first and second protrusion lines 31a and 31b caused by the movement or bending of the signal cable 30 may be prevented.

As described above, like the vibration generator 20 described above with reference to FIG. 23, the vibration generator 20 according to another example embodiment of the present disclosure may be driven as a large-area vibrator based on a single-body vibration of the first to fourth vibration generating portions 21-1 to 21-4. In addition, in the vibration generator 20 according to another example embodiment of the present disclosure, like the vibration generator 20 described above with reference to FIGS. 16 to 19, a structure and a manufacturing process may be simplified, an electrical characteristic of each of the electrode portions 21b and 21c may be complemented, a connection structure between the first to fourth vibration generating portions 21-1 to 21-4, the sound processing circuits 40a and 40b, the signal cables 30a and 30b, and the sound data generating circuit part may be simplified, and a filter circuit including an inductor and a capacitor for preventing electromagnetic interference (EMI) may be omitted.

In another example, in the vibration generator 20 according to another example embodiment of the present disclosure, as in a dotted line illustrated in FIG. 23, the first and second signal cables 30a and 30b may be replaced or configured with one signal cable 30. One signal cable 30 according to an example embodiment of the present disclosure may be simply configured as one without modifying structures of the first and second signal cables 30a and 30b, and thus, may have a width which is greater than a sum of widths of the first and second signal cables 30a and 30b. One signal cable 30 according to another example embodiment of the present disclosure may be configured so that one edge portion (or one periphery portion) of a body portion with the first and second sound processing circuits 40a and 40b mounted thereon has a relatively width and the other portion except the one edge portion (or one periphery portion) of the body portion has the same width as that of one of the first and second signal cables 30a and 30b.

Figure 24:
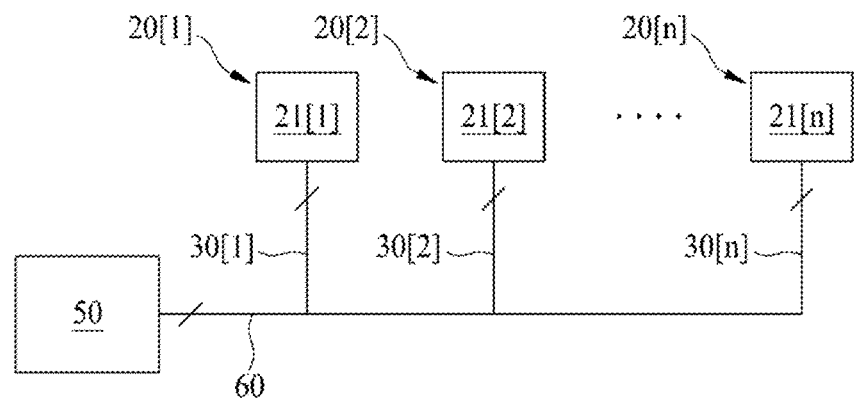
FIG. 24 illustrates an apparatus according to another example embodiment of the present disclosure.
Figure 25:
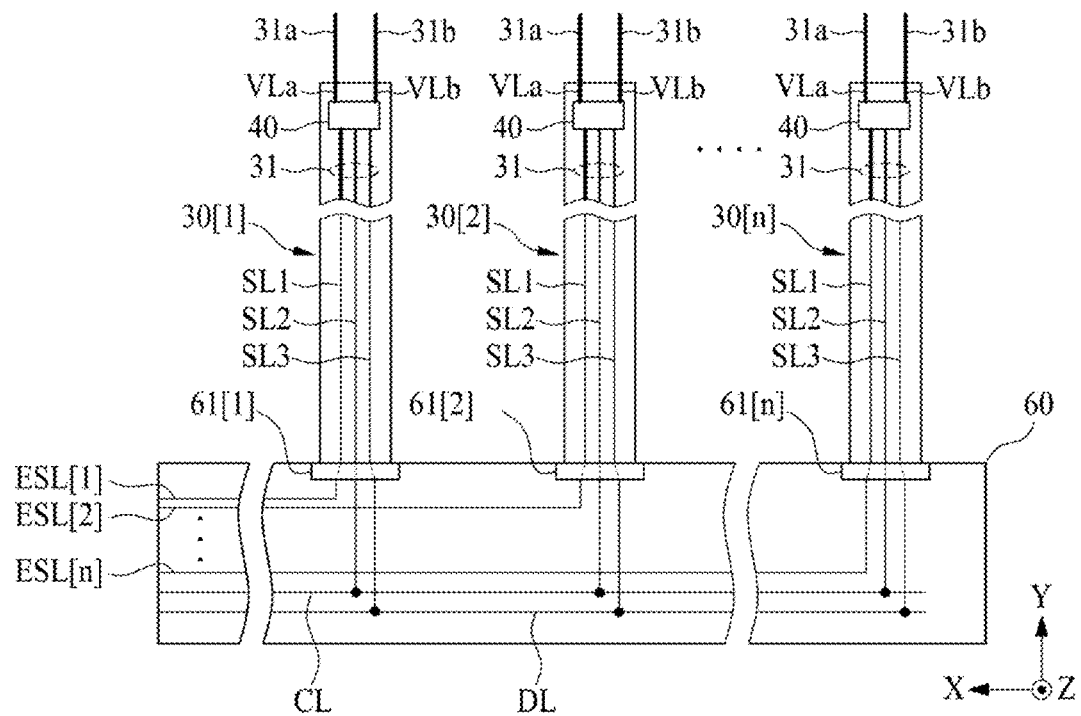
FIG. 25 illustrates an example of a main cable and first to $n^{th}$ signal cables illustrated in FIG. 24.
Figure 26:
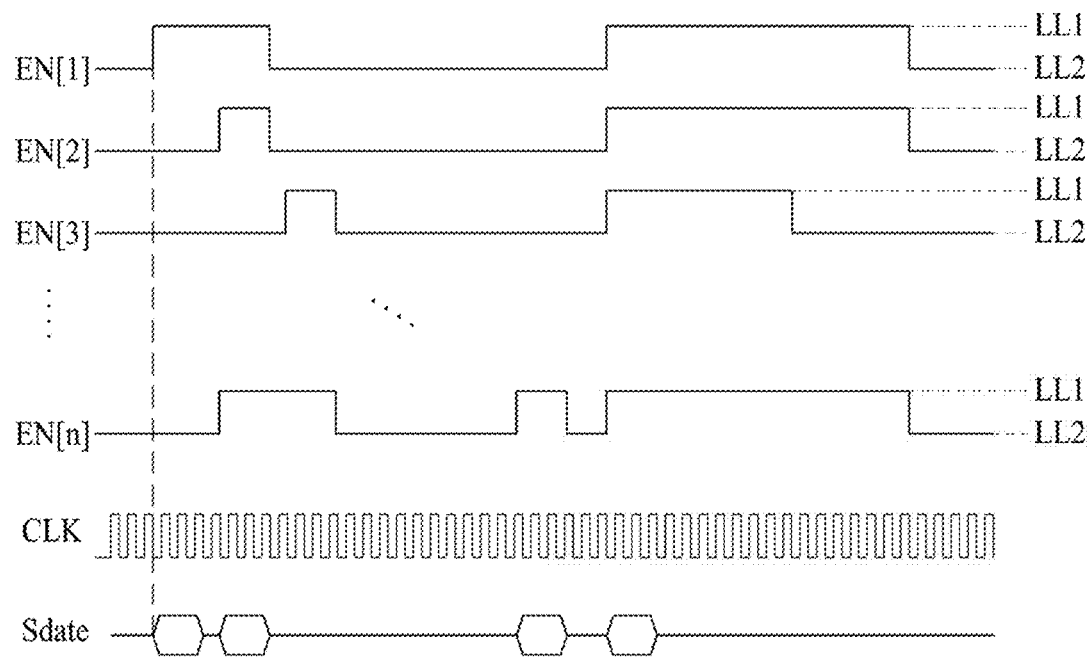
FIG. 26 is an example of a waveform diagram showing an output signal of a sound data generating circuit part illustrated in FIG. 23.

FIG. 24 illustrates an apparatus according to another example embodiment of the present disclosure, FIG. 25 illustrates an example of a main cable and first to $n^{th}$ signal cables illustrated in FIG. 24, and FIG. 26 is an example of a waveform diagram showing an output signal of a sound data generating circuit part illustrated in FIG. 23.

Referring to FIGS. 24 to 26, the apparatus according to an example embodiment of the present disclosure may include first to $n^{th}$ vibration apparatuses 20[1] to 20[n], a sound data generating circuit part 50, a main cable 60, and first to $n^{th}$ signal cables 30[1] to 30[n].

Each of the first to $n^{th}$ vibration apparatuses 20[1] to 20[n] may be one of the vibration apparatuses described above with reference to FIGS. 1 to 23. For example, the first to $n^{th}$ vibration apparatuses 20[1] to 20[n] may be the same or different from one another. One or more of the first to $n^{th}$ vibration apparatuses 20[1] to 20[n] may differ from one another. Therefore, a repeated description of each of the first to $n^{th}$ vibration apparatuses 20[1] to 20[n] may be omitted for brevity.

Each of the first to $n^{th}$ vibration apparatuses 20[1] to 20[n] may include one of the vibration devices 21[1] to 21[n]. For example, vibration devices 21[1] to 21[n] of the first to $n^{th}$ vibration apparatuses 20[1] to 20[n] may be the same or different from one another. Vibration devices 21[1] to 21[n] of the first to $n^{th}$ vibration apparatuses 20[1] to 20[n] may differ. Therefore, repeated descriptions of the vibration devices 21[1] to 21[n] of the first to $n^{th}$ vibration apparatuses 20[1] to 20[n] may be omitted for brevity.

The sound data generating circuit part 50 (or a sound card) may generate a sound data Sdata based on a sound source (or a digital sound source). The sound data generating circuit part 50 may generate first to $n^{th}$ enable signals EN[1] to EN[n] corresponding to a driving mode of the apparatus based on the sound source or the sound data. The sound data generating circuit part 50 may encode a reference clock CLK, the sound data Sdata, and the first to $n^{th}$ enable signals EN[1] to EN[n] based on a predetermined serial interface type (or a digital serial interface type) and may supply the encoded reference clock CLK, sound data Sdata, and first to $n^{th}$ enable signals EN[1] to EN[n] to the first to $n^{th}$ vibration apparatuses 20[1] to 20[n]. For example, the sound data generating circuit part 50 may transfer the sound data Sdata corresponding to each of the first to $n^{th}$ vibration apparatuses 20[1] to 20[n] based on the serial interface type. For example, the serial interface type may be an integrated interchip sound (I2S), but embodiments of the present disclosure are not limited thereto.

The main cable 60 may be connected to the sound data generating circuit part 50. For example, the main cable 60 may have a length corresponding to a longest distance between the sound data generating circuit part 50 and each of the first to $n^{th}$ vibration apparatuses 20[1] to 20[n].

The main cable 60 according to an example embodiment of the present disclosure may include first to $n^{th}$ enable signal lines ESL[1] to ESL[n], a clock line CL, and a data line DL.

The sound data generating circuit part 50 may supply the first to $n^{th}$ enable signals EN[1] to EN[n] respectively corresponding to the first to $n^{th}$ enable signal lines ESL[1] to ESL[n], supply the reference clock CLK to the clock line CL, and supply the sound data Sdata to the data line DL.

Each of the first to $n^{th}$ signal cables 30[1] to 30[n] may be connected between the main cable 60 and a corresponding vibration apparatus of the first to $n^{th}$ vibration apparatuses 20[1] to 20[n].

Each of the first to $n^{th}$ signal cables 30[1] to 30[n] according to an example embodiment of the present disclosure may branch or extend from the main cable 60 to a corresponding vibration apparatus of the first to $n^{th}$ vibration apparatuses 20[1] to 20[n]. For example, each of the first to $n^{th}$ signal cables 30[1] to 30[n] may branch or extend from the main cable 60 and may be individually connected to a corresponding vibration apparatus of the first to $n^{th}$ vibration apparatuses 20[1] to 20[n].

According to another example embodiment of the present disclosure, each of the first to $n^{th}$ signal cables 30[1] to 30[n] may be connected to the main cable 60 based on a connector scheme. For example, the main cable 60 may further include first to $n^{th}$ connectors 61[1] to 61[n].

Each of the first to $n^{th}$ connectors 61[1] to 61[n] may include first to third connection terminals. The first connection terminal of each of the first to $n^{th}$ connectors 61[1] to 61[n] may be electrically connected to a corresponding enable signal line of the first to $n^{th}$ enable signal lines ESL[1] to ESL [n]. The second connection terminal of each of the first to $n^{th}$ connectors 61[1] to 61[n] may be electrically connected to the clock line CL in common. The third connection terminal of each of the first to $n^{th}$ connectors 61[1] to 61[n] may be electrically connected to the data line DL in common.

According to an example embodiment of the present disclosure, at least a portion of each of the first to $n^{th}$ signal cables 30[1] to 30[n] connected to the main cable 60 by a connector scheme may be inserted (or accommodated) between the first and second cover members 21e and 21f of the vibration device 21 as described above with reference to FIG. 16, and repeated descriptions thereof may be omitted for brevity.

Each of the first to $n^{th}$ signal cables 30[1] to 30[n] according to an example embodiment of the present disclosure may include a body portion, first and second protrusion lines 31a and 31b, and a signal generating circuit 40.

The body portion, as illustrated in FIG. 16, may include a wiring layer 31, a lower film 32 coupled to a first surface of the wiring layer 31 by a first adhesive 33, an upper film 34 coupled to a second surface of the wiring layer 31 by a second adhesive 35, and a plurality of contact pads disposed on the upper film 34 and connected to the wiring layer 31.

The wiring layer 31 may include first to third signal lines SL1 to SL3 and first and second driving signal supply lines VLa and VLb.

The first to third signal lines SL1 to SL3 may be disposed to be parallel to each other.

The first signal line SL1 of each of the first to $n^{th}$ signal cables 30[1] to 30[n] may be individually connected to a corresponding enable signal line of the first to $n^{th}$ enable signal lines ESL[1] to ESL[n] of the main cable 60. For example, the first signal line SL1 of the first signal cable 30[1] may be electrically connected to the first enable signal line ESL[1] of the main cable 60, and the first signal line SL1 of the $n^{th}$ signal cable 30[n] may be electrically connected to the $n^{th}$ enable signal line ESL[n] of the main cable 60.

The second signal line SL2 of each of the first to $n^{th}$ signal cables 30[1] to 30[n] may be connected to the clock line CL of the main cable 60 in common.

The third signal line SL3 of each of the first to $n^{th}$ signal cables 30[1] to 30[n] may be connected to the data line DL of the main cable 60 in common.

Each of the first and second driving signal supply lines VLa and VLb may be disposed in parallel with an end portion of a corresponding signal cable of the first to $n^{th}$ signal cables 30[1] to 30[n].

The first and second protrusion lines 31a and 31b may be respectively and electrically connected to the first and second driving signal supply lines VLa and VLb, or may pass through one lateral surface 30s of the body portion from the first and second driving signal supply lines VLa and VLb and may extend or protrude, respectively.

The first protrusion line 31a may be electrically connected to a first electrode portion of the vibration device 21 of a corresponding vibration apparatus, and the second protrusion line 31b may be electrically connected to a second electrode portion of the vibration device 21 of a corresponding vibration apparatus. This is as described above, and thus, repeated descriptions thereof may be omitted for brevity.

The signal generating circuit 40 may be mounted on each of the first to $n^{th}$ signal cables 30[1] to 30[n] and may be electrically connected to each of the first to third signal lines SL1 to SL3 and each of the first and second driving signal supply lines VLa and VLb.

The signal generating circuit 40 may decode the reference clock CLK, the sound data Sdata, and the first to $n^{th}$ enable signals EN[1] to EN[n] supplied from the sound data generating circuit part 50 through the first to third signal lines SL1 to SL3, generate first and second vibration driving signals for vibrating each of the first to $n^{th}$ vibration apparatuses 20[1] to 20[n] based on the decoded reference clock CLK, sound data Sdata, and first to $n^{th}$ enable signals EN[1] to EN[n], and output the first and second vibration driving signals to the first and second driving signal supply lines VLa and VLb. Therefore, each of the first to $n^{th}$ vibration apparatuses 20[1] to 20[n] may vibrate based on the first and second vibration driving signals supplied through the first and second driving signal supply lines VLa and VLb and the first and second protrusion lines 31a and 31b of a corresponding signal cable of the first to $n^{th}$ signal cables 30[1] to 30[n] to output a sound corresponding to the sound data Sdata. For example, each of the first to $n^{th}$ vibration apparatuses 20[1] to 20[n] may be sequentially or simultaneously driven based on a corresponding enable signal of the first to $n^{th}$ enable signals EN[1] to EN[n].

According to an example embodiment of the present disclosure, the signal generating circuit 40 mounted on each of the first to $n^{th}$ signal cables 30[1] to 30[n] may be enabled based on an enable signal having a first logic level LL1 supplied through the first signal line SL1 of a corresponding signal cable to generate the first and second vibration driving signals, or may be disabled based on a disable signal having a second logic level LL2. For example, the signal generating circuit 40 mounted on the first signal cable 30[1] may be enabled based on the first enable signal EN[1] having the first logic level LL1 supplied through the first signal line SL1 of the first enable signal EN[1], generate the first and second vibration driving signals based on the reference clock CLK and the sound data Sdata, and output the first and second vibration driving signals to the first and second driving signal supply lines VLa and VLb. Likewise, the signal generating circuit 40 mounted on the $n^{th}$ signal cable 30[n] may be enabled based on the $n^{th}$ enable signal EN[n] having the first logic level LL1 supplied through the first signal line SL1 of the $n^{th}$ enable signal EN[1], generate the first and second vibration driving signals based on the reference clock CLK and the sound data Sdata, and output the first and second vibration driving signals to the first and second driving signal supply lines VLa and VLb.

As described above, in the vibration apparatus according to an example embodiment of the present disclosure, the sound data Sdata output from the sound data generating circuit part 50 may be transferred to each of the first to $n^{th}$ vibration apparatuses 20[1] to 20[n] based on a serial interface type using the main cable 60 and the first to $n^{th}$ signal cables 30[1] to 30[n], and thus, a line structure between the sound data generating circuit part 50 and the first to $n^{th}$ vibration apparatuses 20[1] to 20[n] may be simplified and assemblability may be enhanced. In addition, as the signal generating circuit 40 is mounted on each of the first to $n^{th}$ signal cables 30[1] to 30[n], a circuit configuration may be simplified, and a filter circuit including an inductor and a capacitor for preventing electromagnetic interference (EMI) occurring due to a length of each of the main cable 60 and the first to $n^{th}$ signal cables 30[1] to 30[n] may be omitted.

Figure 27:
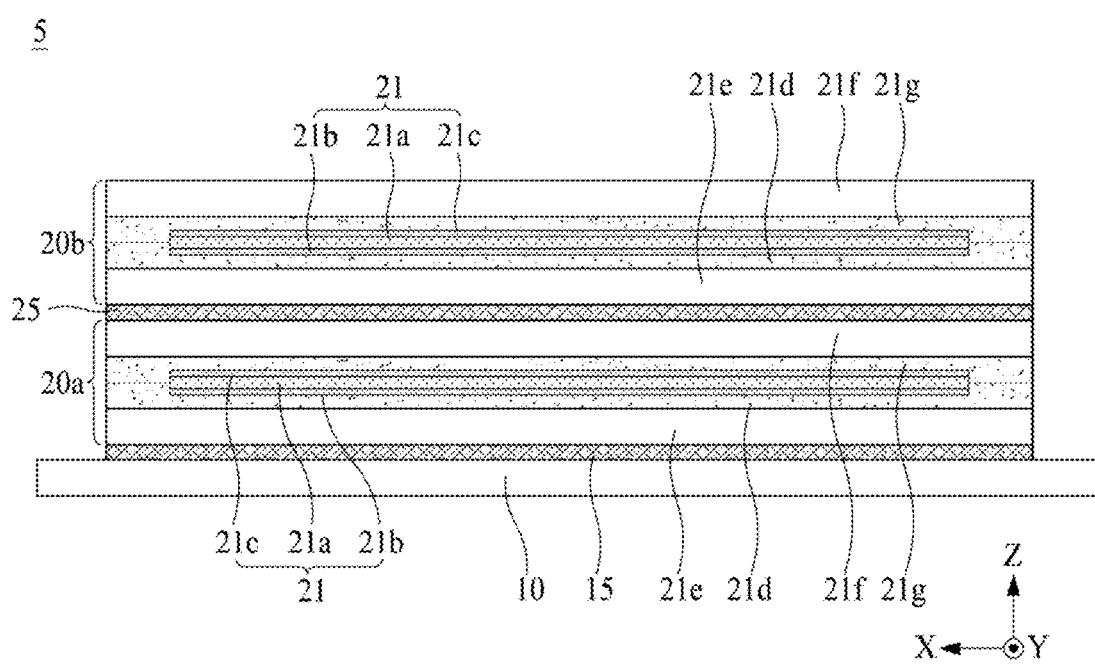
FIG. 27 illustrates a vibration apparatus according to another example embodiment of the present disclosure.
Figure 28:
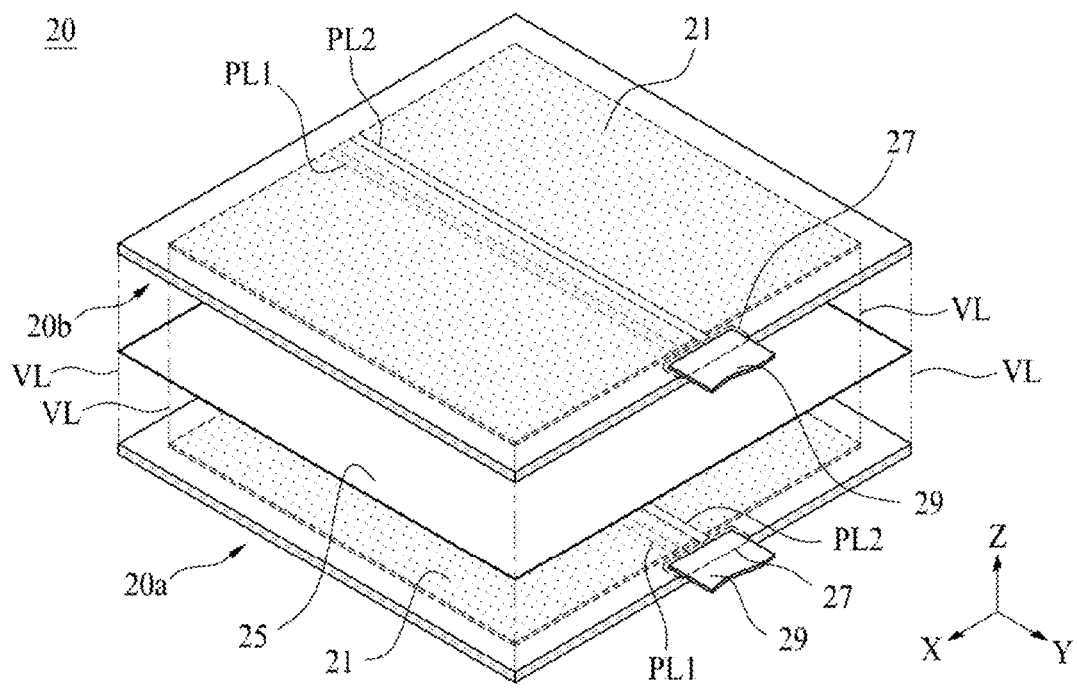
FIG. 28 illustrates an example of a vibration generator of FIG. 27.

FIG. 27 illustrates a vibration apparatus 5 according to another example embodiment of the present disclosure, and FIG. 28 illustrates an example of a vibration generator of FIG. 27.

Referring to FIGS. 27 and 28, the vibration apparatus 5 according to another example embodiment of the present disclosure may include a vibration plate 10, a vibration generator on the vibration plate 10, and a connection member between the vibration plate 10 and the vibration generator, and the vibration generator may include a first vibration structure having a first piezoelectric coefficient, a second vibration structure having a second piezoelectric coefficient which differs from the first piezoelectric coefficient, and a coupling portion 25 between the first vibration structure and the second vibration structure. Here, the first vibration structure and the second vibration structure may be opposite to each other with the coupling portion 25 therebetween, and may have, for example, a stacked structure. Accordingly, the first vibration structure may be disposed in the first vibration generator 20a, and the second vibration structure may be disposed in the second vibration generator 20b.

The coupling portion 25 may include a foam pad, a double-sided tape, or an adhesive having insulating properties, but embodiments of the present disclosure are not limited thereto. For example, the adhesive layer of the connection member 15 may include epoxy, acrylic, silicone, or urethane, but embodiments of the present disclosure are not limited thereto. The coupling portion may be referred to as a term such as an adhesive layer, a connection member, a buffer layer, or the like, but the terms are not limited thereto.

Figure 29:
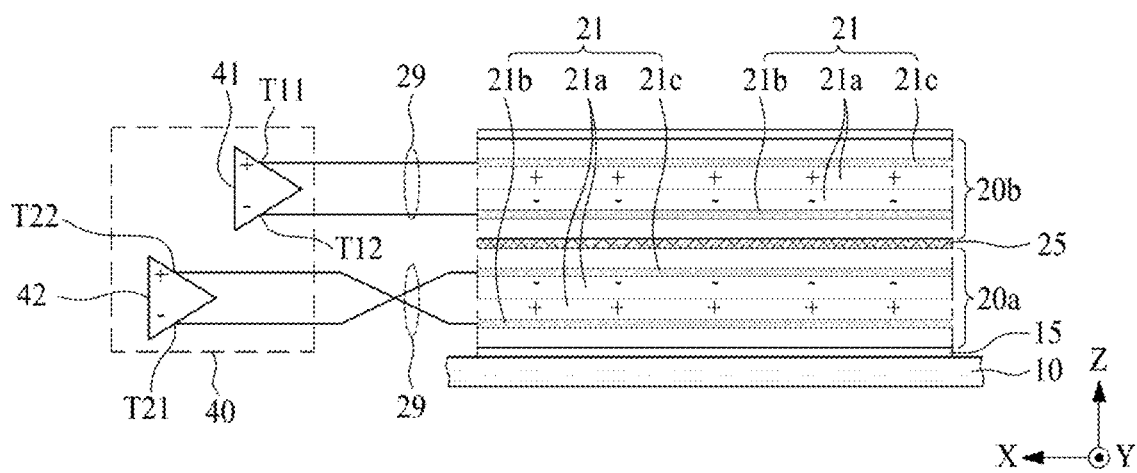
FIG. 29 illustrates a vibration driving circuit according to an example embodiment of the present disclosure.
Figure 30:
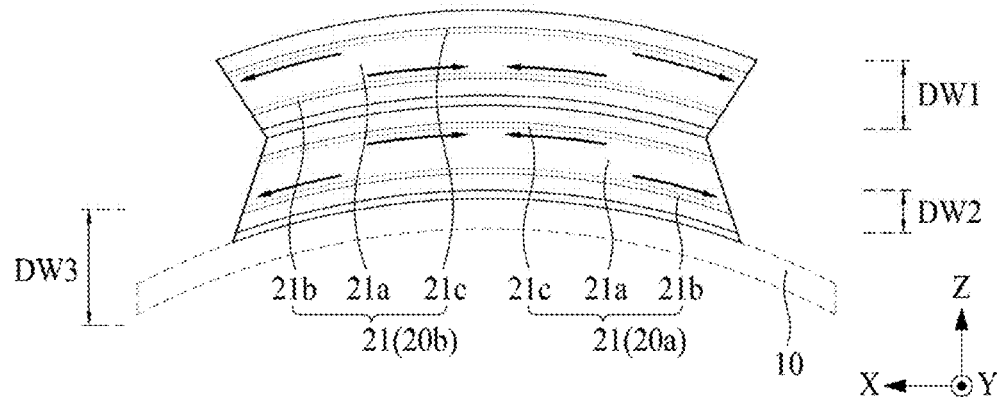
FIG. 30 illustrates a displacement of a vibration generator according to an example embodiment of the present disclosure.

FIG. 29 illustrates a signal generating circuit 40 according to an example embodiment of the present disclosure, and FIG. 30 illustrates a displacement of a vibration generator according to an example embodiment of the present disclosure.

Referring to FIGS. 29 and 30, the signal generating circuit 40 according to an example embodiment of the present disclosure may be electrically connected to a vibration apparatus 5, and generate a vibration driving signal based on a sound source and may supply the vibration driving signal to the vibration apparatus 5, thereby vibrating or displacing the vibration apparatus 5.

The signal generating circuit 40 according to an example embodiment of the present disclosure may include a plurality of amplifiers 41 and 42 connected to each of a plurality of vibration generators 20a and 20b configuring the vibration apparatus 5. For example, the signal generating circuit 40 may include first and second amplifiers 41 and 42 individually and respectively connected to first and second vibration generators 20a and 20b configuring the vibration apparatus 5. For example, the vibration driving circuit may be referred to as a signal generating circuit or a sound processing circuit, but the terms are not limited thereto.

The first amplifier 41 may generate an alternating current (AC) vibration driving signal including a first vibration driving signal and a second vibration driving signal based on the sound source.

The first amplifier 41 according to an example embodiment of the present disclosure may include a first output terminal T11 which outputs the first vibration driving signal and a second output terminal T12 which outputs the second vibration driving signal.

In the first amplifier 41, the first output terminal T11 may be electrically connected to one of a first electrode portion 21b and a second electrode portion 21c of the first vibration generator 20a. The second output terminal T12 may be electrically connected to the other of the first electrode portion 21b and the second electrode portion 21c of the first vibration generator 20a. For example, the first output terminal T11 of the first amplifier 41 may be electrically connected to the first electrode portion 21b of the first vibration generator 20a, and the second output terminal T12 of the first amplifier 41 may be electrically connected to the second electrode portion 21c of the first vibration generator 20a. For example, the first vibration driving signal output from the first output terminal T11 of the first amplifier 41 may be supplied to the first electrode portion 21b through a flexible cable 29 and a pad portion 27 of the first vibration generator 20a and a first power supply line PL1. The second vibration driving signal output from the second output terminal T12 of the first amplifier 41 may be supplied to the second electrode portion 21c through the flexible cable 29 and the pad portion 27 of the first vibration generator 20a and a second power supply line PL2.

The second amplifier 42 according to an example embodiment of the present disclosure may include a first output terminal T21 which outputs the first vibration driving signal and a second output terminal T22 which outputs the second vibration driving signal.

The first and second output terminals T21 and T22 of the first amplifier 42 may be respectively connected to the first electrode 21b and the second electrode 21c of the second vibration generator 20b so that the second vibration generator 20b is displaced (or vibrated or driven) in the same direction as a displacement direction of the first vibration generator 20a. In the second amplifier 42, the first output terminal T21 may be electrically connected to one of a first electrode portion 21b and a second electrode portion 21c of the second vibration generator 20b. The second output terminal T22 may be electrically connected to the other of the first electrode portion 21b and the second electrode portion 21c of the second vibration generator 20b. For example, the first output terminal T21 of the second amplifier 42 may be electrically connected to the second electrode portion 21c of the second vibration generator 20b, and the second output terminal T22 of the second amplifier 42 may be electrically connected to the first electrode portion 21b of the second vibration generator 20b. For example, the first vibration driving signal output from the first output terminal T21 of the second amplifier 42 may be supplied to the second electrode portion 21c through a flexible cable 29 and a pad portion 27 of the second vibration generator 20b and the second power supply line PL2. The second vibration driving signal output from the second output terminal T22 of the second amplifier 42 may be supplied to the first electrode portion 21b through the flexible cable 29 and the pad portion 27 of the second vibration generator 20b and the first power supply line PL1.

In FIG. 29 and the relevant descriptions, the signal generating circuit 40 according to an example embodiment of the present disclosure is described as including first and second amplifiers 41 and 42, but embodiments of the present disclosure are not limited thereto. For example, the signal generating circuit 40 according to an example embodiment of the present disclosure may include a plurality of (for example, three or more) amplifiers 41 and 42 corresponding to the number of vibration generators 20a and 20b included in the vibration apparatus 5. Each of the three or more amplifiers 41 and 42 may supply a vibration driving signal for displacing the three or more vibration generators 20a and 20b in the same direction. According to an example embodiment of the present disclosure, the three or more vibration generators 20a and 20b may include first and second groups and the plurality of amplifiers 41 and 42 may include first and second groups, so that the three or more vibration generators 20a and 20b are displaced (or vibrated or driven) in the same direction.

A vibration generator 20a of a first group (for example, an odd-numbered vibration generator) may be displaced by a vibration driving signal applied from an amplifier 41 (for example, an odd-numbered amplifier) of a first amplifier group and a vibration generator 20b of a second group (for example, an even-numbered vibration generator) may be displaced by a vibration driving signal applied from an amplifier 42 (for example, an even-numbered amplifier) of a second amplifier group, and thus, the three or more vibration generators 20a and 20b may be displaced (or vibrated or driven) in the same direction. For example, in the amplifier 41 of the first amplifier group, the first output terminal T11 may be electrically connected to the first electrode portion 21b of the vibration generator 20a of the first group, and the second output terminal T12 may be electrically connected to the second electrode portion 21c of the vibration generator 20a of the first group. In addition, in the amplifier 42 of the second amplifier group, the first output terminal T21 may be electrically connected to the second electrode portion 21c of the vibration generator 20b of the second group, and the second output terminal T22 may be electrically connected to the first electrode portion 21b of the vibration generator 20b of the second group.

Referring to FIG. 30, first and second vibration generators 20a and 20b according to an example embodiment of the present disclosure may be displaced (or vibrate or driven) at a third amplitude DW3 based on a vibration driving signal, with respect to a thickness direction Z of a vibration plate 10. The first and second vibration generators 20a and 20b may be displaced (or vibrate or driven) in the same direction based on a stacked structure where the first and second vibration generators 20a and 20b overlap, and thus, a vibration apparatus including the first and second vibration generators 20a and 20b of the stacked structure may be displaced (or vibrate or driven) at a relatively larger amplitude than a vibration apparatus including one vibration generator or a vibration generator having a single structure. For example, a vibration portion 21a of each of the first and second vibration generators 20a and 20b may include a first region (or a first polarization region or a first poling region) adjacent to the first electrode portion 21b and a second region (or a second polarization region or a second poling region) adjacent to the second electrode portion 21c. The vibration portion 21a of the first vibration generator 20a may be displaced (or vibrated or driven) at the first amplitude DW1 based on expansion of a first region based on a positive (+) vibration driving signal and contraction of a second region based on a negative (−) vibration driving signal, and simultaneously, the vibration portion 21a of the second vibration generator 20b may be displaced (or vibrated or driven) at the second amplitude DW2 based on contraction of a first region based on the negative (−) vibration driving signal and expansion of a second region based on the positive (+) vibration driving signal. Therefore, the vibration plate 10 may be displaced (or vibrated or driven) at a third amplitude DW3 corresponding to a first amplitude DW1 of the first vibration generator 20a and a second amplitude DW2 of the second vibration generator 20b, and thus, may vibrate at a relatively larger amplitude than a vibration based on one vibration generator or a vibration generator having a single structure. For example, the vibration apparatus 5 according to an example embodiment of the present disclosure may allow a driving direction of a vibration apparatus to match a driving direction of a vibration apparatus including one vibration generator or a vibration generator having a single structure, and thus, a driving force of the vibration apparatus 5 may be maximized or enhanced. Accordingly, a displacement amount (or a bending force) or an amplitude displacement of the vibration plate 10 may increase (or maximized), and thus, a sound characteristic and a sound pressure level characteristic of a sound of a middle-low-pitched sound band generated based on a vibration of the vibration plate 10 may be enhanced.

Figure 31A:
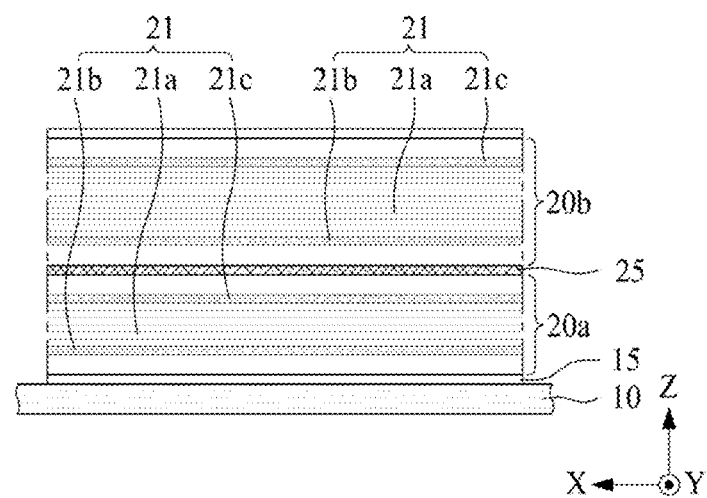
FIGS. 31A and 31B are cross-sectional views of a vibration apparatus according to other example embodiments of the present disclosure.
Figure 31B:
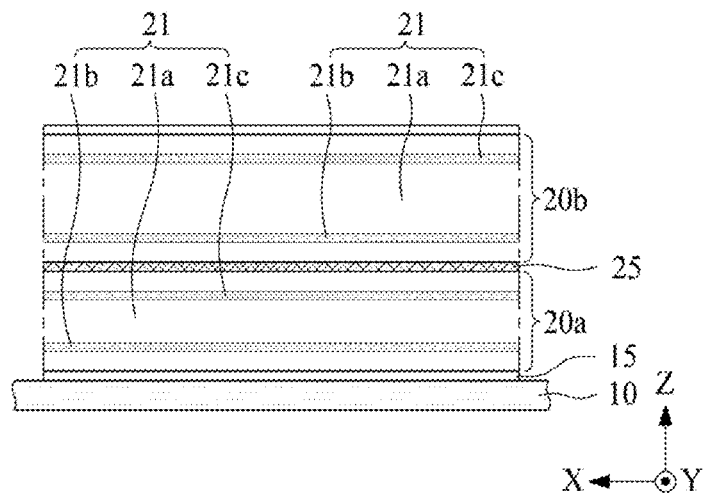

FIGS. 31A and 31B are cross-sectional views of a vibration apparatus 5 according to another example embodiment of the present disclosure.

Referring to FIGS. 31A and 31B, to maximize or increase a displacement amount or an amplitude displacement of the vibration apparatus 5, the number of stacks of a vibration portion 21a of a first vibration structure and a vibration portion 21a of a second vibration structure may be differently implemented, and for example, the number of stacks of the vibration portion 21a of the first vibration structure may be implemented to be greater than that of the vibration portion 21a of the second vibration structure. According to another example embodiment of the present disclosure, to maximize or increase the displacement amount or the amplitude displacement of the vibration apparatus 5, a thickness or a volume of the vibration portion 21a of the first vibration structure and a thickness or a volume of the vibration portion 21a of the second vibration structure may be differently implemented, and for example, the thickness or volume of the vibration portion 21a of the first vibration structure may be implemented to be thicker or greater than that of the vibration portion 21a of the second vibration structure. According to another example embodiment of the present disclosure, the vibration portion 21a of the first vibration structure and the vibration portion 21a of the second vibration structure may have the same polarization direction (or poling direction).

Figure 32:
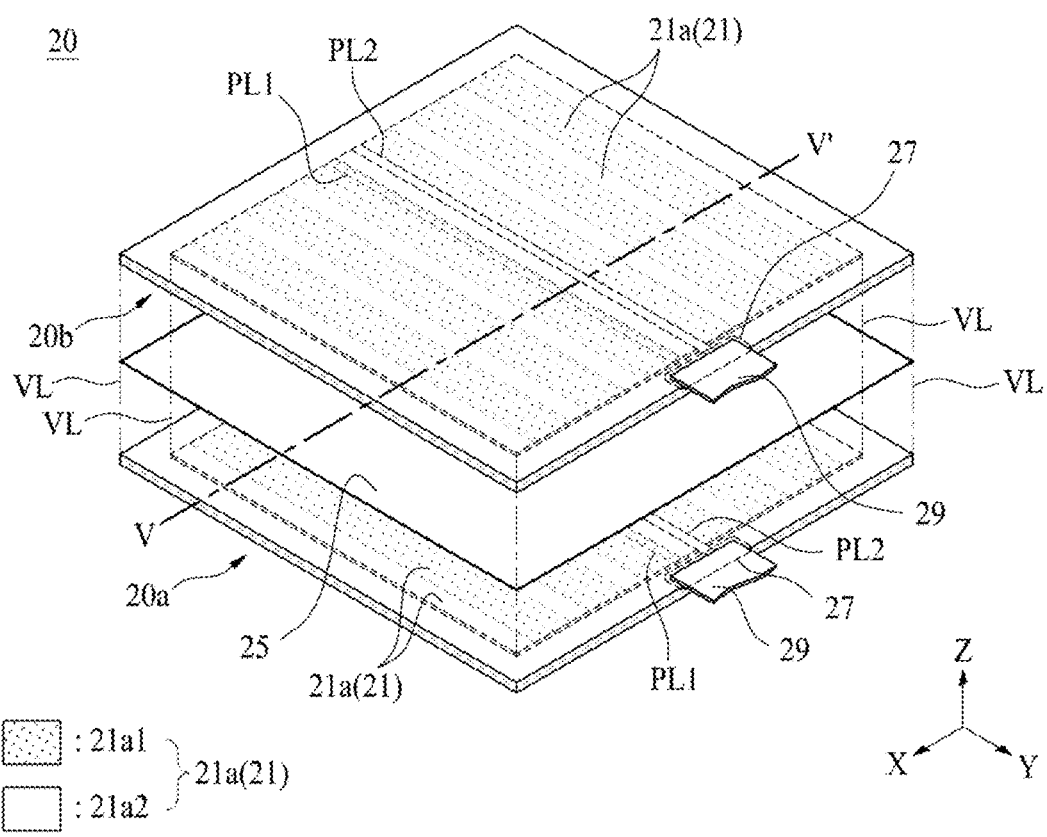
FIG. 32 illustrates a vibration generator according to another example embodiment of the present disclosure.
Figure 33:
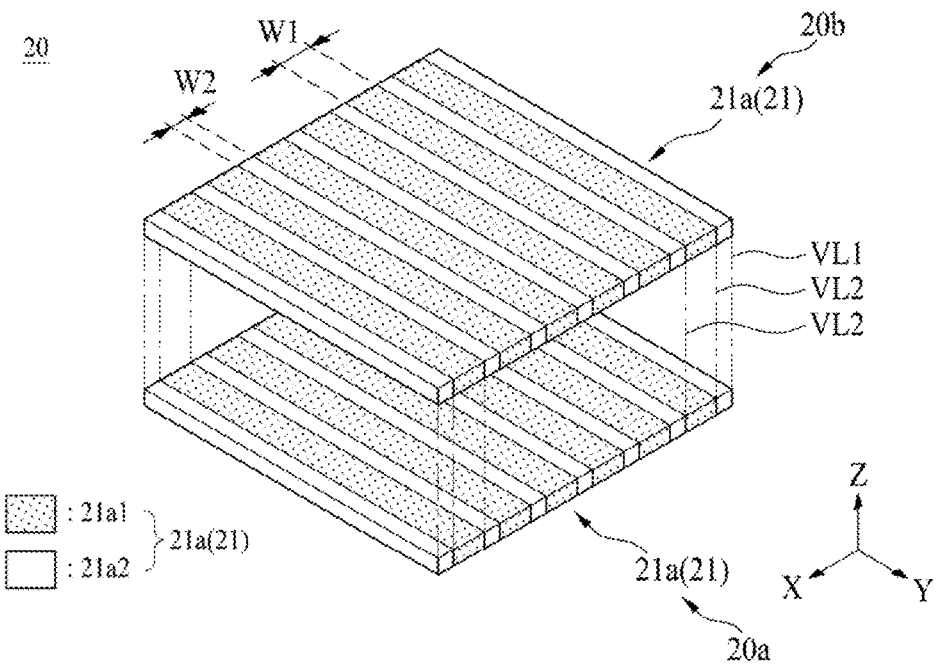
FIG. 33 illustrates an example of a vibration structure illustrated in FIG. 32.
Figure 34:
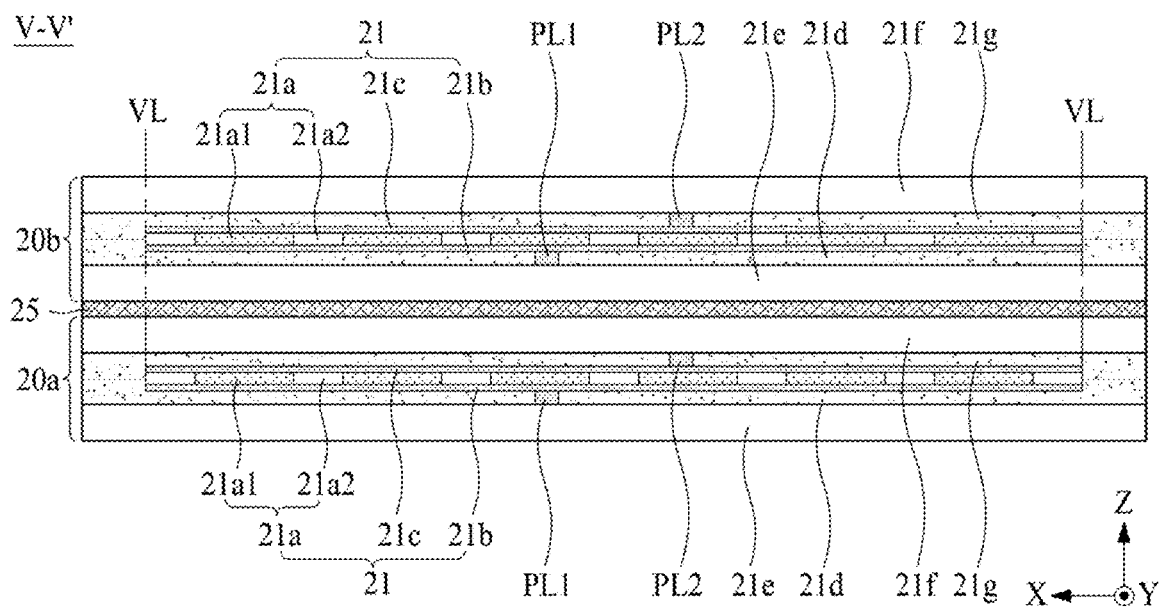
FIG. 34 is an example of a cross-sectional view taken along line V-V' illustrated in FIG. 32.

FIG. 32 illustrates a vibration generator according to another example embodiment of the present disclosure. FIG. 33 illustrates an example of a vibration structure illustrated in FIG. 32. FIG. 34 is an example of a cross-sectional view taken along line V-V' illustrated in FIG. 32 and illustrates an example embodiment implemented by modifying a vibration structure in the vibration apparatus illustrated in FIG. 27. Hereinafter, therefore, the elements except a vibration structure and relevant elements are referred to by like reference numerals, and their repeated descriptions may be omitted for brevity or will be briefly given.

Referring to FIGS. 32 to 34, in a vibration apparatus 5 according to another example embodiment of the present disclosure, each of vibration structures 21 of first and second vibration generators 20a and 20b may include a vibration portion 21a, a first electrode portion 21b, and a second electrode portion 21c.

The vibration portion 21a may include a piezoelectric material having a piezoelectric effect, a composite piezoelectric material, or an electroactive material. The vibration portion 21a may include an inorganic material and an organic material. For example, the vibration portion 21a may include a plurality of inorganic material portions including a piezoelectric material and at least one organic material portion including a ductile material. For example, the vibration portion 21a may be referred to as a term such as a piezoelectric vibration portion, a piezoelectric composite layer, a piezoelectric composite, or a piezoelectric ceramic composite, but the terms are not limited thereto. The vibration portion 21a may include a transparent piezoelectric material, a semitransparent piezoelectric material, or an opaque piezoelectric material, and the vibration portion 21a may be transparent, semitransparent, or opaque. Each of the first and second vibration generators 20a and 20b or the vibration structure 21 including the vibration portion 21a may be referred to as a term such as a flexible vibration generator, a flexible actuator, a flexible speaker, a flexible piezoelectric speaker, a film actuator, a film-type piezoelectric composite actuator, a film speaker, a film-type piezoelectric speaker, or a film-type piezoelectric composite speaker, but the terms are not limited thereto.

The vibration portion 21a according to an example embodiment of the present disclosure may include a plurality of first portions 21a1 and a plurality of second portions 21a2. For example, the plurality of first portions 21a1 and the plurality of second portions 21a2 may be alternately and repeatedly arranged in a first direction X (or a second direction Y). For example, the first direction X may be a widthwise direction of the vibration portion 21a and the second direction Y may be a lengthwise direction of the vibration portion 21a intersecting with the first direction X, but embodiments of the present disclosure are not limited thereto. For example, the first direction X may be a lengthwise direction of the vibration portion 21a, and the second direction Y may be a widthwise direction of the vibration portion 21a.

Each of the plurality of first portions 21a1 may include an inorganic material portion. The inorganic material portion may include a material described above. For example, each of the plurality of first portions 21a1 may include substantially the same material as that of each of the plurality of first portions 21a1 described above with reference to FIG. 18, and thus, their repeated descriptions may be omitted for brevity.

Each of the plurality of first portions 21a1 according to an example embodiment of the present disclosure may be disposed between the plurality of second portions 21a2. The plurality of second portions 21a2 may be disposed (or arranged) with the plurality of first portions 21a1 therebetween. Each of the plurality of first portions 21a1 may have a first width W1 parallel to the first direction X (or the second direction Y) and a length parallel to the second direction Y (or the first direction X). Each of the plurality of second portions 21a2 may have a second width W2 parallel to the first direction X (or the second direction Y) and a length parallel to the second direction Y (or the first direction X). The first width W1 may be the same as or different from the second width W2. All of the plurality of second portions 21a2 may have the same size (for example, a width, an area, or a volume). For example, all of the plurality of second portions 21a2 may have the same size (for example, a width, an area, or a volume) within a process error (or an allowable error or a tolerance error) occurring in a manufacturing process. For example, the first width W1 may be greater than the second width W2. For example, the first portion 21a1 and the second portion 21a2 may include a line shape or a stripe shape having the same size or different sizes. Accordingly, the vibration portion 21a may have a 2-2 composite structure and may have a resonance frequency of 20 kHz or less, but embodiments of the present disclosure are not limited thereto. For example, the resonance frequency of the vibration portion 21a may vary based on one or more of a shape, a length, or a thickness.

In the vibration portion 21a, the plurality of first portions 21a1 and the plurality of second portions 21a2 may be disposed (or arranged) in parallel on the same plane (or the same layer). Each of the plurality of second portions 21a2 may be configured to fill a gap between two adjacent first portions 21a1. Each of the plurality of second portions 21a2 may be connected or adhered to an adjacent first portion 21a1. Each of the plurality of second portions 21a2 may be configured to fill a gap between two adjacent first portions 21a1 and may be connected or adhered to an adjacent first portion 21a1. Accordingly, the vibration portion 21a may extend up to a desired size or length based on a lateral connection (or a lateral coupling) between the first portion 21a1 and the second portion 21a2.

In the vibration portion 21a, the width W2 of each of the plurality of second portions 21a2 may decrease progressively in a direction from a center portion of the vibration portion 21a to both edge portions (or both ends or both periphery portions) thereof.

According to an example embodiment of the present disclosure, when the vibration portion 21a vibrates in a vertical direction Z (or a thickness direction), a second portion 21a2 having a largest width W2 among the plurality of second portions 21a2 may be disposed at a portion on which a relatively largest stress concentrates. When the vibration portion 21a vibrates in the vertical direction Z, a second portion 21a2 having a smallest width W2 among the plurality of second portions 21a2 may be disposed at a portion where a relatively smallest stress occurs. For example, the second portion 21a2 having the largest width W2 among the plurality of second portions 21a2 may be disposed at a center portion of the piezoelectric vibration portion 21a, and the second portion 21a2 having the smallest width W2 among the plurality of second portions 21a2 may be disposed at both edge portions (or both periphery portions) of the vibration portion 21a. Accordingly, when the vibration portion 21a vibrates in the vertical direction Z, an overlap of a resonance frequency or interference of a sound wave occurring at a portion on which a largest stress concentrates may be minimized. Accordingly, a dip of a sound pressure level occurring in a low-pitched sound band may be reduced, and the flatness of a sound characteristic may be improved in the low-pitched sound band. For example, flatness may be a size of a deviation between a highest sound pressure level and a lowest sound pressure level.

In the vibration portion 21a, the plurality of first portions 21a1 may have different sizes (or widths). For example, a size (or a width) of each of the plurality of first portions 21a1 may decrease or increase progressively in a direction from the center portion of the vibration portion 21a to both edge portions (or both ends or both periphery portions) thereof. In this case, a sound pressure level characteristic of a sound of the vibration portion 21a may be enhanced by various natural vibration frequencies based on vibrations of the plurality of first portions 21a1 having different sizes, and a reproduction band of a sound may extend.

Each of the plurality of second portions 21a2 may be disposed between the plurality of first portions 21a1. Therefore, in the vibration portion 21a, vibration energy based on a link in a unit lattice of the first portion 21a1 may be increased by the second portion 21a2, and thus, a vibration characteristic may increase and a piezoelectric characteristic and flexibility may be secured. For example, the second portion 21a2 may include one of an epoxy-based polymer, an acrylic-based polymer, and a silicone-based polymer, but embodiments of the present disclosure are not limited thereto.

Each of the plurality of second portions 21a2 according to an example embodiment of the present disclosure may be configured with an organic material portion. For example, the organic material portion may be disposed between two adjacent inorganic material portions, and thus, may absorb an impact applied to the inorganic material portion (or the first portion) and may release a stress concentrating on the inorganic material portion, thereby enhancing the durability of the vibration portion 21a and realizing the flexibility of the vibration portion 21a.

The second portion 21a2 according to an example embodiment of the present disclosure may have a modulus and viscoelasticity that are lower than those of the first portion 21a1, and thus, the second portion 21a2 may enhance the reliability of the first portion 21a1 vulnerable to an impact due to a fragile characteristic of the first portion 21a1.

For example, when the vibration apparatus 5 for vibrating a vibration plate 1 has an impact resistance and high stiffness, the vibration apparatus 5 may have a maximum vibration characteristic. In order for the vibration apparatus 5 to have an impact resistance and high stiffness, the plurality of second portions 21a2 may each include a material having a relatively high damping factor (tan $\delta$) and relatively high stiffness. For example, the plurality of second portions 21a2 may each include a material having a damping factor (tan $\delta$) of about 0.1 Gpa (Giga Pascal) to about 1 Gpa (Giga Pascal) and a relatively high stiffness of about 0 Gpa to about 10 Gpa. In addition, a damping factor (tan $\delta$) and a stiff characteristic may be described based on a correlation between a loss coefficient and modulus, and in this case, the plurality of second portions 21a2 may each include a material having a loss coefficient of about 0.01 to about 1 and a modulus of about 1 Gpa to about 10 Gpa.

The organic material portion included in the second portion 21a2 may each include an organic material or an organic polymer having a flexible characteristic compared to the inorganic material portion which is the first portion 21a1. For example, the plurality of second portions 21a2 may each include an organic material, an organic polymer, an organic piezoelectric material, or an organic non-piezoelectric material. For example, each of the plurality of second portions 21a2 may be referred to as an adhesive portion, a stretch portion, an elastic portion, a bending portion, a damping portion, a flexible portion, or a ductile portion each having flexibility, but the terms are not limited thereto.

The organic material portion including the organic piezoelectric material may absorb an impact applied to the inorganic material portion (or the first portion), and thus, may enhance the total durability of the vibration apparatus 5 and may provide a piezoelectric characteristic corresponding to a certain level or more. The organic piezoelectric material according to an example embodiment may be an organic material having an electroactive material. For example, the organic piezoelectric material may include at least one of polyvinylidene fluoride (PVDF), β-polyvinylidene fluoride (β-PVDF), and polyvinylidene-trifluoroethylene (PVDF-TrFE), but embodiments of the present disclosure are not limited thereto.

The organic material portion including the organic non-piezoelectric material may include a curable resin composition and an adhesive including the curable resin composition, and thus, may absorb an impact applied to the inorganic material portion (or the first portion), thereby enhancing the total durability of the vibration apparatus 5. The organic non-piezoelectric material according to an example embodiment may include at least one of an epoxy-based polymer, an acrylic-based polymer, and a silicone-based polymer, but embodiments of the present disclosure are not limited thereto.

For example, the organic material portion including the organic non-piezoelectric material may include an adhesion promoter for adhesiveness between epoxy resin and an inorganic material portion, for a high stiffness characteristic needed for the vibration apparatus 5. For example, the adhesion promoter may be phosphate or the like. The organic material portion may be cured by at least one curing process of a thermal curing process and a photo-curing process. In a process of curing the organic material portion, solvent free type epoxy resin may be used for preventing the thickness uniformity of the vibration apparatus 5 from being reduced by contraction of the organic material portion caused by volatilization of a solvent.

Moreover, the organic material portion including the organic non-piezoelectric material may further include a reinforcing agent, for a damping characteristic in addition to high stiffness of the vibration apparatus 5. For example, the reinforcing agent may be methylmethacrylate-butadiene-styrene (MBS) having a core-shell type, and a content thereof may be about 5 wt % to about 40 wt %. The reinforcing agent may be an elastic body having the core cell type and may have a high coupling force to epoxy resin such as an acrylic-based polymer, and thus, may enhance an impact resistance or a damping characteristic of the vibration apparatus 5.

The plurality of first portions 21*a*1 and the plurality of second portions 21*a*2 may be disposed on (or connected to) the same plane, and thus, the vibration portion 21*a* according to an example embodiment of the present embodiment may be formed of a single thin film. For example, the vibration portion 21*a* may have a structure where the plurality of first portions 21*a*1 are connected to one side thereof. For example, the vibration portion 21*a* may have a structure where the plurality of first portions 21*a*1 are connected in all of the piezoelectric vibration portion 21*a*. For example, the vibration portion 21*a* may be vibrated in a vertical direction by the first portion 21*a*1 having a vibration characteristic and may be bent in a curved shape by the second portion 21*a*2 having flexibility. In addition, in the vibration portion 21*a* according to an example embodiment of the present disclosure, a size of the first portion 21*a*1 and a size of the second portion 21*a*2 may be adjusted based on a piezoelectric characteristic and flexibility needed for the vibration portion 21*a* or the vibration device 21. For example, in the vibration portion 21*a* requiring a piezoelectric characteristic rather than flexibility, a size of the first portion 21*a*1 may be adjusted to be greater than that of the second portion 21*a*2. As another example, in the vibration portion 21*a* requiring flexibility rather than a piezoelectric characteristic, a size of the second portion 21*a*2 may be adjusted to be greater than that of the first portion 21*a*1. Accordingly, a size of the vibration portion 21*a* may be adjusted based on a desired characteristic, and the vibration portion 21*a* may be easily designed.

The vibration structure 21 of the first vibration generator 20*a* and the vibration structure 21 of the second vibration generator 20*b* may have the same size and may overlap, in order to maximize or increase a displacement amount or an amplitude displacement of the vibration apparatus 5. For example, each first portion 21*a*1 (end portion or end or outer surface or each edge portion or each periphery portion) of the vibration structure 21 (or the vibration portion 21*a*) of the first vibration generator 20*a* may be substantially aligned or overlap not to be staggered with each first portion 21*a*1 (end portion or end or outer surface or each edge portion or each periphery portion) of the vibration structure 21 (or the vibration portion 21*a*) of the second vibration generator 20*b*. For example, each first portion 21*a*1 (end portion or end or outer surface or each edge portion or each periphery portion) of the vibration structure 21 (or the vibration portion 21*a*) of the first vibration generator 20*a* may be substantially aligned or overlap not to be staggered with each first portion 21*a*1 (end portion or end or outer surface or each edge portion or each periphery portion) of the vibration structure 21 (or the vibration portion 21*a*) of the second vibration generator 20*b* within an error range in a manufacturing process. For example, each first portion 21*a*1 (end portion or end or outer surface or each edge portion or each periphery portion) of the vibration structure 21 (or the vibration portion 21*a*) of the first vibration generator 20*a* may be aligned in a virtual first extension line VL2 or may be disposed in the first extension line VL2. For example, each first portion 21*a*1 (end portion or end or outer surface or each edge portion or each periphery portion) of the vibration structure 21 (or the vibration portion 21*a*) of the first vibration generator 20*a* may be accurately aligned in a virtual first extension line VL2 or may be accurately disposed in the first extension line VL2. Each first portion 21*a*1 (end portion or end or outer surface or each edge portion or each periphery portion) of the vibration structure 21 (or the vibration portion 21*a*) of the second vibration generator 20*b* may be aligned in the first extension line VL2 or may be disposed in the first extension line VL2. For example, each first portion 21*a*1 (end portion or end or outer surface or each edge portion or each periphery portion) of the vibration structure 21 (or the vibration portion 21*a*) of the second vibration generator 20*b* may be accurately aligned in the first extension line VL2 or may be accurately disposed in the first extension line VL2.

According to an example embodiment of the present disclosure, the plurality of first portions 21*a*1 of the first vibration generator 20*a* and the plurality of first portions 21*a*1 of the second vibration generator 20*b* may have the same size and may substantially overlap or overlay not to be staggered. For example, the plurality of first portions 21*a*1 of the first vibration generator 20*a* and the plurality of first portions 21*a*1 of the second vibration generator 20*b* may have the same size and may substantially overlap or overlay within an error range of a manufacturing process so as not to be staggered. According to an example embodiment of the present disclosure, the first portion of each of the plurality of first portions 21*a*1 of the first vibration generator 20*a* and the first portion of each of the plurality of first portions 21*a*1 of the second vibration generator 20*b* may substantially overlap or overlay not to be staggered. For example, the first portion of each of the plurality of first portions 21a1 of the first vibration generator 20a and the first portion of each of the plurality of first portions 21a1 of the second vibration generator 20b may have the same size and may substantially overlap or overlay within the error range of the manufacturing process so as not to be staggered. For example, the first portion of each of the plurality of first portions 21a1 of the first vibration generator 20a and the first portion of each of the plurality of first portions 21a1 of the second vibration generator 20b may be aligned in a second extension line VL2 or may be disposed in the second extension line VL2 so as not to be staggered. For example, the first portion of each of the plurality of first portions 21a1 of the first vibration generator 20a and the first portion of each of the plurality of first portions 21a1 of the second vibration generator 20b may be accurately aligned in the second extension line VL2 or may be accurately disposed in the second extension line VL2 within the error range of the manufacturing process so as not to be staggered.

According to an example embodiment of the present disclosure, the plurality of second portions 21a2 of the first vibration generator 20a and the plurality of second portions 21a2 of the second vibration generator 20b may have the same size and may substantially overlap or overlay not to be staggered. For example, the plurality of second portions 21a2 of the first vibration generator 20a and the plurality of second portions 21a2 of the second vibration generator 20b may have the same size and may substantially overlap or overlay within the error range of the manufacturing process so as not to be staggered. For example, each of the plurality of second portions second portions 21a2 of the first vibration generator 20a and each of the plurality of second portions 21a2 of the second vibration generator 20b may substantially overlap or overlay not to be staggered. For example, each of the plurality of second portions second portions 21a2 of the first vibration generator 20a and each of the plurality of second portions 21a2 of the second vibration generator 20b may be aligned in the first extension line VL1 or the second extension line VL2 or may be disposed in the first extension line VL1 or the second extension line VL2 so as not to be staggered. For example, the first portion of each of the plurality of second portions 21a2 of the first vibration generator 20a and the first portion of each of the plurality of first portions second portions 21a2 of the second vibration generator 20b may be accurately aligned in the first extension line VL1 or the second extension line VL2 or may be accurately disposed in the first extension line VL1 or the second extension line VL2 within the error range of the manufacturing process so as not to be staggered. Accordingly, in the vibration apparatus 5 according to an example embodiment of the present disclosure, the vibration portion 21a of the first vibration generator 20a and the vibration portion 21a of the second vibration generator 20b may be displaced (or vibrated or driven) in the same direction, and thus, a displacement amount or an amplitude displacement may be maximized or increase, thereby increasing (or maximizing) a displacement amount (or a bending force) or an amplitude displacement of the vibration plate 10.

The first electrode portion 21b may be disposed on a first surface (or an upper surface) of the vibration portion 21a. The first electrode portion 21b may be disposed at or coupled to a first surface of each of the plurality of first portions 21a1 and a first surface of each of the plurality of second portions 21a2 in common. The first electrode portion 21b may be electrically connected to a first surface of each of the plurality of first portions 21a1. For example, the first electrode portion 21b may have a common electrode (or a single electrode or a single-body electrode) shape where the first electrode portion 21b is disposed on the entire first surface of the vibration portion 21a. For example, the first electrode portion 21b may have substantially the same shape as that of the vibration portion 21a, but embodiments of the present disclosure are not limited thereto. The first electrode portion 21b according to an example embodiment of the present disclosure may include a transparent conductive material, a semitransparent conductive material, or an opaque conductive material, but embodiments of the present disclosure are not limited thereto.

The second electrode portion 21c may be disposed on the second surface (or a rear surface), which is opposite to or different from the first surface, of the vibration portion 21a. The second electrode portion 21c may be disposed at or coupled to a second surface of each of the plurality of first portions 21a1 and a second surface of each of the plurality of second portions 21a2 in common. The second electrode portion 21c may be electrically connected to a second surface of each of the plurality of first portions 21a1. For example, the second electrode portion 21c may be disposed on the entire second surface of the vibration portion 21a. The second electrode portion 21c may have a common electrode (or a single electrode or a single-body electrode) shape. For example, the second electrode portion 21c may have substantially the same shape as that of the vibration portion 21a, but embodiments of the present disclosure are not limited thereto. The second electrode portion 21c according to an example embodiment of the present disclosure may include a transparent conductive material, a semitransparent conductive material, or an opaque conductive material, but embodiments of the present disclosure are not limited thereto.

The first electrode portion 21b may be covered by the first protection member 21e described above. The second electrode portion 21c may be covered by the second protection member 21f described above.

The vibration portion 21a of each of the first and second vibration generators 20a and 20b may be polarized (or poling) by a certain voltage applied to the first electrode portion 21b and the second electrode portion 21c in a certain temperature atmosphere, or in a temperature atmosphere that may be changed from a high temperature to a room temperature, but embodiments of the present disclosure are not limited thereto. For example, the vibration portion 21a of each of the first and second vibration generators 20a and 20b may alternately and repeatedly contract and/or expand based on an inverse piezoelectric effect based on a vibration driving signal applied to the first electrode portion 21b and the second electrode portion 21c, and thus, may vibrate. For example, the vibration portion 21a of each of the first and second vibration generators 20a and 20b may vibrate based on a vertical-direction vibration and a plane-direction vibration by the first electrode portion 21b and the second electrode portion 21c. A displacement of the vibration apparatus 5 or a displacement of the display panel may increase based on the plane-direction contraction and expansion of the vibration portion 21a, and thus, a vibration of the vibration apparatus 5 or a display panel may be more enhanced.

In FIGS. 31A to 33 and the relevant descriptions, the vibration apparatus 5 according to another example embodiment of the present disclosure is described as including the first and second vibration generators 20a and 20b, but embodiments of the present disclosure are not limited thereto. For example, the vibration apparatus 5 according to another example embodiment of the present disclosure may include a plurality of (for example, three or more) vibration generators. Even in this case, to maximize or increase a displacement amount or an amplitude displacement of the vibration apparatus 5, the plurality of vibration generators may have the same size and may overlap. According to an example embodiment of the present disclosure, a first portion 21a1 of a vibration generator 20 disposed in an upper layer (or a top layer) and a first portion 21a1 of a vibration generator disposed in a lower layer (or a bottom layer) among the three or more vibration generators may substantially overlap or overlay not to be staggered. For example, the first portion 21a1 of the vibration generator disposed in the upper layer and the first portion 21a1 of the vibration generator disposed in the lower layer among the three or more vibration generators may substantially overlap or overlay within the error range of the manufacturing process so as not to be staggered. For example, the first portion 21a1 of the vibration generator disposed in the upper layer and the first portion 21a1 of the vibration generator disposed in the lower layer among the three or more vibration generators may be aligned in a virtual extension line VL or may be disposed in the virtual extension line VL. For example, the first portion 21a1 of the vibration generator disposed in the upper layer and the first portion 21a1 of the vibration generator disposed in the lower layer among the three or more vibration generators may be accurately aligned in the virtual extension line VL or may be accurately disposed in the virtual extension line VL. In addition, a second portion 21a2 of a vibration generator disposed in the upper layer and a second portion 21a2 of a vibration generator disposed in the lower layer among the three or more vibration generators may substantially overlap or overlay not to be staggered. For example, the second portion 21a2 of the vibration generator disposed in the upper layer and the second portion 21a2 of the vibration generator disposed in the lower layer among the three or more vibration generators may substantially overlap or overlay within the error range of the manufacturing process so as not to be staggered. For example, the second portion 21a2 of the vibration generator disposed in the upper layer and the second portion 21a2 of the vibration generator disposed in the lower layer among the three or more vibration generators may be aligned in the virtual extension line VL or may be disposed in the virtual extension line VL. For example, the second portion 21a2 of the vibration generator disposed in the upper layer and the second portion 21a2 of the vibration generator disposed in the lower layer among the three or more vibration generators may be accurately aligned in the virtual extension line VL or may be accurately disposed in the virtual extension line VL.

Figure 35:
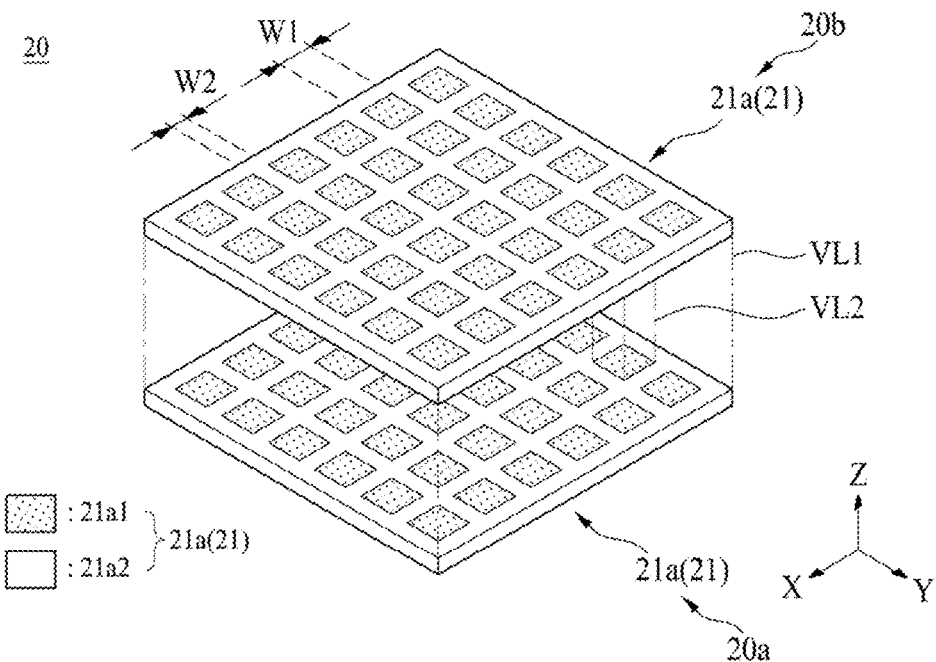
FIG. 35 illustrates a vibration apparatus according to another example embodiment of the present disclosure.

FIG. 35 illustrates a vibration apparatus according to another example embodiment of the present disclosure and illustrates an example embodiment implemented by modifying the vibration portion described above with reference to FIGS. 32 to 34. In the following description, therefore, the elements except a vibration portion are referred to by like reference numerals, and their repeated descriptions may be omitted for brevity or will be briefly given.

Referring to FIGS. 27 and 35, in the vibration generator 20 of the vibration apparatus 5 according to another example embodiment of the present disclosure, a vibration portion 21a of a vibration structure 21 included in each of first and second vibration generators 20a and 20b may include a plurality of first portions 21a1 and a second portion 21a2 disposed between the plurality of first portions 21a1. The plurality of first portions 21a1 may be spaced apart from one another in a first direction X and a second direction Y.

Each of the plurality of first portions 21a1 may be disposed apart from one another in each of the first direction X and the second direction Y. For example, each of the plurality of first portions 21a1 may have a hexahedral shape having the same size and may be arranged in a lattice shape. Each of the plurality of first portions 21a1 may include substantially the same material as that of the first portion 21a1 described above with reference to FIGS. 31A to 33, and thus, like reference numerals refer to like elements and their repeated descriptions may be omitted for brevity.

The second portion 21a2 may be disposed between the plurality of first portions 21a1 in each of the first direction X and the second direction Y. The second portion 21a2 may be configured to fill a gap between two adjacent first portions 21a1 or to surround each of the plurality of first portions 21a1, and thus, may be connected to or attached on an adjacent first portion 21a1. According to an example embodiment of the present disclosure, a width of a second portion 21a2 disposed between two first portions 21a1 adjacent to each other in the first direction X may be the same as or different from that of the first portion 21a1, and a width of a second portion 21a2 disposed between two first portions 21a1 adjacent to each other in the second direction Y may be the same as or different from that of the first portion 21a1. The second portion 21a2 may include substantially the same material as that of the second portion 21a2 described above with reference to FIGS. 31A to 33, and thus, like reference numerals refer to like elements and their repeated descriptions may be omitted for brevity.

In FIGS. 27 and 35 and the relevant descriptions, the vibration apparatus 5 according to another example embodiment of the present disclosure is described as including the first and second vibration generators 20a and 20b, but embodiments of the present disclosure are not limited thereto. For example, the vibration apparatus 5 according to another example embodiment of the present disclosure may include a plurality of (for example, three or more) vibration generators. Even in this case, to maximize or increase a displacement amount or an amplitude displacement of the vibration apparatus 5, the plurality of vibration generators may have the same size and may overlap. According to an example embodiment of the present disclosure, a first portion 21a1 of a vibration generator 20 disposed in an upper layer and a first portion 21a1 of a vibration generator disposed in a lower layer among the three or more vibration generators may substantially overlap or overlay not to be staggered. For example, the first portion 21a1 of the vibration generator disposed in the upper layer and the first portion 21a1 of the vibration generator disposed in the lower layer among the three or more vibration generators may substantially overlap or overlay within the error range of the manufacturing process so as not to be staggered. In addition, a second portion 21a2 of a vibration generator disposed in the upper layer and a second portion 21a2 of a vibration generator disposed in the lower layer among the three or more vibration generators may substantially overlap or overlay not to be staggered. For example, the second portion 21a2 of the vibration generator disposed in the upper layer and the second portion 21a2 of the vibration generator disposed in the lower layer among the three or more vibration generators may substantially overlap or overlay within the error range of the manufacturing process so as not to be staggered.

Therefore, the vibration portion 21a of each of the first vibration generator 20a and the second vibration generator 20b according to an example embodiment of the present disclosure may include a 1-3 composite structure, and thus, may have a resonance frequency of 30 MHz or less, but embodiments of the present disclosure are not limited thereto. For example, the resonance frequency of the vibration portion 21a may vary based on at least one or more of a shape, a length, or a thickness.

Figure 36:
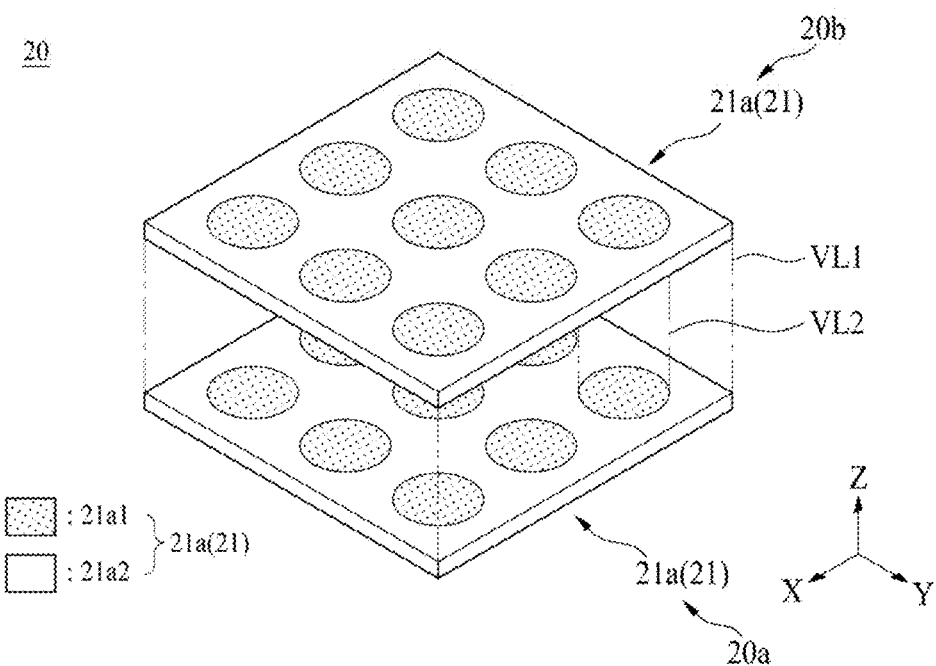
FIG. 36 illustrates a vibration apparatus according to another example embodiment of the present disclosure.

FIG. 36 illustrates a vibration apparatus according to another example embodiment of the present disclosure and illustrates an example embodiment implemented by modifying the vibration portion described above with reference to FIGS. 32 to 34. In the following description, therefore, the elements except a vibration portion are referred to by like reference numerals, and their repeated descriptions may be omitted for brevity or will be briefly given.

Referring to FIGS. 27 and 36, in the vibration generator 20 of the vibration apparatus 5 according to another example embodiment of the present disclosure, a vibration portion 21a of a vibration structure 21 included in each of first and second vibration generators 20a and 20b may include a plurality of first portions 21a1 which are apart from one another in a first direction X and a second direction Y and a second portion 21a2 disposed between the plurality of first portions 21a1.

Each of the plurality of first portions 21a1 according to an example embodiment of the present disclosure may have a planar structure having a circular shape. For example, each of the plurality of first portions 21a1 may have a circular plate shape, but embodiments of the present disclosure are not limited thereto. For example, each of the plurality of first portions 21a1 may have a dot shape including an oval shape, a polygonal shape, or a donut shape. Each of the plurality of first portions 21a1 may include substantially the same piezoelectric material as that of the first portion 21a1 described above with reference to FIG. 19, and thus, like reference numerals refer to like elements and their repeated descriptions may be omitted for brevity.

The second portion 21a2 may be disposed between the plurality of first portions 21a1 in each of the first direction X and the second direction Y. The second portion 21a2 may be configured to surround each of the plurality of first portions 21al, and thus, may be connected to or attached on a lateral surface of each of the plurality of first portions 21a1. The plurality of first portions 21a1 and the second portion 21a2 may be disposed (or arranged) in parallel on the same plane (or the same layer). The second portion 21a2 may include substantially the same organic material as that of the second portion 21a2 described above with reference to FIG. 19, and thus, like reference numerals refer to like elements and their repeated descriptions may be omitted for brevity.

In the vibration portion 21a of the first vibration generator 20a according to another example embodiment of the present disclosure, each of the plurality of first portions 21a1 may have a planar structure having a triangular shape instead of a planar structure having a circular shape. For example, each of the plurality of first portions 21a1 may have a triangular plate shape.

According to an example embodiment of the present disclosure, four adjacent first portions 21a1 of the plurality of first portions 21a1 may be disposed adjacent to one another to form a quadrilateral shape (or a square shape). A vertex of each of four adjacent first portions 21a1 forming a quadrilateral shape may be disposed adjacent to a middle portion (or a center portion) of a quadrilateral shape. According to another example embodiment of the present disclosure, six adjacent first portions 21a1 of the plurality of first portions 21a1 may be disposed adjacent to one another to form a hexagonal shape (or a regular hexagonal shape). A vertex of each of six adjacent first portions 21a1 forming a hexagonal shape may be disposed adjacent to a middle portion (or a center portion) of a hexagonal shape.

Figure 37:
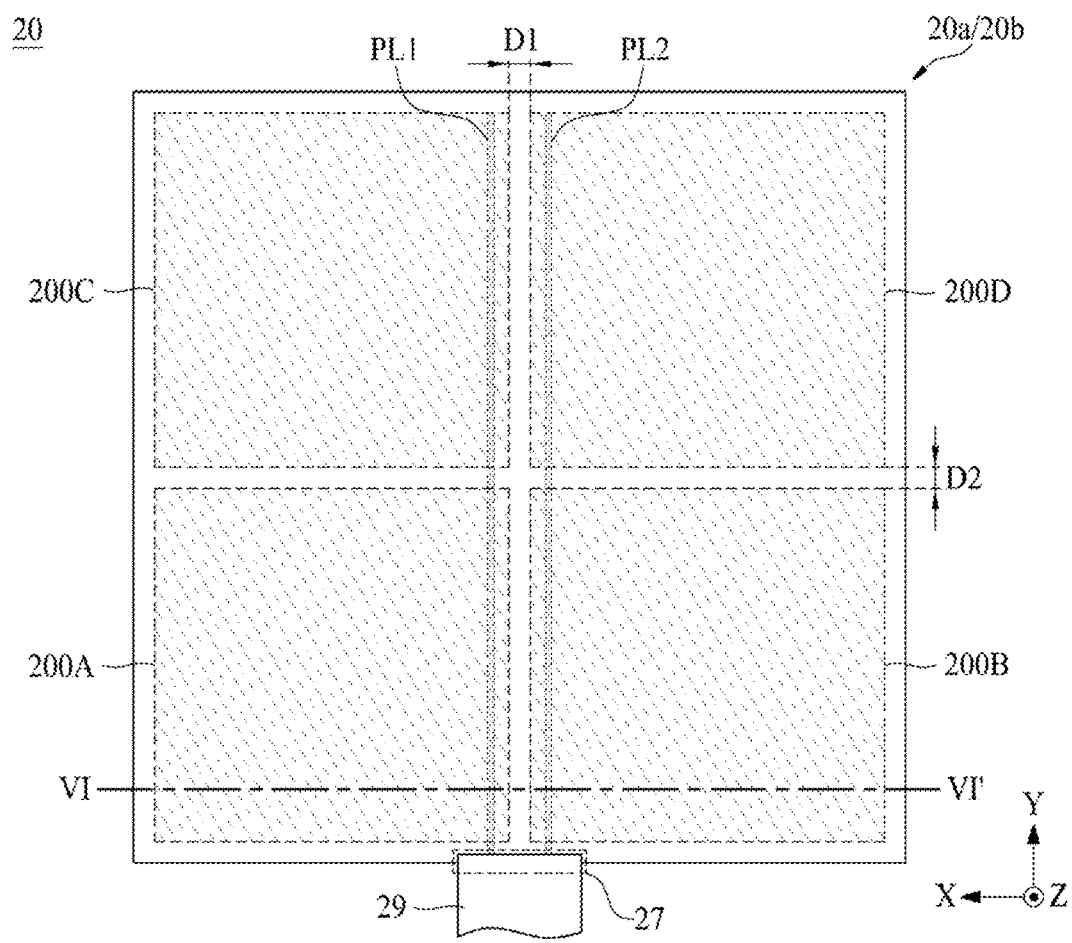
FIG. 37 illustrates a vibration apparatus according to another example embodiment of the present disclosure.
Figure 38:
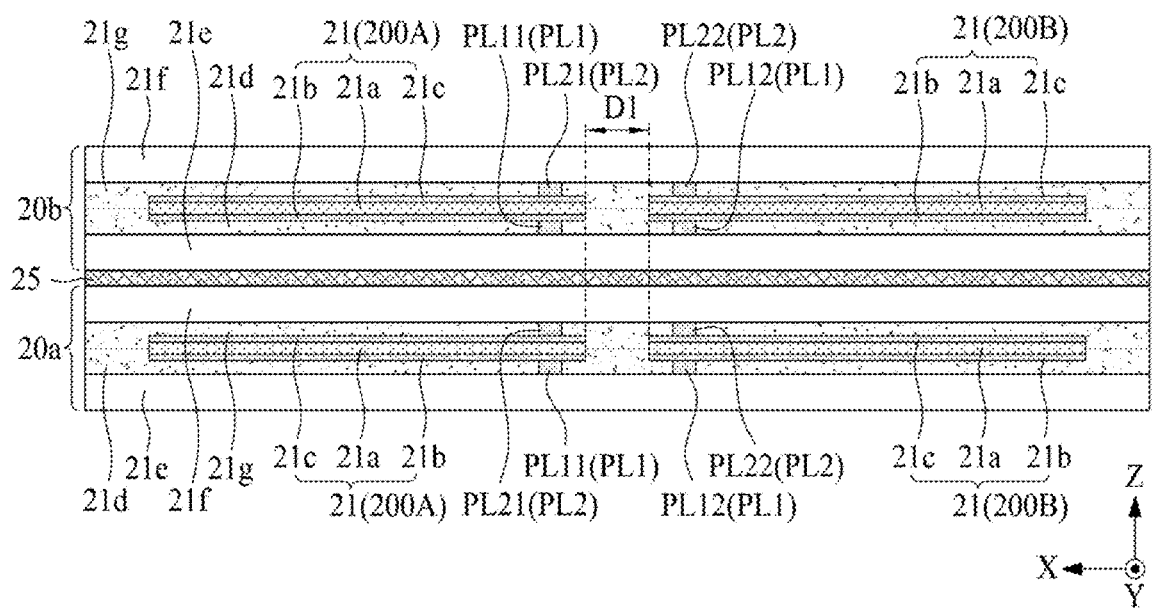
FIG. 38 is an example of a cross-sectional view taken along line VI-VI' illustrated in FIG. 37.

FIG. 37 illustrates a vibration apparatus according to another example embodiment of the present disclosure, and FIG. 38 is an example of a cross-sectional view taken along line VI-VI' illustrated in FIG. 37. The drawings illustrate an example embodiment implemented by modifying the vibration generator described above with reference to FIG. 34.

Referring to FIGS. 27, 37 and 38, in the vibration generator 20 of the vibration apparatus 5 according to another example embodiment of the present disclosure, each of a first vibration generator 20a and a second vibration generator 20b may include one or more vibration structures 200A to 200D or a plurality of vibrators 200A to 200D. In FIGS. 37 and 38, an example where four vibration structures are provided is illustrated, and each of the first vibration generator 20a and the second vibration generator 20b according to an example embodiment of the present disclosure may be configured with two or more vibration modules.

The plurality of vibration structures 200A to 200D may be electrically disconnected (or isolated) and disposed apart from one another in each of a first direction X and a second direction Y.

Each of the plurality of vibration structures 200A to 200D may alternately repeat contraction and expansion based on a piezoelectric effect to vibrate. For example, the plurality of vibration structures 200A to 200D may be arranged or tiled at a certain interval D1 in the first direction X. Accordingly, each of the first vibration generator 20a and the second vibration generator 20b where the plurality of vibration structures 200A to 200D are tiled may be a vibration module, a vibration array, a vibration array portion, a vibration module array portion, a vibration array structure, a tiling vibration array, a tiling array module, or a tiling vibration film, but the terms are not limited thereto.

Each of the plurality of vibration structures 200A to 200D according to an example embodiment of the present disclosure may have a quadrilateral shape. For example, each of the plurality of vibration structures 200A to 200D may have a quadrilateral shape having a width of 5 cm or more. For example, each of the plurality of vibration structures 200A to 200D may have a square shape having a size of 5 cm×5 cm or more, but embodiments of the present disclosure are not limited thereto.

Each of the plurality of vibration structures 200A to 200D may be arranged or tiled at a certain interval (or a certain distance), and thus, may be implemented as one vibration apparatus (or a single vibration apparatus) driven as one complete single body without being independently driven. According to an example embodiment of the present disclosure, with respect to the first direction X, a first separation distance D1 between the plurality of vibration structures 200A to 200D may be 0.1 mm or more and less than 3 cm, but embodiments of the present disclosure are not limited thereto. In addition, with respect to the second direction Y, a second separation distance D2 between the plurality of vibration structures 200A to 200D may be 0.1 mm or more and less than 3 cm, but embodiments of the present disclosure are not limited thereto. For example, the first separation distance D1 may be the same as the second separation distance D2. For example, the first separation distance D1 may be the same as the second separation distance D2 within a process error range.

According to an example embodiment of the present disclosure, the plurality of vibration structures 200A to 200D may be arranged or tiled to have a separation distance (or interval) D1 or D2 of 0.1 mm or more and less than 3 cm and thus may be driven as one vibration apparatus, and a sound pressure level characteristic of a sound and a reproduction band of a sound generated based on a single-body vibration of each of the plurality of vibration structures 200A to 200D may increase. For example, the plurality of vibration structures 200A to 200D may be arranged at an interval of 0.1 mm or more and less than 5 mm, in order to increase a reproduction band of a sound generated based on a single-body vibration of each of the plurality of vibration structures 200A to 200D and increase a sound pressure level characteristic of a sound of a low-pitched sound band (for example, at 500 Hz or less).

According to an example embodiment of the present disclosure, in a case where the plurality of vibration structures 200A to 200D are arranged at an interval D1 or D2 of less than 0.1 mm or without the interval D1 or D2, the reliability of the plurality of vibration structures 200A to 200D or the first vibration generator 20a and the second vibration generator 20b may be reduced due to damage or the occurrence of a crack caused by a physical contact between the plurality of vibration structures 200A to 200D when the plurality of vibration structures 200A to 200D are vibrating.

According to an example embodiment of the present disclosure, when the plurality of vibration structures 200A to 200D are arranged at an interval D1 or D2 of 3 cm or more, the plurality of vibration structures 200A to 200D may not be driven as one vibration apparatus due to an independent vibration of each of the plurality of vibration structures 200A to 200D. Accordingly, a sound pressure level characteristic of a sound and a reproduction band of a sound generated based on a vibration of each of the plurality of vibration structures 200A to 200D may decrease. For example, when the plurality of vibration structures 200A to 200D are arranged at an interval D1 or D2 of 3 cm or more, each of a sound characteristic and a sound pressure level characteristic in the low-pitched sound band (for example, at 500 Hz or less) may be lowered.

According to an example embodiment of the present disclosure, when the plurality of vibration structures 200A to 200D are arranged at an interval of 5 mm, each of the plurality of vibration structures 200A to 200D may not be driven as one vibration apparatus, and due to this, each of a sound characteristic and a sound pressure level characteristic in the low-pitched sound band (for example, at 200 Hz or less) may be lowered.

According to another example embodiment of the present disclosure, when the plurality of vibration structures 200A to 200D are arranged at an interval of 1 mm, the plurality of vibration structures 200A to 200D may be driven as one vibration apparatus, and thus, a reproduction band of a sound may increase and a sound pressure level characteristic of a sound in the low-pitched sound band (for example, at 500 Hz or less) may increase. For example, when the plurality of vibration structures 200A to 200D are arranged at an interval of 1 mm, a separation distance between the plurality of vibration structures 200A to 200D may be optimized, and thus, the first vibration generator 20a and the second vibration generator 20b may be implemented as a vibrator having a large area. Accordingly, the first vibration generator 20a and the second vibration generator 20b may be driven as a large-area vibrator based on a single-body vibration of the plurality of vibration structures 200A to 200D. Accordingly, a sound characteristic and a sound pressure level characteristic in the low-pitched sound band and a reproduction band of a sound generated by interconnecting a large-area vibration of each of the first vibration generator 20a and the second vibration generator 20b may increase or be enhanced.

Therefore, to implement a single-body vibration (or one vibration apparatus) of the plurality of vibration structures 200A to 200D, a separation distance between the plurality of vibration structures 200A to 200D may be set to 0.1 mm or more and less than 3 cm. In addition, to increase a sound pressure level characteristic of a sound of the low-pitched sound band along with implementing a single-body vibration (or one vibration apparatus) of the plurality of vibration structures 200A to 200D, a separation distance between the plurality of vibration structures 200A to 200D may be adjusted to 0.1 mm or more and less than 5 mm.

The first vibration generator 20a according to an example embodiment of the present disclosure may include first to fourth vibration structures 200A to 200D which are electrically disconnected (or isolated) and disposed apart from one another in each of the first direction X and the second direction Y. For example, the first to fourth vibration structures 200A to 200D may be arranged or tiled in a 2×2 form.

According to an example embodiment of the present disclosure, the first and second vibration structures 200A and 200B may be spaced apart from each other in the first direction X. The third and fourth vibration structures 200C and 200D may be spaced apart from each other in the first direction X and may be spaced apart from each of the first and second vibration structures 200A and 200B in the second direction Y. The first and third vibration structures 200A and 200C may be spaced apart from each other in the second direction Y to face each other. The second and fourth vibration structures 200B and 200D may be spaced apart from each other in the second direction Y to face each other.

Each of the first to fourth vibration structures 200A to 200D according to an example embodiment of the present disclosure may include a vibration portion 21a, a first electrode portion 21b, and a second electrode portion 21c.

The vibration portion 21a may include a ceramic-based material for implementing a relatively high vibration. For example, the vibration portion 21a may have a 1-3 composite structure having a piezoelectric characteristic of a 1-3 vibration mode or a 2-2 composite structure having a piezoelectric characteristic of a 2-2 vibration mode. For example, the vibration portion 21a may include piezoelectric ceramic like the vibration portion 21a described above with reference to FIGS. 3A to 12B or may include the first portion 21a1 and the second portion 21a2 like the vibration portion 21a described above with reference to one of FIGS. 19 to 20D, and thus, like reference numerals refer to like elements and their repeated descriptions may be omitted for brevity.

According to an example embodiment of the present disclosure, the vibration portion 21a may include a transparent, semitransparent, or opaque piezoelectric material, and thus, the vibration portion 21a may be transparent, semitransparent, or opaque.

The first electrode portion 21b may be disposed on a first surface of the vibration portion 21a and may be electrically connected to the first surface of the vibration portion 21a. This may be substantially the same as the first vibration portion 21b described above with reference to one of FIGS. 2 to 14, and thus, like reference numerals refer to like elements and their repeated descriptions may be omitted for brevity.

The second electrode portion 21c may be disposed on a second surface of the vibration portion 21a and may be electrically connected to the second surface of the vibration portion 21a. This may be substantially the same as the second vibration portion 21c described above with reference to one of FIGS. 2 to 14, and thus, like reference numerals refer to like elements and their repeated descriptions may be omitted for brevity.

Each of the first vibration generator 20a and the second vibration generator 20b according to another example embodiment of the present disclosure may further include a first protection member 21e and a second protection member 21f.

The first protection member 21e may be disposed on a first surface of each of the first vibration generator 20a and the second vibration generator 20b. For example, the first protection member 21e may cover the first electrode portion 21b disposed on a first surface of each of the plurality of vibration structures 200A to 200D, and thus, may be connected to the first surface of each of the plurality of vibration structures 200A to 200D in common or may support the first surface of each of the plurality of vibration structures 200A to 200D in common. Accordingly, the first protection member 21e may protect the first electrode 21b or the first surface of each of the plurality of vibration structures 200A to 200D.

The first protection member 21e according to an example embodiment of the present disclosure may be disposed on the first surface of each of the plurality of vibration structures 200A to 200D by a first adhesive layer 21d. For example, the first protection member 21e may be disposed at the first surface of each of the plurality of vibration structures 200A to 200D by a film laminating process by the first adhesive layer 21d. For example, the first protection member 21e may be directly disposed at the first surface of each of the plurality of vibration structures 200A to 200D by the film laminating process by the first adhesive layer 21d. Accordingly, each of the plurality of vibration structures 200A to 200D may be integrated (or disposed) or tiled into the first protection member 21e to have a certain interval D1 or D2.

The second protection member 21f may be disposed on a second surface of each of the first vibration generator 20a and the second vibration generator 20b. For example, the second protection member 21f may cover the second electrode portion 21c disposed on a second surface of each of the plurality of vibration structures 200A to 200D, and thus, may be connected to the second surface of each of the plurality of vibration structures 200A to 200D in common or may support the second surface of each of the plurality of vibration structures 200A to 200D in common. Accordingly, the second protection member 21f may protect the second electrode 21c or the second surface of each of the plurality of vibration structures 200A to 200D.

The second protection member 21f according to an example embodiment of the present disclosure may be disposed on the second surface of each of the plurality of vibration structures 200A to 200D by a second adhesive layer 21g. For example, the second protection member 21f may be disposed on the second surface of each of the plurality of vibration structures 200A to 200D by a film laminating process by the second adhesive layer 21g. For example, the second protection member 21f may be directly disposed on the second surface of each of the plurality of vibration structures 200A to 200D by the film laminating process by the second adhesive layer 21g. Accordingly, each of the plurality of vibration structures 200A to 200D may be integrated (or disposed) or tiled into the second protection member 21f to have a certain interval D1 or D2.

Each of the first and second protection members 21e and 21f according to an example embodiment of the present disclosure may include a plastic material, a fiber material, or a wood material, but embodiments of the present disclosure are not limited thereto. One of the first and second protection members 21e and 21f may be adhered or coupled to the vibration plate 10 by a connection member (or a second connection member 150b).

The first adhesive layer 21d may be disposed between the first surface of each of the plurality of vibration structures 200A to 200D and the plurality of vibration structures 200A to 200D. For example, the first adhesive layer 21d may be disposed on a rear surface (or an inner surface) of the first protection member 21e facing the first surface of each of the first vibration generator 20a and the second vibration generator 20b. For example, the first adhesive layer 21d may be disposed at the first surface of each of the plurality of vibration structures 200A to 200D and may be filled between the plurality of vibration structures 200A to 200D.

The second adhesive layer 21g may be disposed between the second surface of each of the plurality of vibration structures 200A to 200D and the plurality of vibration structures 200A to 200D. For example, the second adhesive layer 21g may be disposed at a front surface (or an inner surface) of the second protection member 21f facing the second surface of each of the first vibration generator 20a and the second vibration generator 20b. For example, the second adhesive layer 21g may be disposed at the second surface of each of the plurality of vibration structures 200A to 200D and may be filled between the plurality of vibration structures 200A to 200D.

The first and second adhesive layers 21d and 21g may be connected or coupled between the plurality of vibration structures 200A to 200D. Therefore, each of the plurality of vibration structures 200A to 200D may be surrounded by the first and second adhesive layers 21d and 21g. For example, the first and second adhesive layers 21d and 21g may fully (or completely) surround all of the plurality of vibration structures 200A to 200D. For example, the first and second adhesive layers 21d and 21g may be referred to as a cover member, but the terms are not limited thereto. When each of the first and second adhesive layers 21d and 21g is a cover member, the first protection member 21e may be disposed at a first surface of the cover member, and the second protection member 21f may be disposed at a second surface of the cover member.

Each of the first and second adhesive layers 21d and 21g according to an example embodiment of the present disclosure may include an electrically insulation material capable of compression and decompression. For example, each of the first and second adhesive layers 21d and 21g may include an epoxy resin, an acrylic resin, a silicone resin, or a urethane resin, but embodiments of the present disclosure are not limited thereto. For example, each of the first and second adhesive layers 21d and 21g may be configured to be transparent, semitransparent, or opaque.

Each of the first vibration generator 20a and the second vibration generator 20b according to another example embodiment of the present disclosure may further include a first power supply line PL1 disposed at the first protection member 21e, a second power supply line PL2 disposed at the second protection member 21f, and a pad portion 27 electrically connected to the first power supply line PL1 and the second power supply line PL2.

The first power supply line PL1 may be disposed on a rear surface of the first protection member 21e facing each of the first electrode portion 21b and the first cover member 21e. The first power supply line PL1 may be electrically connected to the first electrode portion 21b of each of the plurality of vibration structures 200A to 200D. For example, the first power supply line PL1 may be electrically connected to the first electrode portion 21b of each of the plurality of vibration structures 200A to 200D. For example, the first power supply line PL1 may be directly and electrically connected to the first electrode portion 21b of each of the plurality of vibration structures 200A to 200D. In an example embodiment of the present disclosure, the first power supply line PL1 may be electrically connected to the first electrode portion 21b of each of the plurality of vibration structures 200A to 200D by an anisotropic conductive film. In another example embodiment of the present disclosure, the first power supply line PL1 may be electrically connected to the first electrode portion 21b of each of the plurality of vibration structures 200A to 200D by a conductive material (or a particle) included in the first adhesive layer 21d.

The first power supply line PL1 according to an example embodiment of the present disclosure may include a $1\text{-}1^{st}$ power line PL11 and a $1\text{-}2^{nd}$ power line PL12 disposed in the second direction Y. For example, the $1\text{-}1^{st}$ power line PL11 may be electrically connected to a first electrode portion 21b of each of first and third vibration structures 200A and 200C (or a first group) of the plurality of vibration structures 200A to 200D. For example, the first and third vibration structures 200A and 200C may be disposed in a first row parallel to the second direction Y among the plurality of vibration structures 200A to 200D. The $1\text{-}2^{nd}$ power line PL12 may be electrically connected to a second electrode portion 21c of each of second and fourth vibration structures 200B and 200D (or a second group) of the plurality of vibration structures 200A to 200D. For example, the second and fourth vibration structures 200B and 200D may be disposed in a second row parallel to the second direction Y among the plurality of vibration structures 200A to 200D.

The second power supply line PL2 may be disposed on a first surface of the second protection member 21f facing each of the first electrode portion 21b and the first cover member 21e. For example, the first surface may be a bottom surface of the second protection member 21f The second power supply line PL2 may be electrically connected to the second electrode portion 21c of each of the plurality of vibration structures 200A to 200D. For example, the second power supply line PL2 may be electrically connected to the second electrode portion 21c of each of the plurality of vibration structures 200A to 200D. In an example embodiment of the present disclosure, the second power supply line PL2 may be electrically connected to the second electrode portion 21c of each of the plurality of vibration structures 200A to 200D by an anisotropic conductive film. In another example embodiment of the present disclosure, the second power supply line PL2 may be electrically connected to the second electrode portion 21c of each of the plurality of vibration structures 200A to 200D by a conductive material (or a particle) included in the second adhesive layer 21g.

The second power supply line PL2 according to an example embodiment of the present disclosure may include a $2\text{-}1^{st}$ power line PL21 and a $2\text{-}2^{nd}$ power line PL22 disposed in the first direction X. For example, the $2\text{-}1^{st}$ power line PL21 may be electrically connected to a second electrode portion 21c of each of the first and third vibration structures 200A and 200C (or the first group) of the plurality of vibration structures 200A to 200D. For example, the first and third vibration structures 200A and 200C may be disposed in the first row parallel to the second direction Y among the plurality of vibration structures 200A to 200D. The $2\text{-}2^{nd}$ power line PL22 may be electrically connected to a second electrode portion 21c of each of second and fourth vibration structures 200B and 200D (or the second group) of the plurality of vibration structures 200A to 200D. For example, the second and fourth vibration structures 200B and 200D may be disposed in the second row parallel to the second direction Y among the plurality of vibration structures 200A to 200D.

The pad portion 27 may be disposed in each of the first vibration generator 20a and the second vibration generator 20b so as to be electrically connected to one side (or one end or one portion) of at least one of the first power supply line PL1 and the second power supply line PL2. The pad portion 27 according to an example embodiment of the present disclosure may include a first pad electrode electrically connected to one side (or one portion) of the first power supply line PL1 and a second pad electrode electrically connected to one side (or one portion) of the second power supply line PL2.

The first pad electrode may be connected to one side (or one end or one portion) of each of the $1\text{-}1^{st}$ and $1\text{-}2^{nd}$ power lines PL11 and PL12 in common. For example, the one side (or one end or one portion) of each of the $1\text{-}1^{st}$ and $1\text{-}2^{nd}$ power lines PL11 and PL12 may branch from the first pad electrode.

The second pad electrode may be connected to one side (or one end) of each of the 2-1 and $2\text{-}2^{nd}$ power lines PL21 and PL22 in common. For example, the one side (or one end or one portion) of each of the $2\text{-}1^{st}$ and $2\text{-}2^{nd}$ power lines PL21 and PL22 may branch from the second pad electrode.

According to an example embodiment of the present disclosure, each of the first power supply line PL1, the second power supply line PL2, and the pad portion 27 may include a transparent conductive material, a semitransparent conductive material, or an opaque conductive material so as to be transparent, semitransparent, or opaque.

Each of the first vibration generator 20a and the second vibration generator 20b according to another example embodiment of the present disclosure may further include a flexible cable 29.

The flexible cable 29 may be electrically connected to the pad portion 27 disposed in each of the first vibration generator 20a and the second vibration generator 20b and may supply each of the first vibration generator 20a and the second vibration generator 20b with a vibration driving signal provided from a vibration driving circuit. The flexible cable 29 according to an example embodiment of the present disclosure may include a first terminal electrically connected to a first pad electrode of the pad portion 27 and a second terminal electrically connected to a second pad electrode of the pad portion 27. For example, the flexible cable 29 may be a flexible printed circuit cable or a flexible flat cable, but embodiments of the present disclosure are not limited thereto.

Therefore, the vibration apparatus 5 according to another example embodiment of the present disclosure may include the plurality of vibration structures 200A to 200D so that each of the first vibration generator 20a and the second vibration generator 20b is implemented as a single vibrator without being independently driven, and thus, may be driven as a large-area vibrator based on a single-body vibration of the plurality of vibration structures 200A to 200D. For example, the plurality of vibration structures 200A to 200D may be a single vibrator where the plurality of vibration structures 200A to 200D are arranged (or tiled) at a certain interval D1 or D2. Accordingly, the vibration apparatus 5 may vibrate a wide area of a display panel or may autonomously perform a large-area vibration, and thus, each of a sound characteristic and a sound pressure level characteristic in the low-pitched sound band and a reproduction band of a sound output from the display panel may increase or be enhanced.

Figure 39:
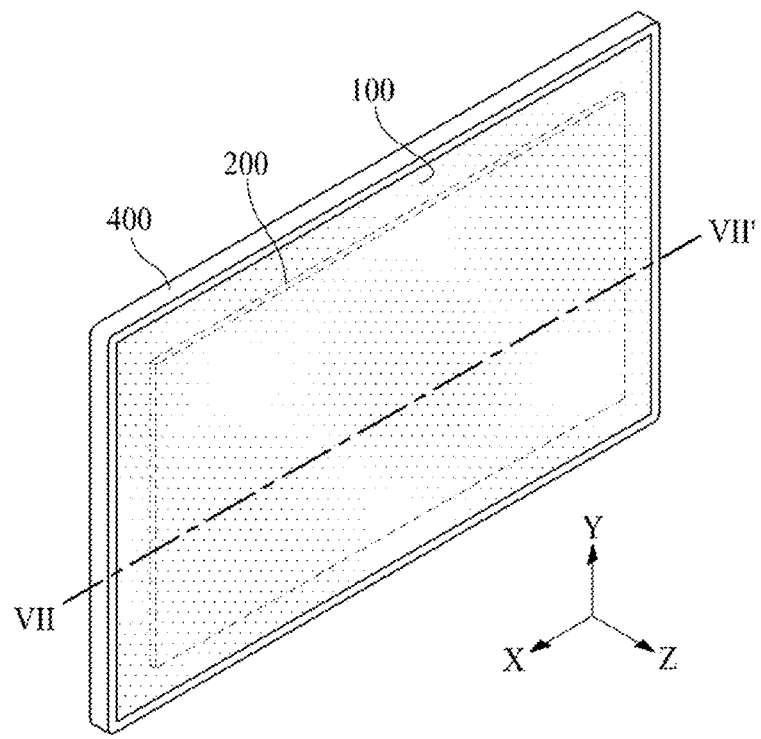
FIG. 39 illustrates an apparatus according to an example embodiment of the present disclosure.
Figure 40:
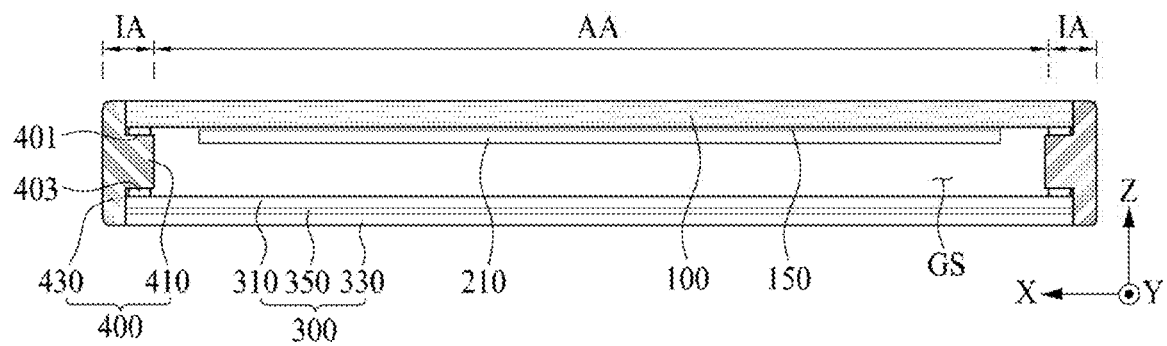
FIG. 40 is an example of a cross-sectional view taken along line VII-VII' illustrated in FIG. 39.

FIG. 39 illustrates an apparatus according to an example embodiment of the present disclosure, and FIG. 40 is an example of a cross-sectional view taken along line VII-VII' illustrated in FIG. 39.

Referring to FIGS. 39 and 40, the apparatus according to an example embodiment of the present disclosure may include a display panel 100 which displays an image and a vibration apparatus which vibrates the display panel 100 at a rear surface (or a backside surface) of the display panel 100.

The display panel 100 may display an image (for example, an electronic image or a digital image). For example, the display panel 100 may output light to display an image. The display panel 100 may be a curved display panel or any types of display panels such as a liquid crystal display panel, an organic light emitting display panel, a quantum dot light emitting display panel, a micro light emitting diode display panel, and an electrophoresis display panel. The display panel 100 may be a flexible display panel. For example, the display panel 100 may be a flexible light emitting display panel, a flexible electrophoresis display panel, a flexible electro-wetting display panel, a flexible micro light emitting diode display panel, or a flexible quantum dot light emitting display panel, but embodiments of the present disclosure are not limited thereto.

The display panel 100 according to an example embodiment of the present disclosure may include a display area AA which displays an image based on driving of a plurality of pixels. In addition, the display panel 100 may further include a non-display area IA which surrounds the display area AA, but embodiments of the present disclosure are not limited thereto.

According to an example embodiment of the present disclosure, the display panel 100 may include an anode electrode, a cathode electrode, and a light emitting device. The display panel 100 may display an image in a type such as a top emission type, a bottom emission type, or a dual emission type, based on a structure of a pixel array layer including the plurality of pixels. The top emission type may irradiate light, emitted from the pixel array layer, in a forward direction FD of a base substrate to display an image, and the bottom emission type may irradiate the light, emitted from the pixel array layer, in a rearward direction of the base substrate to display an image.

The display panel 100 according to an example embodiment of the present disclosure may include a pixel array portion which is disposed in a display area of a substrate. The pixel array portion may include the plurality of pixels which display an image based on a signal supplied to signal lines. The signal lines may include a gate line, a data line, and a pixel driving power line, or the like, but embodiments of the present disclosure are not limited thereto.

The vibration apparatus 200 may vibrate the display panel 100 at the rear surface of the display panel 100 to provide a sound and/or a haptic feedback to a user based on a vibration of the display panel 100. The vibration apparatus 200 may be implemented at the rear surface of the display panel to directly vibrate the display panel 100.

For example, the vibration apparatus 200 may vibrate based on a vibration driving signal synchronized with an image displayed by the display panel 100 and vibrate the display panel 100. As another example, the vibration apparatus 200 may vibrate based on a haptic feedback signal (or a tactile feedback signal) synchronized with a user touch applied to a touch panel (or a touch sensor layer) which is disposed on or embedded into the display panel 100, thereby vibrating the display panel 100. Accordingly, the display panel 100 may vibrate based on a vibration of the vibration apparatus 200 and provide at least one of a sound and a haptic feedback to a user (or a viewer).

The vibration apparatus 200 according to an example embodiment of the present disclosure may be implemented to have a size corresponding to a display area AA of the display panel 100. A size of the vibration apparatus 200 may be 0.9 to 1.1 times a size of the display area AA, but embodiments of the present disclosure are not limited thereto. For example, a size of the vibration apparatus 200 may be less than or equal to that of the display area AA. For example, a size of the vibration apparatus 200 may have a size which is the same as or almost equal to that of the display area AA, and thus, the vibration apparatus 200 may cover most of the region of the display panel 100, and a vibration generated by the vibration apparatus 200 may vibrate all of the display panel 100, thereby improving the satisfaction of a user and increasing a sense of localization of a sound. In addition, a contact area (or a panel coverage) between the display panel 100 and the vibration apparatus 200 may increase, and thus, a vibration area of the display panel 100 may increase, thereby improving a sound of a middle-low-pitched sound band generated based on a vibration of the display panel 100. Furthermore, the vibration apparatus 200 applied to a large-size display apparatus may vibrate all of the display panel 100 having a large size (or a large area), and thus, a sense of localization of a sound based on a vibration of the display panel 100 may be more enhanced, thereby implementing an enhanced sound effect. Accordingly, the vibration apparatus 200 according to an example embodiment of the present disclosure may be disposed at the rear surface of the display panel 100 and may sufficiently vibrate the display panel 100 in a vertical (or forward-rearward) direction, and thus, may output a desired sound in a forward direction FD of the apparatus or the display apparatus.

Figure 45:
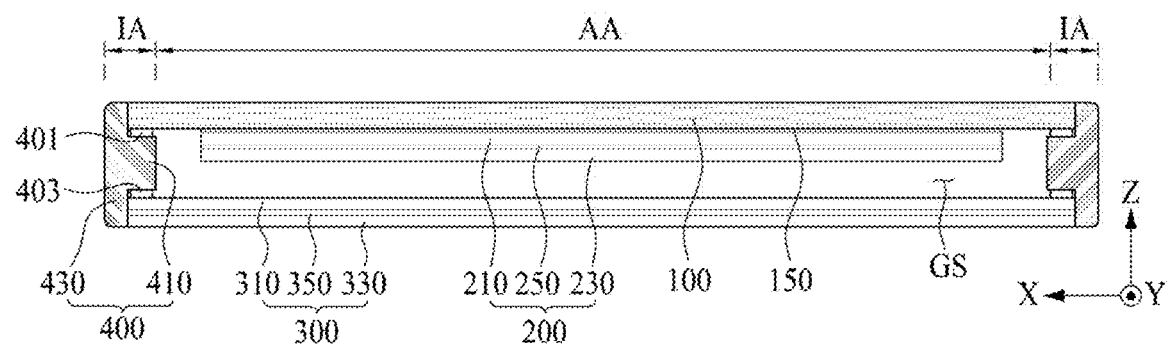
FIG. 45 is an example of another cross-sectional view taken along line VII-VII' illustrated in FIG. 39.
Figure 46:
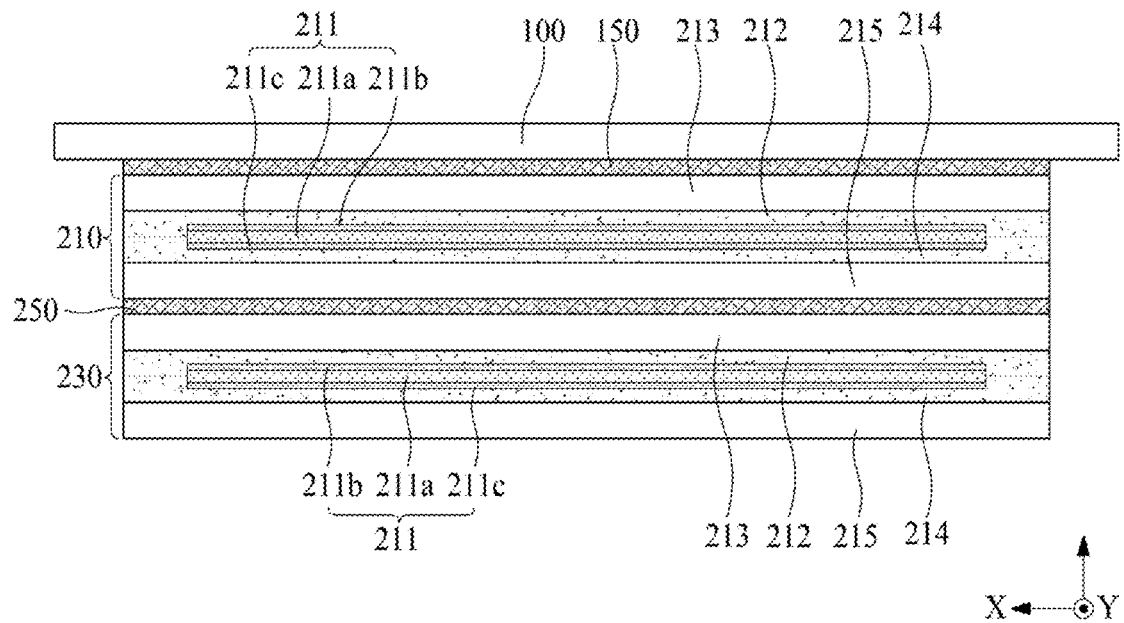
FIG. 46 illustrates an example where a vibration apparatus is coupled to a display panel in an apparatus of FIG. 45.

A vibration apparatus including one vibration generator may have a problem where it is unable to output a sufficient sound. For example, when a vibration apparatus including one vibration generator is provided in a display apparatus such as a television (TV), there may be a problem where it is difficult to secure a sufficient sound. Therefore, when a vibration apparatus implemented with two vibration generators disposed in parallel is applied to a display apparatus, an attachment area between the display panel 100 and the vibration apparatus may be widened, but as the attachment area is widened, there may be a problem where it is difficult to attach the vibration apparatus on the rear surface of the display panel 100 without an air bubble. For example, when the display panel 100 is a light emitting display panel, there may be a problem where it is difficult to attach the display panel 100 on an encapsulation substrate without an air bubble. In addition, a vibration apparatus implemented with two vibration generators disposed in parallel may have a problem of a divisional vibration where different vibrations occur because vibrations of adjacent vibration generators differ. As a result, there may be a problem where it is difficult to output a sound where sound flatness is enhanced. There may be a problem where the divisional vibration increases as an attachment area of a vibration apparatus increases. The vibration apparatus 200 according to an example embodiment of the present disclosure may include a plurality of vibration generators 210 and 230 overlapping each other, as shown in FIGS. 45 and 46. The vibration apparatus 200 may include one or more vibration generators which are stacked or overlap to be displaced (or vibrated or driven) in the same direction. Here, the vibration generator may be substantially the same as the vibration generator 20 described above with referenced to FIGS. 1 and 13, and thus, its repeated description may be omitted for brevity.

One or more vibration apparatuses 200 according to an example embodiment of the present disclosure may include one or more of the vibration apparatuses 1 to 5 described above with reference to FIGS. 1 to 38. Therefore, detailed descriptions of the one or more vibration apparatuses 200 may be omitted for brevity.

The apparatus according to an example embodiment of the present disclosure may further include a connection member 150 disposed between the display panel 100 and the vibration apparatus 200 (or the vibration generator 210). The connection member 150 according to an example embodiment of the present disclosure may include a material including an adhesive layer which is good in adhesive force or attaching force with respect to each of the rear surface of the display panel 100 and the vibration apparatus 200. For example, the connection member 150 may include a foam pad, a double-sided tape, or an adhesive, but embodiments of the present disclosure are not limited thereto. For example, the adhesive layer of the connection member 150 may include epoxy, acrylic, silicone, or urethane, but embodiments of the present disclosure are not limited thereto.

The apparatus according to an example embodiment of the present disclosure may further include a supporting member 300 disposed at the rear surface of the display panel 100.

The supporting member 300 may cover the rear surface of the display panel 100. For example, the supporting member 300 may cover the entire rear surface of the display panel 100 with a gap space GS therebetween. For example, the supporting member 300 may include one or more materials of a glass material, a metal material, and a plastic material. For example, the supporting member 300 may be a rear structure or a set structure. For example, the supporting member 300 may be referred to as a term such as a cover bottom, a plate bottom, a back cover, a base frame, a metal frame, a metal chassis, a chassis Base, an m-chassis, or the like. Accordingly, the supporting member 300 may be implemented with any type of frame or plate structure disposed at the rear surface of the display panel 100.

The supporting member 300 according to an example embodiment of the present disclosure may include a first supporting member 310 and a second supporting member 330.

The first supporting member 310 may cover the rear surface of the display panel 100. For example, the first supporting member 310 may be a plate member which covers the entire rear surface of the display panel 100. For example, the first supporting member 310 may be an inner plate which includes one or more materials of a glass material, a metal material, and a plastic material.

The first supporting member 310 may be spaced apart from a rearmost surface of the display panel 100 with the gap space GS therebetween, or may be spaced apart from the vibration apparatus 200. For example, the gap space GS may be referred to as an air gap, a vibration space, a sound reverberation box, or a sound box, but the terms are not limited thereto.

The second supporting member 330 may cover a rear surface of the first supporting member 310. For example, the second supporting member 330 may be a plate member which covers the entire rear surface of the first supporting member 310. For example, the second supporting member 330 may include one or more materials of a glass material, a metal material, and a plastic material. For example, the second supporting member 330 may be an outer plate, a rear plate, a back plate, a back cover, or a rear cover, but the terms are not limited thereto.

The supporting member 300 according to an example embodiment of the present disclosure may further include a coupling member 350 (or a third connection member).

The coupling member 350 may be disposed between the first supporting member 310 and the second supporting member 330. For example, the first supporting member 310 and the second supporting member 330 may be coupled or connected to each other by the coupling member 350. For example, the coupling member 350 may be an adhesive resin, a double-sided tape, or a double-sided adhesive foam pad, but the terms are not limited thereto. For example, the coupling member 350 may have elasticity for absorbing an impact, but embodiments of the present disclosure are not limited thereto. For example, the coupling member 350 may be disposed in the entire region between the first supporting member 310 and the second supporting member 330. As another example, the coupling member 350 may be formed in a mesh structure having an air gap between the first supporting member 310 and the second supporting member 330.

The apparatus according to an example embodiment of the present disclosure may further include a middle frame 400.

The middle frame 400 may be disposed between a rear edge (or a rear periphery) of the display panel 100 and a front edge portion (or a front periphery portion) of the supporting member 300. The middle frame 400 may support each of one or more of the rear edge (or the rear periphery) of the display panel 100 and an edge portion (or a periphery portion) of the supporting member 300 and may surround one or more of lateral surfaces of each of the display panel 100 and the supporting member 300. The middle frame 400 may provide a gap space GS between the display panel 100 and the supporting member 300. The middle frame 400 may be referred to as a middle cabinet, a middle cover, or a middle chassis, but the terms are not limited thereto.

The middle frame 400 according to an example embodiment of the present disclosure may include a first supporting portion 410 and a second supporting portion 430.

The first supporting portion 410 may be disposed between the rear edge (or a rear periphery) of the display panel 100 and the front edge (or the front periphery) of the supporting member 300, and thus, may provide a gap space GS between the display panel 100 and the supporting member 300. A front surface of the first supporting portion 410 may be coupled or connected to a rear edge portion (or a rear periphery portion) of the display panel 100 by a first frame connection member 401. A rear surface of the first supporting portion 410 may be coupled or connected to a front edge portion (or a front periphery portion) of the supporting member 300 by a second frame connection member 403. For example, the first supporting portion 410 may have a single picture frame (or a single frame) structure having a quadrilateral shape, or may include a picture frame (or a frame) structure having a plurality of division bar shapes.

The second supporting portion 430 may be vertically coupled to an outer surface of the first supporting portion 410 in parallel with a thickness direction Z of the apparatus. The second supporting portion 430 may surround one or more of an outer surface of the display panel 100 and an outer surface of the supporting member 300, and thus, may protect the outer surface of each of the display panel 100 and the supporting member 300. The first supporting portion 410 may protrude from an inner surface of the second supporting portion 430 to the gap space GS between the display panel 100 and the supporting member 300.

The apparatus according to an example embodiment of the present disclosure may further include a panel connection member instead of the middle frame 400.

The panel connection member may be disposed between the rear edge portion (or the rear periphery portion) of the display panel 100 and the front edge portion (or the front periphery portion) of the supporting member 300, and thus, may provide the gap space GS between the display panel 100 and the supporting member 300. The panel connection member may be disposed between the rear edge portion (or the rear periphery portion) of the display panel 100 and the edge portion (or the periphery portion) of the supporting member 300 and may attach the display panel 100 on the supporting member 300. For example, the panel connection member may be implemented with a double-sided tape, a single-sided tape, or a double-sided adhesive foam pad, but embodiments of the present disclosure are not limited thereto. For example, the adhesive layer of the panel connection member may include epoxy, acrylic, silicone, or urethane, but embodiments of the present disclosure are not limited thereto. For example, the adhesive layer of the panel connection member may include a urethane-based material which relatively has a ductile characteristic compared to acrylic-based material. Accordingly, a vibration of the display panel 100 transferred to the supporting member 300 may be minimized.

In the apparatus according to an example embodiment of the present disclosure, when the apparatus includes the panel connection member instead of the middle frame 400, the supporting member 300 may include a bending sidewall which is bent from an end (or an end portion or a portion) of the second supporting member 330 and surrounds one or more of outer surfaces (or outer sidewalls) of each of the first supporting member 310, the panel connection member, and the display panel 100. The bending sidewall according to an example embodiment of the present disclosure may have a single sidewall structure or a hemming structure. The hemming structure may have a structure where end portions (or portions) of an arbitrary member are bent in a curved shape and overlap or are spaced apart from one another in parallel. For example, to enhance a sense of lateral beauty in design, the bending sidewall may include a first bending sidewall bent from one side of the second supporting member 330 and a second bending sidewall bent from the first bending sidewall to an outer surface between the first bending sidewall and the display panel 100. The second bending sidewall may be spaced apart from an inner surface of the first bending sidewall. Accordingly, the second bending sidewall may decrease a contact between an outer surface of the display panel 100 and an inner surface of the first bending sidewall, or may reduce a lateral-direction external impact of the display panel 100 to the outer surface of the display panel 100.

Figure 41:
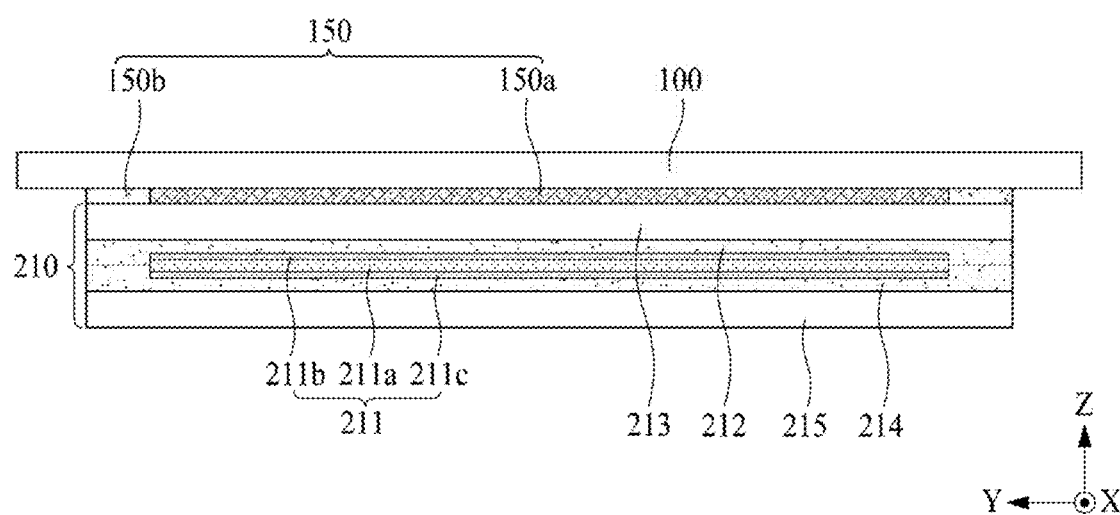
FIGS. 41 and 42 illustrate examples where a vibration apparatus is coupled to a display panel in an apparatus of FIG. 40.
Figure 42:
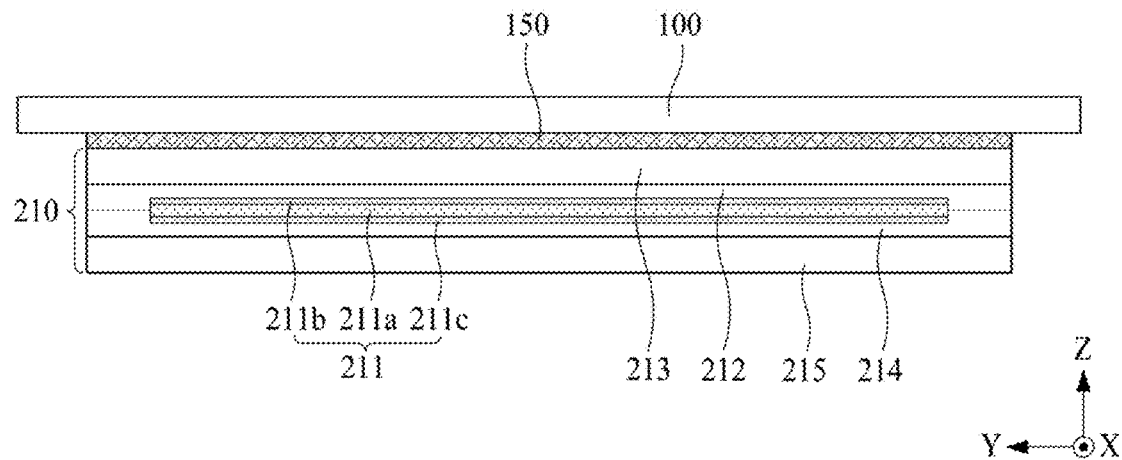

FIGS. 41 and 42 illustrate examples where a vibration apparatus is coupled or connected to a display panel in the apparatus of FIG. 40.

Referring to FIG. 41, in an apparatus according to an example embodiment of the present disclosure, the vibration generator 20 of the vibration apparatus 1 described above with reference to FIGS. 1 to 3C may be connected or coupled to a display panel 100. For example, the apparatus may include the display panel 100, a vibration generator 210 which is in the display panel 100 and includes a vibrations structure material 211, and a connection member 150 between the display panel 100 and the vibration generator 210. The connection member 150 may include a first connection member 150a which is disposed to overlap the vibration structure 211 and is between the display panel 100 and the vibration structure 211 and a second connection member 150b which is disposed to surround the first connection member 150a. The first connection member 150a may have a modulus which is greater than that of the second connection member 150b.

The vibration structure 211 according to an example embodiment of the present disclosure may include a vibration portion 211a including a piezoelectric material, a first electrode portion 211b disposed at a first surface of the vibration portion 211a, and a second electrode portion 211c disposed at a second surface, which is opposite to or different from the first surface, of the vibration portion 211a. The first adhesive layer 212 may be disposed between the vibration structure 211 and the first protection member 213, and the first adhesive layer 212 may be disposed between the first protection member 213 and the first electrode portion 211b of the vibration structure 211. A second protection member 215 may be disposed on the second electrode portion 211c and may protect the second electrode portion 211c, and the second adhesive layer 214 may be disposed between the vibration structure 211 and the second protection member 215.

Referring to FIG. 42, in an apparatus according to an example embodiment of the present disclosure, the vibration generator 20 of the vibration apparatuses 2 and 3 described above with reference to FIGS. 4 to 12B may be connected or coupled to a display panel 100. For example, the apparatus may include the display panel 100, a vibration generator 210 disposed in the display panel 100, and a connection member 150 between the display panel 100 and the vibration generator 210. The connection member 150 may include a metal material. In addition, the vibration generator 210 according to another example embodiment of the present disclosure may include a first electrode portion 211b at a first surface of the vibration structure 211 and a second electrode portion 211c at a second surface, which is opposite to the first surface, of the vibration structure 211. Each of the first electrode portion 211b and the second electrode portion 211c may include silver (Ag) and a glass frit.

Figure 43:
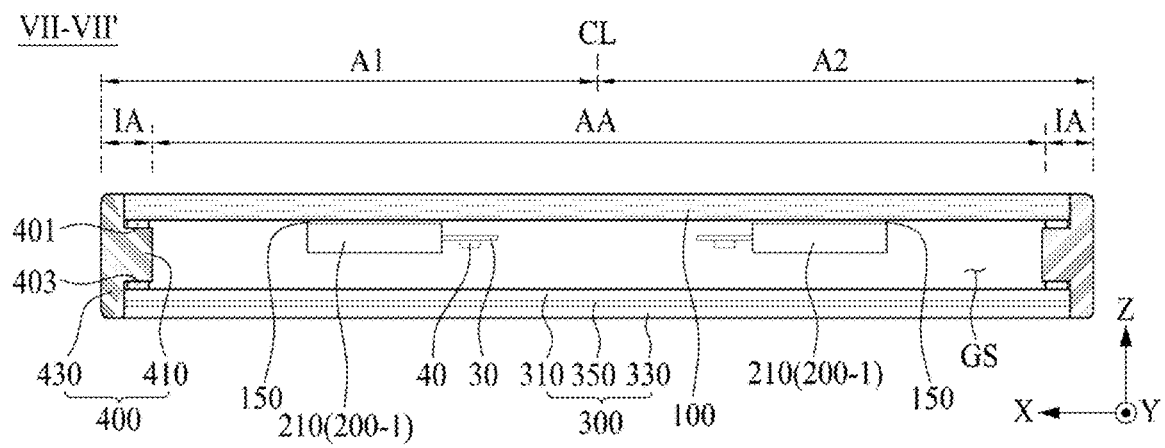
FIG. 43 is an example of another cross-sectional view taken along line VII-VII' illustrated in FIG. 39.
Figure 44:
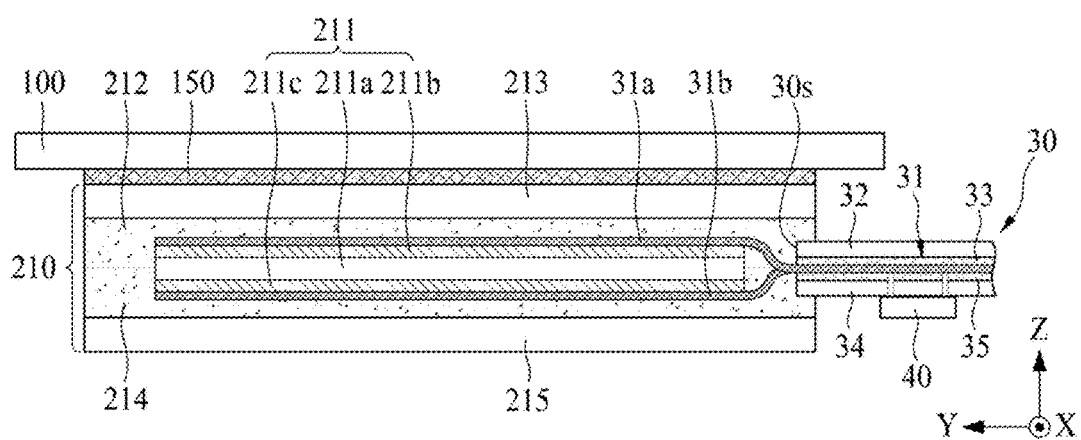
FIG. 44 illustrates an example where a vibration apparatus is coupled to a display panel in an apparatus of FIG. 43.

FIG. 43 is an example of another cross-sectional view taken along line VII-VII' illustrated in FIG. 39, and FIG. 44 illustrates an example where a vibration apparatus is coupled to a display panel in an apparatus of FIG. 43.

Referring to FIGS. 43 and 44, in an apparatus according to an example embodiment of the present disclosure, the vibration generator 20 of the vibration apparatus 4 described above with reference to FIGS. 13 to 26 may be connected or coupled to a display panel 100. For example, the apparatus may include the display panel 100, a plurality of vibration generators 210 (200-1) which vibrate the display panel 100, and a connection member 150 between the display panel 100 and the vibration generators 210. Each vibration generator 210 may include a vibration structure 211, a first electrode portion 211b at a first surface of the vibration structure 211, and a second electrode portion 211c at a second surface, which is opposite to the first surface, of the vibration structure 211. The apparatus may further include a first cover member 213 on the first electrode portion 211b, a second cover member 212 on the second electrode portion 211c, a signal cable 30 electrically connected to the vibration structure 211, and a signal generating circuit 40 mounted on the signal cable 30.

FIG. 45 is an example of another cross-sectional view taken along line VII-VII' illustrated in FIG. 39, and FIG. 46 illustrates an example where a vibration apparatus is coupled to a display panel in an apparatus of FIG. 45.

Referring to FIGS. 45 and 46, in an apparatus according to an example embodiment of the present disclosure, the vibration generators 20a and 20b of the vibration apparatus 5 described above with reference to FIGS. 27 to 38 may be connected or coupled to a display panel 100. For example, the apparatus may include the display panel 100 and vibration generators 210 and 230 which vibrate the display panel 100. The vibration generators 210 and 230 may include a first vibration structure having a first piezoelectric coefficient, a second vibration structure having a second piezoelectric coefficient which differs from the first piezoelectric coefficient, and a coupling portion 250 between the first vibration structure and the second vibration structure. The first vibration structure and the second vibration structure may be disposed to be opposite to each other with the coupling portion 250 therebetween, and for example, may have a stacked or layered structure. Accordingly, the first vibration structure may be disposed in the first vibration generator 210, and the second vibration structure may be disposed in the second vibration generator 230. For example, the adhesive layer of the connection member 150 may differ from the adhesive layer of the coupling portion 250. For example, the adhesive layer of the connection member 150 may include an acrylic-based material, having a characteristic where an adhesive force is relatively greater and hardness is higher than a urethane-based material. Accordingly, a vibration of the vibration apparatus 200 may be well transferred to the display panel 100.

Figure 47:
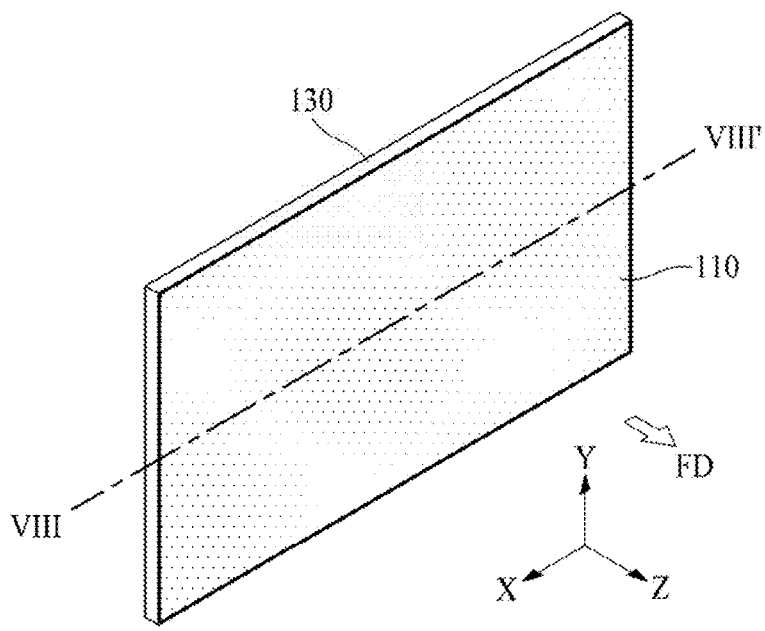
FIG. 47 illustrates an apparatus according to another example embodiment of the present disclosure.
Figure 48:
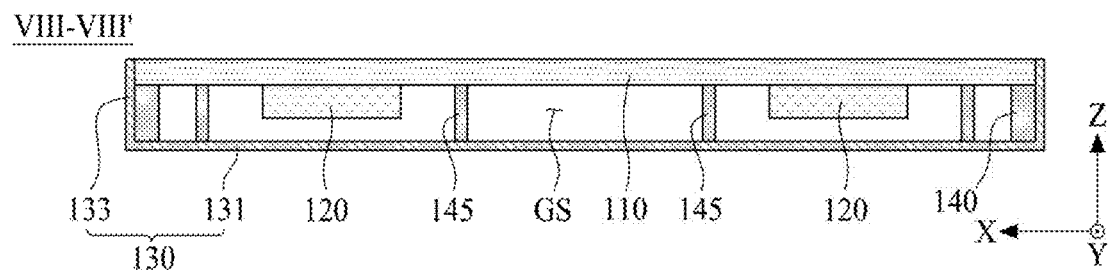
FIG. 48 is an example of a cross-sectional view taken along line VIII-VIII' illustrated in FIG. 47.

FIG. 47 illustrates an apparatus according to another example embodiment of the present disclosure, and FIG. 48 is an example of a cross-sectional view taken along line VIII-VIII' illustrated in FIG. 47.

Referring to FIGS. 47 and 48, the apparatus according to another example embodiment of the present disclosure may be referred to as a display apparatus or a display apparatus for vehicular apparatuses, but embodiments of the present disclosure are not limited thereto. For example, an apparatus according to an example embodiment of the present disclosure may be applied to implement a sound apparatus, a sound output apparatus, a sound bar, a sound system, a sound apparatus for vehicular apparatuses, a sound output apparatus for vehicular apparatuses, or a sound bar for vehicular apparatuses, or the like. For example, the vehicular apparatuses may include one or more seats and one or more glass windows. For example, the vehicular apparatuses may include a vehicle, a train, a ship, or an aircraft, but embodiments of the present disclosure are not limited thereto. In addition, the apparatus according to an example embodiment of the present disclosure may implement an analog signage or a digital signage, or the like such as an advertising signboard, a poster, or a noticeboard, or the like.

The apparatus according to another example embodiment of the present disclosure may include a vibration member 110 and one or more vibration generating apparatuses 120.

The vibration member 110 may be referred to as a term such as a vibration object, a sound output member, a vibration panel, or a sound output panel, but embodiments of the present disclosure are not limited thereto.

The vibration member 110 according to an example embodiment of the present disclosure may include a display panel configured to display an electronic image or a digital image or a still image. For example, the vibration member 110 may be a display panel which outputs light through a plurality of self-emitting pixels to display an image. Hereinafter, in the following descriptions of FIGS. 47 and 48, an example where the vibration member 110 is a display panel 110 will be described.

The display panel 110 according to an example embodiment of the present disclosure may be a curved display panel or any type of display panel such as an organic light emitting display panel, a quantum dot light emitting display panel, a micro light emitting diode display panel, an electrophoresis display panel, or an electro-wetting display panel, but embodiments of the present disclosure are not limited thereto. According to another example embodiment of the present disclosure, the display panel 110 may be a transparent display panel or a flexible display panel. According to another example embodiment of the present disclosure, the display panel 110 may be a display panel with an integrated touch panel. For example, the display panel with an integrated touch panel may include a touch panel attached on a display panel, or may include a touch electrode layer disposed in a display panel.

One or more vibration generating apparatuses 120 may be configured to vibrate the display panel 110. The one or more vibration generating apparatuses 120 may be connected or coupled to a rear surface of the display panel 110. For example, the one or more vibration generating apparatuses 120 may include one or more vibration generators 20 of the vibration apparatuses 1 to 5 described above with reference to FIGS. 1 to 38. Therefore, detailed descriptions of the one or more vibration generating apparatuses 120 may be omitted for brevity.

The one or more vibration generating apparatuses 120 according to an example embodiment of the present disclosure may include one or more vibration generators 20 of the vibration apparatuses 1 to 5 illustrated in one or more of FIGS. 1 to 38, and one or more vibration generators 20 of the vibration apparatuses 1 to 5 may be connected or coupled to the rear surface of the display panel 110 by a connection member 15 after the connection member 15 is stripped.

The one or more vibration generating apparatuses (or a plurality of vibration generating apparatuses) 120 according to an example embodiment of the present disclosure may vibrate or directly vibrate the display panel 110 in response to a vibration driving signal supplied from a sound processing circuit. For example, the one or more vibration generating apparatuses 120 may vibrate based on a vibration driving signal synchronized with an image displayed by the display panel 110 to vibrate or directly vibrate the display panel 110. As another example, the one or more vibration generating apparatuses 120 may vibrate based on a vibration driving signal (or a haptic feedback signal) synchronized with a user touch applied to a touch panel (or a touch sensor layer) which is disposed at or embedded into the display panel 110, thereby vibrating or directly vibrating the display panel 110. Accordingly, the display panel 110 may vibrate based on a vibration of the one or more vibration generating apparatuses 120 and provide one or more of a sound and a haptic feedback to a user (or a viewer).

The apparatus according to another example embodiment of the present disclosure may further include a rear structure 130 and a panel connection member 140. The apparatus may include one or more panel connection members 140.

The rear structure 130 may be disposed at the rear surface of the display panel 110. For example, the rear structure 130 may cover the rear surface of the display panel 110. For example, the rear structure 130 may cover the entire rear surface of the display panel 110 with a gap space GS therebetween. For example, the rear structure 130 may be implemented with a plate structure material or any type of frame disposed at the rear surface of the display panel 110.

The rear structure 130 according to an example embodiment of the present disclosure may further cover a lateral surface of the display panel 110. For example, the rear structure 130 may include a rear cover (or a rear portion) 131 which covers the rear surface of the display panel 110 with a gap space GS therebetween and a lateral cover (or a lateral portion or a side cover) 133 which is connected to an end (or a portion) of the rear cover 131 and covers the lateral surface of the display panel 110. In the rear structure 130, the rear cover 131 and the lateral cover 133 may be provided as one body (or an integrated structure), but embodiments of the present disclosure are not limited thereto.

The panel connection member 140 may be disposed between the display panel 110 and the rear structure 130. The panel connection member 140 may be connected or coupled between the display panel 110 and the rear structure 130 to surround the one or more vibration generating apparatuses 120, and thus, may provide a gap space GS between the display panel 110 and the rear structure 130.

According to an example embodiment of the present disclosure, when the panel connection member 140 is disposed between the display panel 110 and the rear structure 130, the lateral cover 133 of the rear structure 130 may be omitted.

The apparatus according to another example embodiment of the present disclosure may further include a partition 145. The apparatus may include one or more partitions 145.

The partition 145 may be connected or coupled between the display panel 110 and the rear structure 130 to surround the one or more vibration generating apparatuses 120. For example, the partition 145 may be connected or coupled to one or more of the display panel 110 and the rear structure 130 to surround the one or more vibration generating apparatuses 120. For example, the partition 145 may be configured in a circular shape, an oval shape, or a polygonal shape, but embodiments of the present disclosure are not limited thereto.

The partition 145 according to an example embodiment of the present disclosure may limit or define a vibration area (or a vibration space) based on the one or more vibration generating apparatuses 120. For example, the partition 145 may provide an air gap or a space where a sound is generated when each of the plurality of vibration generating apparatuses 120 is vibrating. For example, the partition 145 may separate a sound or may separate a channel, and moreover, may prevent or reduce a reduction in characteristic of a sound caused by interference of the sound. For example, the partition 145 may be referred to as a sound blocking member, a sound separation member, a space separation member, or a baffle, but the terms are not limited thereto.

According to another example embodiment of the present disclosure, the apparatus according to another example embodiment of the present disclosure may further include one or more pads. The one or more pads may be configured to protrude from one or more sides of the partition 145 to the vibration generating apparatus 120. The one or more pads may be configured to trap a reflected wave reflected from the partition 145, and thus, may prevent or minimize a reduction in sound pressure level characteristic caused by a standing wave which occurs due to interference of a reflected wave and a progressive wave.

A vibration apparatus and apparatus comprising the same according to an example embodiment of the present disclosure may be applied to all electronic devices. The vibration apparatus and apparatus comprising the same according to an example embodiment of the present disclosure may be applied to mobile apparatuses, video phones, smart watches, watch phones, wearable apparatuses, foldable apparatuses, rollable apparatuses, bendable apparatuses, flexible apparatuses, curved apparatuses, sliding apparatuses, variable apparatuses, electronic organizers, electronic books, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, and home appliances, or the like. In addition, the vibration apparatus according to some example embodiments of the present disclosure may be applied to organic light-emitting lighting apparatuses or inorganic light-emitting lighting apparatuses. When the vibration apparatus of an example embodiment of the present disclosure is applied to lighting apparatuses, the vibration apparatus may act as a lighting device and a speaker. In addition, when the vibration apparatus according to some example embodiments of the present disclosure is applied to a mobile device, or the like, the vibration apparatus may be one or more of a speaker, a receiver, and a haptic device, but embodiments of the present disclosure are not limited thereto.

A vibration apparatus according to an example embodiment of the present disclosure may comprise a vibration plate, a vibration generator on the vibration plate, the vibration generator including a vibration structure, and a connection member between the vibration plate and the vibration generator, the connection member comprises a first connection member between the vibration plate and the vibration structure and overlapping the vibration structure and a second connection member surrounding the first connection member, and a modulus of the first connection member is greater than a modulus of the second connection member.

According to some example embodiments of the present disclosure, the connection member may comprise a metal material.

According to some example embodiments of the present disclosure, the vibration generator may comprise a first electrode portion at a first surface of the vibration structure, and a second electrode portion at a second surface opposite to the first surface of the vibration structure, and each of the first electrode portion and the second electrode portion may comprise a silver and a glass frit.

According to some example embodiments of the present disclosure, vibration apparatus may further comprise a signal cable electrically connected to the vibration structure, and a signal generating circuit mounted on the signal cable.

According to some example embodiments of the present disclosure, the vibration structure may further comprise a first cover member covering the first electrode portion, and a second cover member covering the second electrode portion, and the signal cable may comprise a first conductive line between the first cover member and the first electrode portion and electrically connected to the first electrode portion, and a second conductive line between the second cover member and the second electrode portion and electrically connected to the second electrode portion.

According to some example embodiments of the present disclosure, the first cover member and the cover member may be connected or coupled to one surface of the vibration plate by the connection member.

According to some example embodiments of the present disclosure, the vibration structure may further comprise a first vibration structure having a first piezoelectric coefficient, a second vibration structure having a second piezoelectric coefficient different from the first piezoelectric coefficient, and a coupling portion between the first vibration structure and the second vibration structure.

According to some example embodiments of the present disclosure, the vibration structure may further comprise a first vibration structure having a first piezoelectric coefficient, a second vibration structure having a second piezoelectric coefficient different from the first piezoelectric coefficient, and a coupling portion between the first vibration structure and the second vibration structure.

According to some example embodiments of the present disclosure, the vibration structure may further comprise a vibration portion between the first electrode portion and the second first electrode portion.

According to some example embodiments of the present disclosure, the vibration apparatus may further comprise a signal cable electrically connected to the vibration structure, and a signal generating circuit mounted on the signal cable.

According to some example embodiments of the present disclosure, the vibration structure may further comprise a first electrode portion at a first surface of the vibration structure, a second electrode portion at a second surface opposite to the first surface of the vibration structure, a first cover member covering the first electrode portion, and a second cover member covering the second electrode portion, and the signal cable may comprise a first conductive line between the first cover member and the first electrode portion and electrically connected to the first electrode portion, and a second conductive line between the second cover member and the second electrode portion and electrically connected to the second electrode portion.

According to some example embodiments of the present disclosure, the vibration structure may further comprise a first vibration structure having a first piezoelectric coefficient, a second vibration structure having a second piezoelectric coefficient different from the first piezoelectric coefficient, and a coupling portion between the first vibration structure and the second vibration structure.

According to some example embodiments of the present disclosure, the vibration structure may further comprise a first vibration structure having a first piezoelectric coefficient, a second vibration structure having a second piezoelectric coefficient different from the first piezoelectric coefficient, and a coupling portion between the first vibration structure and the second vibration structure.

According to some example embodiments of the present disclosure, the vibration generator may further comprise a first adhesive layer between the vibration structure and the a first cover member and a second adhesive layer between the vibration structure and the second cover member.

A vibration apparatus according to another example embodiment of the present disclosure may comprise a vibration plate, a vibration generator at the vibration plate, and a connection member between the vibration plate and the vibration generator, the connection member may comprise a metal material.

According to some example embodiments of the present disclosure, the vibration generator may comprise a vibration structure, a first electrode portion at a first surface of the vibration structure, and a second electrode portion at a second surface opposite to the first surface of the vibration structure, and each of the first electrode portion and the second electrode portion may comprise a silver and a glass frit.

According to some example embodiments of the present disclosure, the vibration apparatus may further comprise a signal cable electrically connected to the vibration structure, and a signal generating circuit mounted on the signal cable.

According to some example embodiments of the present disclosure, the vibration structure may further comprise a first cover member covering the first electrode portion, and a second cover member covering the second electrode portion, and the signal cable may comprise a first conductive line between the first cover member and the first electrode portion and electrically connected to the first electrode portion, and a second conductive line between the second cover member and the second electrode portion and electrically connected to the second electrode portion.

According to some example embodiments of the present disclosure, the vibration structure may further comprise a first vibration structure having a first piezoelectric coefficient, a second vibration structure having a second piezoelectric coefficient different from the first piezoelectric coefficient, and a coupling portion between the first vibration structure and the second vibration structure.

According to some example embodiments of the present disclosure, the vibration structure may further comprise a first vibration structure having a first piezoelectric coefficient, a second vibration structure having a second piezoelectric coefficient different from the first piezoelectric coefficient, and a coupling portion between the first vibration structure and the second vibration structure.

According to some example embodiments of the present disclosure, the vibration apparatus may further comprise a signal cable electrically connected to the vibration generator, and a signal generating circuit mounted on the signal cable.

According to some example embodiments of the present disclosure, the vibration generator may comprise a vibration structure, the vibration structure may further comprise a first electrode portion at a first surface of the vibration structure, a second electrode portion at a second surface opposite to the first surface of the vibration structure, a first cover member covering the first electrode portion, and a second cover member covering the second electrode portion, and the signal cable comprises a first conductive line between the first cover member and the first electrode portion and electrically connected to the first electrode portion, and a second conductive line between the second cover member and the second electrode portion and electrically connected to the second electrode portion.

According to some example embodiments of the present disclosure, the vibration structure may further comprise a first vibration structure having a first piezoelectric coefficient, a second vibration structure having a second piezoelectric coefficient different from the first piezoelectric coefficient, and a coupling portion between the first vibration structure and the second vibration structure.

An vibration apparatus according to an another example embodiment of the present disclosure may comprise a vibration plate, a vibration generator configured to vibrate the vibration plate, and a connection member between the vibration plate and the vibration generator, the vibration generator may comprise a vibration structure, a first electrode portion at a first surface of the vibration structure, and a second electrode portion at a second surface opposite to the first surface of the vibration structure, and each of the first electrode portion and the second electrode portion may comprise a silver and a glass frit.

According to some example embodiments of the present disclosure, the vibration apparatus may further comprise a signal cable electrically connected to the vibration structure, and a signal generating circuit mounted on the signal cable.

According to some example embodiments of the present disclosure, the vibration structure may further comprise a first cover member covering the first electrode portion, and a second cover member covering the second electrode portion, and the signal cable may comprise a first conductive line between the first cover member and the first electrode portion and electrically connected to the first electrode portion, and a second conductive line between the second cover member and the second electrode portion and electrically connected to the second electrode portion.

According to some example embodiments of the present disclosure, the vibration structure may further comprise a first vibration structure having a first piezoelectric coefficient, a second vibration structure having a second piezoelectric coefficient different from the first piezoelectric coefficient, and a coupling portion between the first vibration structure and the second vibration structure.

According to some example embodiments of the present disclosure, the vibration structure may further comprise a first vibration structure having a first piezoelectric coefficient, a second vibration structure having a second piezoelectric coefficient different from the first piezoelectric coefficient, and a coupling portion between the first vibration structure and the second vibration structure.

According to some example embodiments of the present disclosure, in each of the first electrode portion and the second electrode portion, an area occupied by the silver may be about 70% to about 90%.

According to some example embodiments of the present disclosure, a thickness of each of the first electrode portion and the second electrode portion may be about 1 µm to about 3 µm.

According to some example embodiments of the present disclosure, in each of the first electrode portion and the second electrode portion, the silver may comprise 80 to 90 parts by weight, and the glass frit may comprise 10 to 20 parts by weight.

A vibration apparatus according to an another example embodiment of the present disclosure may comprise a vibration plate, a vibration generator vibrating the vibration plate, and a connection member between the vibration plate and the vibration generator, the vibration generator may comprise a vibration structure, a first electrode portion at a first surface of the vibration structure, a second electrode portion at a second surface opposite to the first surface of the vibration structure, a signal cable electrically connected to the vibration structure, and a signal generating circuit mounted on the signal cable.

According to some example embodiments of the present disclosure, the vibration structure may further comprise a first cover member covering the first electrode portion, and a second cover member covering the second electrode portion, and the signal cable may comprise a first conductive line between the first cover member and the first electrode portion and electrically connected to the first electrode portion, and a second conductive line between the second cover member and the second electrode portion and electrically connected to the second electrode portion.

According to some example embodiments of the present disclosure, the vibration structure may further comprise a first vibration structure having a first piezoelectric coefficient, a second vibration structure having a second piezoelectric coefficient different from the first piezoelectric coefficient, and a coupling portion between the first vibration structure and the second vibration structure.

An apparatus according to an example embodiment of the present disclosure may comprise a vibration plate, a vibration generator at the vibration plate, and a connection member between the vibration plate and the vibration generator, the vibration generator may comprise a first vibration structure having a first piezoelectric coefficient, a second vibration structure having a second piezoelectric coefficient different from the first piezoelectric coefficient, and a coupling portion between the first vibration structure and the second vibration structure.

According to some example embodiments of the present disclosure, the first piezoelectric coefficient may be greater than the second piezoelectric coefficient.

A vibration apparatus according to another example embodiment of the present disclosure may comprise a vibration member, and one or more vibration generating apparatuses connected to the vibration member, the one or more vibration generating apparatuses may comprise the vibration apparatus of described above.

According to some example embodiments of the present disclosure, the vibration member may be configured to output a sound based on vibrations of the one or more vibration generating apparatuses, and the vibration member comprises one or more materials of a metal, a nonmetal, a plastic, a fiber, a leather, wood, a cloth, a paper, and a glass.

According to some example embodiments of the present disclosure, the vibration member may comprise one of a display panel including a plurality of pixels configured to display an image, a screen panel on which an image is to be projected from a display apparatus, a lighting panel, a signage panel, a vehicular interior part, a vehicular external part, a vehicular glass window, an indoor ceiling of a building, and a glass window of a building.

It will be apparent to those skilled in the art that various modifications and variations can be made in the present disclosure without departing from the scope of the present disclosure. Thus, it is intended that the present disclosure covers the modifications and variations of this disclosure provided they come within the scope of the appended claims and their equivalents.

What is claimed is:
1. A vibration apparatus, comprising:
   a vibration plate;
   a vibration generator on the vibration plate, the vibration generator including a vibration structure; and
   a connection member between the vibration plate and the vibration generator,
   wherein:
   the connection member comprises:
      a first connection member disposed between the vibration plate and the vibration structure, the first connection member overlapping the vibration structure; and
      a second connection member surrounding the first connection member; and
   a modulus of the first connection member is greater than a modulus of the second connection member.
2. The vibration apparatus of claim 1, wherein the connection member comprises a metal material.

3. The vibration apparatus of claim 1, wherein the vibration structure comprises:
a first electrode portion at a first surface of the vibration structure; and
a second electrode portion at a second surface opposite to the first surface of the vibration structure, and
wherein each of the first electrode portion and the second electrode portion comprises a silver and a glass frit.

4. The vibration apparatus of claim 3, further comprising:
a signal cable electrically connected to the vibration structure; and
a signal generating circuit mounted on the signal cable.

5. The vibration apparatus of claim 4, wherein the vibration generator further comprises:
a first cover member covering the first electrode portion; and
a second cover member covering the second electrode portion, and
wherein the signal cable comprises:
a first conductive line between the first cover member and the first electrode portion and electrically connected to the first electrode portion; and
a second conductive line between the second cover member and the second electrode portion and electrically connected to the second electrode portion.

6. The vibration apparatus of claim 5, wherein the first cover member and the second cover member are connected or coupled to one surface of the vibration plate by the connection member.

7. The vibration apparatus of claim 4, wherein the vibration structure further comprises:
a first vibration structure having a first piezoelectric coefficient;
a second vibration structure having a second piezoelectric coefficient different from the first piezoelectric coefficient; and
a coupling portion between the first vibration structure and the second vibration structure.

8. The vibration apparatus of claim 3, wherein the vibration structure further comprises:
a first vibration structure having a first piezoelectric coefficient;
a second vibration structure having a second piezoelectric coefficient different from the first piezoelectric coefficient; and
a coupling portion between the first vibration structure and the second vibration structure.

9. The vibration apparatus of claim 3, wherein the vibration generator further comprises a vibration portion between the first electrode portion and the second electrode portion.

10. The vibration apparatus of claim 1, further comprising:
a signal cable electrically connected to the vibration structure; and
a signal generating circuit mounted on the signal cable.

11. The vibration apparatus of claim 10, wherein the vibration structure further comprises:
a first electrode portion at a first surface of the vibration structure;
a second electrode portion at a second surface opposite to the first surface of the vibration structure;
a first cover member covering the first electrode portion; and
a second cover member covering the second electrode portion, and
wherein the signal cable comprises:
a first conductive line between the first cover member and the first electrode portion and electrically connected to the first electrode portion; and
a second conductive line between the second cover member and the second electrode portion and electrically connected to the second electrode portion.

12. The vibration apparatus of claim 11, wherein the vibration structure further comprises:
a first vibration structure having a first piezoelectric coefficient;
a second vibration structure having a second piezoelectric coefficient different from the first piezoelectric coefficient; and
a coupling portion between the first vibration structure and the second vibration structure.

13. The vibration apparatus of claim 11, wherein the vibration generator further comprises:
a first adhesive layer between the vibration structure and the first cover member; and
a second adhesive layer between the vibration structure and the second cover member.

14. The vibration apparatus of claim 1, wherein the vibration structure further comprises:
a first vibration structure having a first piezoelectric coefficient;
a second vibration structure having a second piezoelectric coefficient different from the first piezoelectric coefficient; and
a coupling portion between the first vibration structure and the second vibration structure.

15. A vibration apparatus, comprising:
a vibration plate;
a vibration generator at the vibration plate; and
a connection member between the vibration plate and the vibration generator,
wherein the connection member comprises a metal material.

16. The vibration apparatus of claim 15, wherein the vibration generator comprises:
a vibration structure;
a first electrode portion on a first surface of the vibration structure; and
a second electrode portion on a second surface opposite to the first surface of the vibration structure, and
wherein each of the first electrode portion and the second electrode portion comprises silver and a glass frit.

17. The vibration apparatus of claim 16, further comprising:
a signal cable electrically connected to the vibration structure; and
a signal generating circuit mounted on the signal cable.

18. The vibration apparatus of claim 17, wherein the vibration structure further comprises:
a first cover member covering the first electrode portion; and
a second cover member covering the second electrode portion, and
wherein the signal cable comprises:
a first conductive line between the first cover member and the first electrode portion and electrically connected to the first electrode portion; and
a second conductive line between the second cover member and the second electrode portion and electrically connected to the second electrode portion.

19. The vibration apparatus of claim 17, wherein the vibration structure further comprises:

a first vibration structure having a first piezoelectric coefficient;
a second vibration structure having a second piezoelectric coefficient different the first piezoelectric coefficient; and
a coupling portion between the first vibration structure and the second vibration structure.

20. The vibration apparatus of claim 16, wherein the vibration structure further comprises:
a first vibration structure having a first piezoelectric coefficient;
a second vibration structure having a second piezoelectric coefficient different from the first piezoelectric coefficient; and
a coupling portion between the first vibration structure and the second vibration structure.

21. The vibration apparatus of claim 15, further comprising:
a signal cable electrically connected to the vibration generator; and
a signal generating circuit mounted on the signal cable.

22. The vibration apparatus of claim 21, wherein the vibration generator comprises a vibration structure,
wherein the vibration structure further comprises:
a first electrode portion at a first surface of the vibration structure;
a second electrode portion at a second surface opposite to the first surface of the vibration structure;
a first cover member covering the first electrode portion; and
a second cover member covering the second electrode portion, and
wherein the signal cable comprises:
a first conductive line between the first cover member and the first electrode portion and electrically connected to the first electrode portion; and
a second conductive line between the second cover member and the second electrode portion and electrically connected to the second electrode portion.

23. The vibration apparatus of claim 22, wherein the vibration structure further comprises:
a first vibration structure having a first piezoelectric coefficient;
a second vibration structure having a second piezoelectric coefficient different from the first piezoelectric coefficient; and
a coupling portion between the first vibration structure and the second vibration structure.

24. An apparatus, comprising:
a vibration member; and
one or more vibration generating apparatuses connected to the vibration member,
wherein the one or more vibration generating apparatuses comprise the vibration apparatus of claim 15.

25. The apparatus of claim 24, wherein:
the vibration member is configured to output a sound based on vibrations of the one or more vibration generating apparatuses, and
the vibration member comprises one or more materials of a metal, a nonmetal, a plastic, a fiber, a leather, wood, a cloth, a paper, and a glass.

26. The apparatus of claim 24, wherein the vibration member comprises one of a display panel including a plurality of pixels configured to display an image, a screen panel on which an image is to be projected from a display apparatus, a lighting panel, a signage panel, a vehicular interior part, a vehicular external part, a vehicular glass window, an indoor ceiling of a building, and a glass window of a building.

27. A vibration apparatus, comprising:
a vibration plate;
a vibration generator configured to vibrate the vibration plate; and
a connection member between the vibration plate and the vibration generator,
wherein the vibration generator comprises:
a vibration structure;
a first electrode portion on a first surface of the vibration structure; and
a second electrode portion on a second surface opposite to the first surface of the vibration structure, and
wherein each of the first electrode portion and the second electrode portion comprises silver and a glass frit.

28. The vibration apparatus of claim 27, further comprising:
a signal cable electrically connected to the vibration structure; and
a signal generating circuit mounted on the signal cable.

29. The vibration apparatus of claim 28, wherein the vibration structure further comprises:
a first cover member covering the first electrode portion; and
a second cover member covering the second electrode portion, and
wherein the signal cable comprises:
a first conductive line between the first cover member and the first electrode portion and electrically connected to the first electrode portion; and
a second conductive line between the second cover member and the second electrode portion and electrically connected to the second electrode portion.

30. The vibration apparatus of claim 28, wherein the vibration structure further comprises:
a first vibration structure having a first piezoelectric coefficient;
a second vibration structure having a second piezoelectric coefficient different from the first piezoelectric coefficient; and
a coupling portion between the first vibration structure and the second vibration structure.

31. The vibration apparatus of claim 27, wherein the vibration structure further comprises:
a first vibration structure having a first piezoelectric coefficient;
a second vibration structure having a second piezoelectric coefficient different from the first piezoelectric coefficient; and
a coupling portion between the first vibration structure and the second vibration structure.

32. The vibration apparatus of claim 27, wherein, in each of the first electrode portion and the second electrode portion, an area occupied by the silver is 70% to 90%.

33. The vibration apparatus of claim 27, wherein a thickness of each of the first electrode portion and the second electrode portion is 1 μm to 3 μm.

34. The vibration apparatus of claim 27, wherein, in each of the first electrode portion and the second electrode portion, the silver comprises 80 to 90 parts by weight, and the glass frit comprises 10 to 20 parts by weight.

35. A vibration apparatus, comprising:
a vibration plate;
a vibration generator vibrating the vibration plate; and a connection member between the vibration plate and the vibration generator, wherein the vibration generator comprises:
- a vibration structure;
- a first electrode portion at a first surface of the vibration structure;
- a second electrode portion at a second surface opposite to the first surface of the vibration structure;
- a signal cable electrically connected to the vibration structure; and
- a signal generating circuit mounted on the signal cable.

36. The vibration apparatus of claim 35, wherein the vibration structure further comprises:
- a first cover member covering the first electrode portion; and
- a second cover member covering the second electrode portion, and wherein the signal cable comprises:
- a first conductive line between the first cover member and the first electrode portion and electrically connected to the first electrode portion; and
- a second conductive line between the second cover member and the second electrode portion and electrically connected to the second electrode portion.

37. The vibration apparatus of claim 35, wherein the vibration structure further comprises:
- a first vibration structure having a first piezoelectric coefficient;
- a second vibration structure having a second piezoelectric coefficient different from the first piezoelectric coefficient; and
- a coupling portion between the first vibration structure and the second vibration structure.

38. A vibration apparatus, comprising:
- a vibration plate;
- a vibration generator at the vibration plate; and
- a connection member between the vibration plate and the vibration generator, wherein the vibration generator comprises:
- a first vibration structure having a first piezoelectric coefficient;
- a second vibration structure having a second piezoelectric coefficient different from the first piezoelectric coefficient; and
- a coupling portion between the first vibration structure and the second vibration structure.

39. The vibration apparatus of claim 38, wherein the first piezoelectric coefficient is greater than the second piezoelectric coefficient.

* * * * *